United States Patent
Wu et al.

(10) Patent No.: US 11,024,721 B2
(45) Date of Patent: Jun. 1, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Zhi-Qiang Wu, Hsinchu County (TW); Kuo-An Liu, Hsinchu (TW); Chan-Lon Yang, Taipei (TW); Bharath Kumar Pulicherla, Hsinchu (TW); Li-Te Lin, Hsinchu (TW); Chung-Cheng Wu, Hsinchu County (TW); Gwan-Sin Chang, Hsinchu (TW); Pinyen Lin, Rochester, NY (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/559,369

(22) Filed: Sep. 3, 2019

(65) Prior Publication Data

US 2020/0098890 A1 Mar. 26, 2020

Related U.S. Application Data

(60) Provisional application No. 62/734,157, filed on Sep. 20, 2018.

(51) Int. Cl.
| | |
|---|---|
| *H01L 21/311* | (2006.01) |
| *H01L 29/66* | (2006.01) |
| *H01L 21/3213* | (2006.01) |
| *H01L 29/78* | (2006.01) |
| *H01L 29/49* | (2006.01) |
| *H01L 29/40* | (2006.01) |

(52) U.S. Cl.
CPC .. *H01L 29/66545* (2013.01); *H01L 21/31116* (2013.01); *H01L 21/32137* (2013.01); *H01L 29/401* (2013.01); *H01L 29/4991* (2013.01); *H01L 29/6656* (2013.01); *H01L 29/66795* (2013.01); *H01L 29/7851* (2013.01)

(58) Field of Classification Search
CPC ......... H01L 21/28114; H01L 21/31116; H01L 21/32139; H01L 21/823431; H01L 29/401; H01L 29/6656
USPC ........................................................ 438/284
See application file for complete search history.

(56) References Cited

U.S. PATENT DOCUMENTS

| | | |
|---|---|---|
| 8,703,001 B1 | 4/2014 | Hegde |
| 9,105,490 B2 | 8/2015 | Wang et al. |
| 9,236,267 B2 | 1/2016 | De et al. |

(Continued)

OTHER PUBLICATIONS

U.S. Appl. No. 16/007,885, filed Jun. 13, 2018.

(Continued)

*Primary Examiner* — Long K Tran
(74) *Attorney, Agent, or Firm* — Maschoff Brennan

(57) ABSTRACT

A method includes forming a dummy gate over a substrate. A pair of gate spacers are formed on opposite sidewalls of the dummy gate. The dummy gate is removed to form a trench between the gate spacers. A first ion beam is directed to an upper portion of the trench, while leaving a lower portion of the trench substantially free from incidence of the first ion beam. The substrate is moved relative to the first ion beam during directing the first ion beam to the trench. A gate structure is formed in the trench.

20 Claims, 48 Drawing Sheets

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2006/0253510 A1 | 11/2006 | Kameyama et al. | |
| 2010/0219358 A1 | 9/2010 | Kameyama et al. | |
| 2014/0110755 A1* | 4/2014 | Colinge | H01L 21/324 257/192 |
| 2015/0093907 A1* | 4/2015 | Yieh | H01L 21/02266 438/758 |
| 2015/0371867 A1* | 12/2015 | Leobandung | H01L 21/823864 257/401 |

OTHER PUBLICATIONS

EPFL, "Ion Beam Etcher Nexus IBE350 From Veeco", Center of Micronanotechnology CMI; École Polytechnique Fédérale de Lausanne EPFL, (2010).

\* cited by examiner

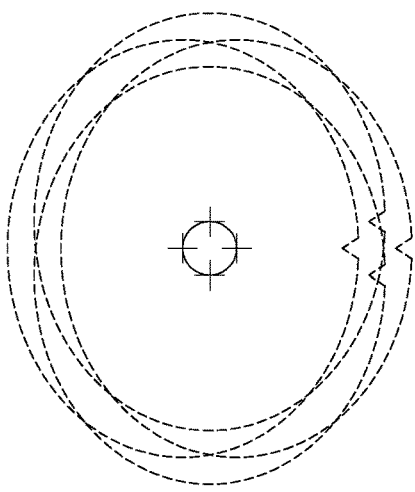
FIG. 35C OFF-AXIAL WAFER ROTATION
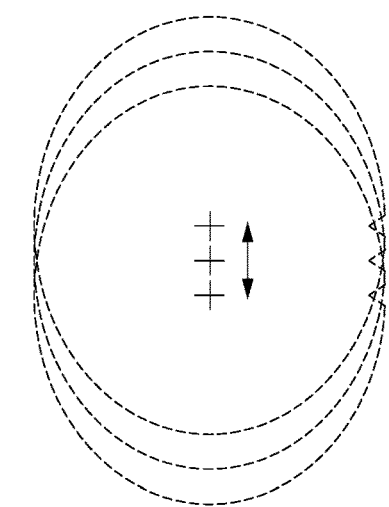
FIG. 35B X-AXIS LINEAR SCAN
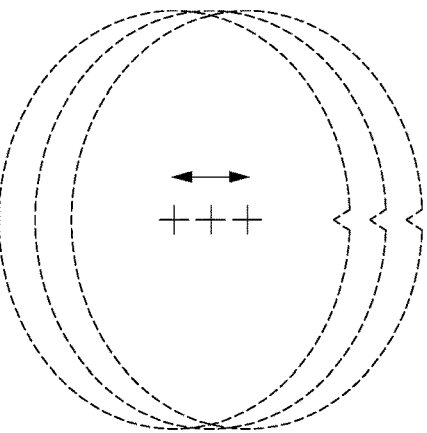
FIG. 35A Y-AXIS LINEAR SCAN

SEMICONDUCTOR DEVICE AND MANUFACTURING METHOD THEREOF

PRIORITY CLAIM AND CROSS-REFERENCE

This application claims priority to U.S. Provisional Application Ser. No. 62/734,157, filed Sep. 20, 2018, which is herein incorporated by reference.

BACKGROUND

Two conventional fabrication processes employed in manufacturing semiconductor device are deposition and etching processes. The deposition process includes, for example, ion beam deposition. These deposition and etching processes are basic process with regard to device operation and physical dimensions. Various control of the deposition and etching process result in benefits, including, for example, enhanced device characteristics, improved device performance, improved device yield, and so on. Thus, accurate and precise deposition and etching processes used to form desired device profile are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 35A to 35C are schematic diagrams illustrating the operations of fabrication apparatus in FIG. 31 during the method in FIG. 32 in accordance with some embodiments of the present disclosure.

DETAILED DESCRIPTION

Figure 1:
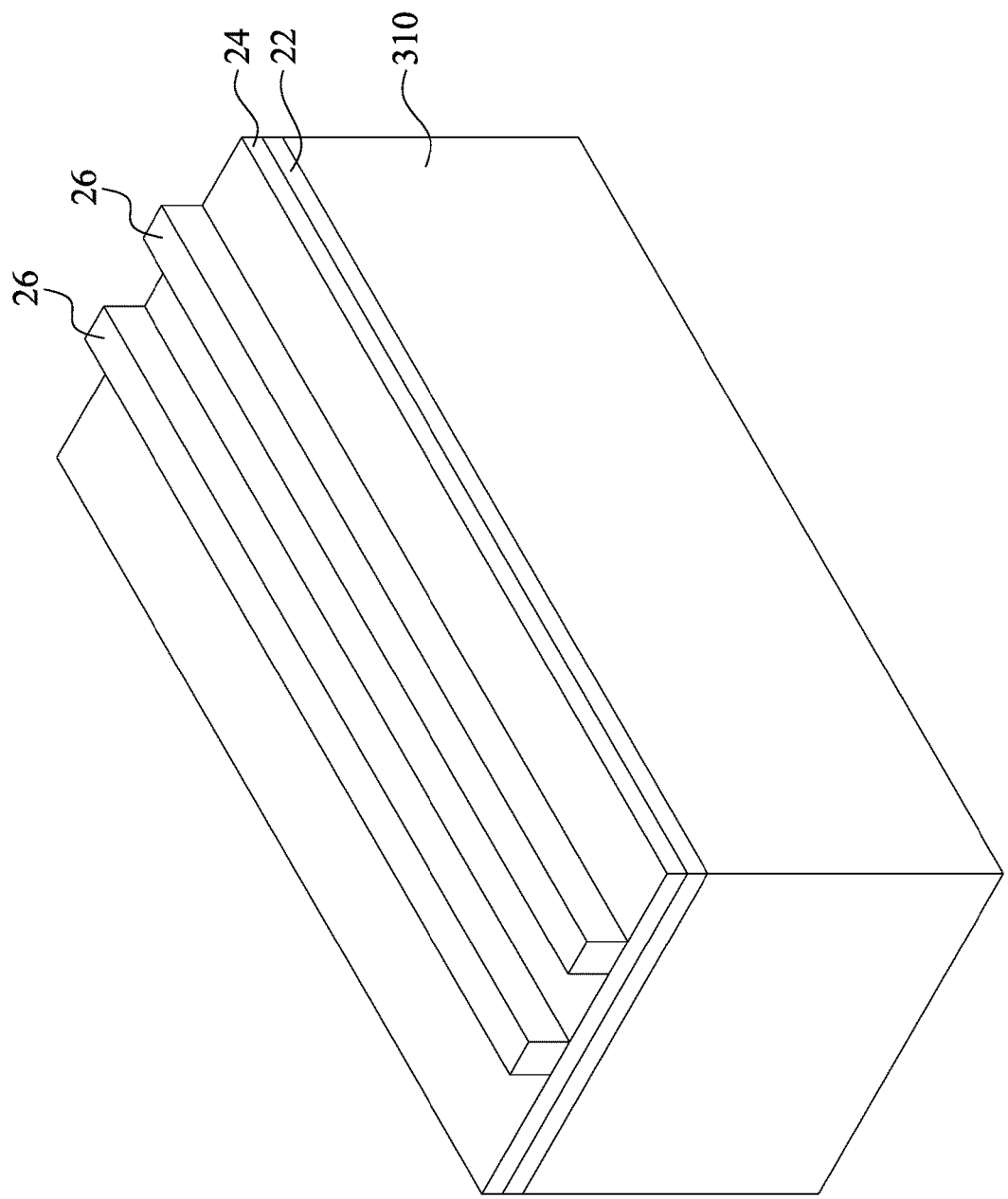
FIGS. 1 to 27 illustrate a method in various stages of fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, may be a Fin field effect transistor (FinFET) device. The following disclosure will continue with a FinFET example to illustrate various embodiments of the present application. It is understood, however, that the application should not be limited to a particular type of device.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1 to 27 illustrate a method in various stages of fabricating a semiconductor device in accordance with some embodiments of the present disclosure.

Reference is made to FIG. 1. Shown there is a wafer WF having a substrate 310. In some embodiments, the substrate 310 includes silicon. Alternatively, the substrate 310 may include germanium, silicon germanium, gallium arsenide or other appropriate semiconductor materials. Also alternatively, the substrate 310 may include an epitaxial layer. For example, the substrate 310 may have an epitaxial layer overlying a bulk semiconductor. Further, the substrate 310 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 310 may include a semiconductor-on-insulator (SOI) structure. Also alternatively, the substrate 310 may include a buried dielectric layer, such as a buried oxide (BOX) layer, such as that formed by separation by implantation of oxygen (SIMOX) technology, wafer bonding, SEG, or other appropriate method.

A pad layer 22 and a mask layer 24 may be formed on the substrate 310, and followed by forming a patterned photo resist layer 26 on the mask layer 24. The pad layer 22 may be a thin film including silicon oxide formed, for example, using a thermal oxidation process. The pad layer 22 may act as an adhesion layer between the substrate 310 and the mask layer 24. The pad layer 22 may also act as an etch stop layer for etching the mask layer 24. In some embodiments, the mask layer 24 is formed of silicon nitride, for example, using low-pressure chemical vapor deposition (LPCVD). In some other embodiments, the mask layer 24 is formed by thermal nitridation of silicon, plasma enhanced chemical vapor deposition (PECVD), or plasma anodic nitridation. The mask layer 24 is used as a hard mask during subsequent photolithography processes. In some embodiments, the patterned photo resist layer 26 may be formed by, for example, depositing a photo resist layer over the mask layer 24 by suitable process, such as spin-coating technique, which may include baking the resist layer after coating. The photo resist layer may include positive-type or negative-type resist materials. For example, the photo resist layer include poly(methylmethacrylate) (PMMA). Then, the photo resist layer is subjected to an exposure process. For example, the photo resist layer is exposed to radiation energy, such as ultraviolet (UV) radiation, through a mask (photomask or reticle) having a predefined pattern, resulting in the patterned photo resist layer 26 that includes exposed regions of the resist layer.

Figure 2:
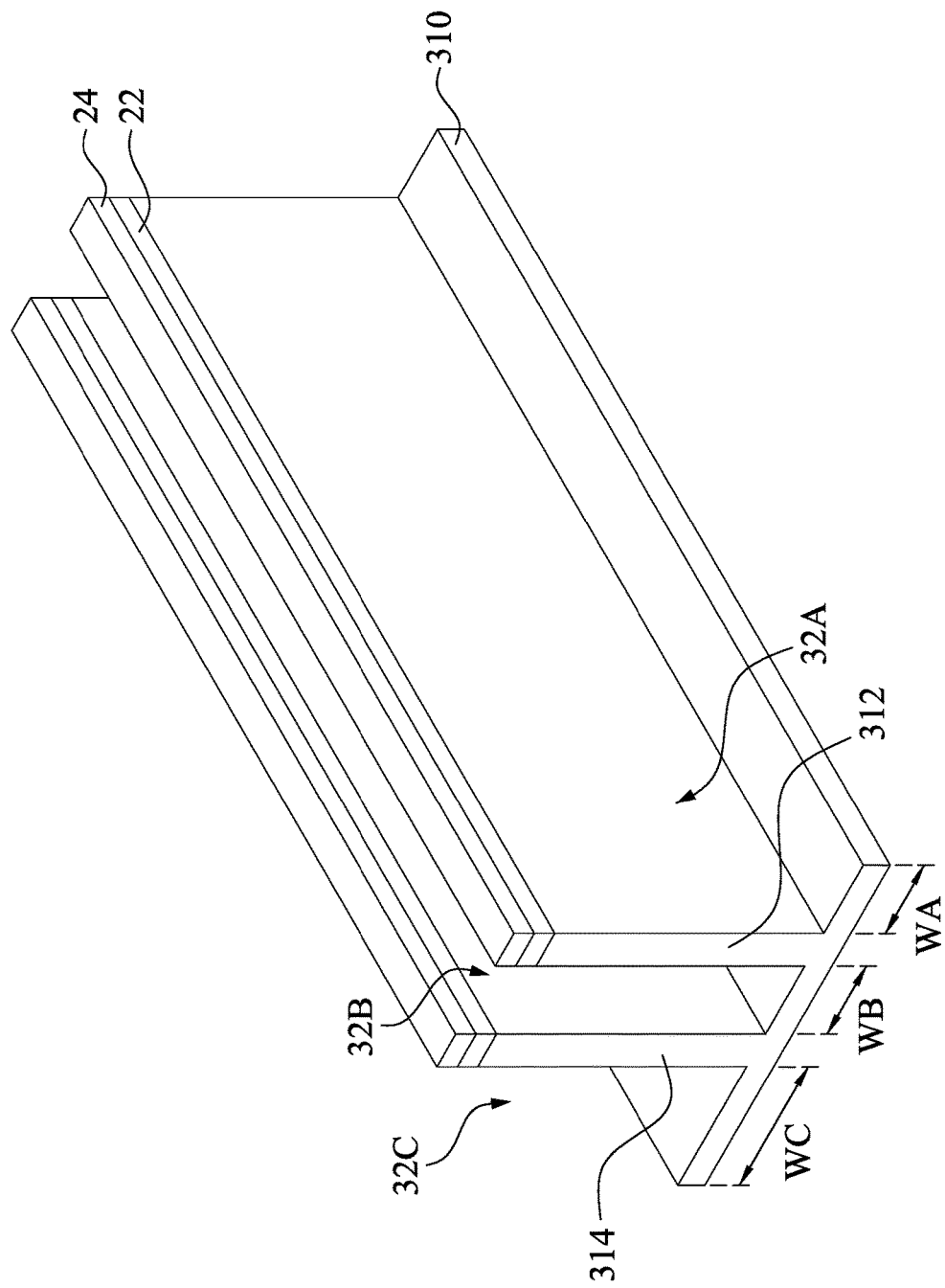

Reference is made to FIG. 2. The mask layer 24, the pad layer 22, and the substrate 310 are patterned. In some embodiments, the mask layer 24 and the pad layer 22 are etched through the photo resist 26, exposing underlying substrate 310. The exposed substrate 310 is then etched, forming trenches 32A, 32B, and 32C. The remaining portions of the substrate 310 between neighboring trenches 32A, 32B, and 32C form semiconductor fins 312 and 314. After etching the substrate 310, the photo resist 26 (see FIG. 1) is removed. In some embodiments, a cleaning process may be performed to remove a native oxide of the substrate 310. The cleaning process may be performed using diluted hydrofluoric (HF) acid, for example.

The trench 32A has a width WA, the trench 32B has a width WB, and the trench 32C has a width WC. In some embodiments, the difference between the width WA and WB is lower than the difference between the width WB and WC. For example, the widths WA and WB are substantially the same, and the width WC is greater than the widths WA and WB. Stated another way, the trench 32C has a lateral size greater than that of the trenches 32A and 32B. Here, the term "substantially the same" indicates that the difference between the widths WA and WB is within 10%.

Figure 3:
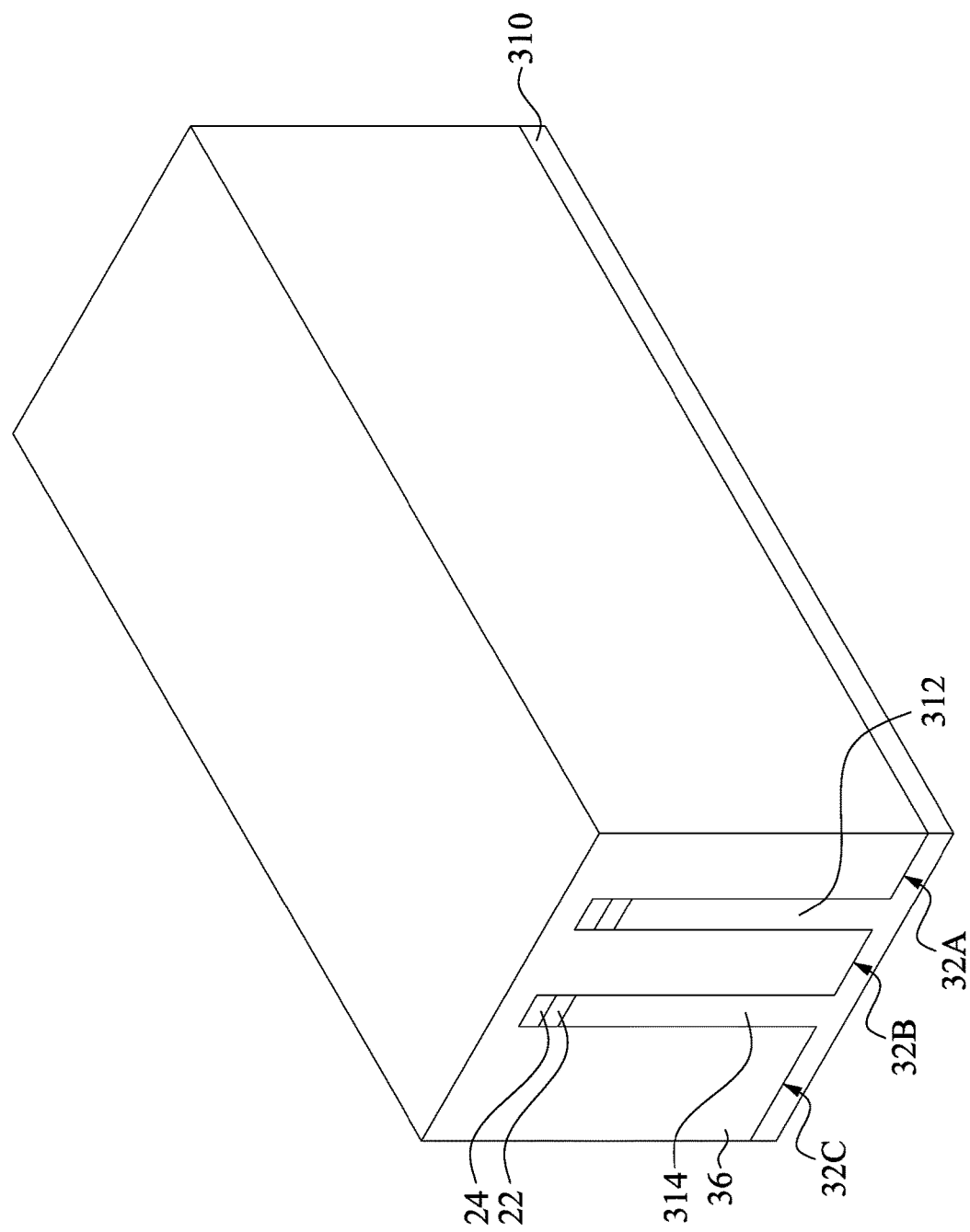

Reference is made to FIG. 3. An isolation layer 36 is formed over the substrate 310. In some embodiments, the isolation layer 36 substantially fills the trenches 32A to 32C. The filling methods may be selected from spin-on, flowable chemical vapor deposition (FCVD), and the like. The isolation layer 36 may include highly-flowable materials, which tend to flow into the trenches 32A to 32C, so as to substantially fill the trenches 32A to 32C.

In some embodiments, the isolation layer 36 includes spin-on glass, which may include Si—O—N—H. In alternative embodiments, the isolation layer 36 includes flowable oxide, which may include Si—O—N—H, Si—C—O—N—H, or the like. Highly-flowable materials tend to (although not necessarily) have a high shrinkage rate. Hence, the isolation layer 36 may have a high shrinkage rate when cured, annealed, and/or solidified. In some embodiments, the isolation layer 36 has a shrinkage rate greater than about 10 percent, or between about 10 percent and about 30 percent. In other embodiments, the isolation layer 36 has a small shrinkage rate, for example, smaller than about 10 percent, or smaller than about 5 percent, when cured, annealed, and/or solidified.

Figure 4:
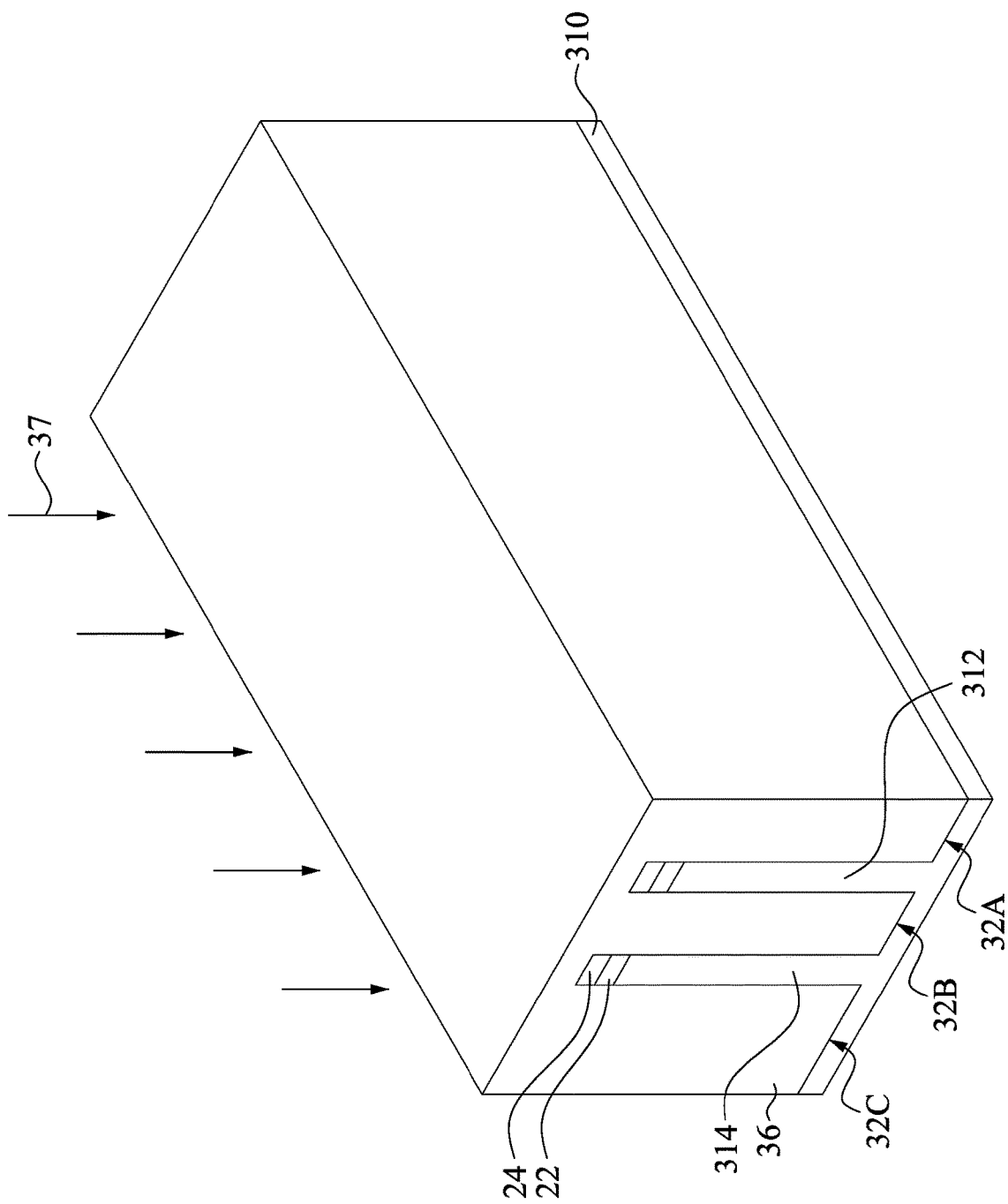

Reference is made to FIG. 4. An annealing process 37 is performed on the isolation layer 36. The isolation layer 36 is solidified as a result of the annealing process 37. In alternative embodiments, the isolation layer 36 is solidified by a curing process separate from the annealing process 37. In some embodiments, the annealing process 37 is performed at a temperature between about 500° C. and about 1,200° C., although different temperatures may be used. The annealing process 37 may be performed for a period of time between about 30 minutes and about 120 minutes, for example.

Figure 5:
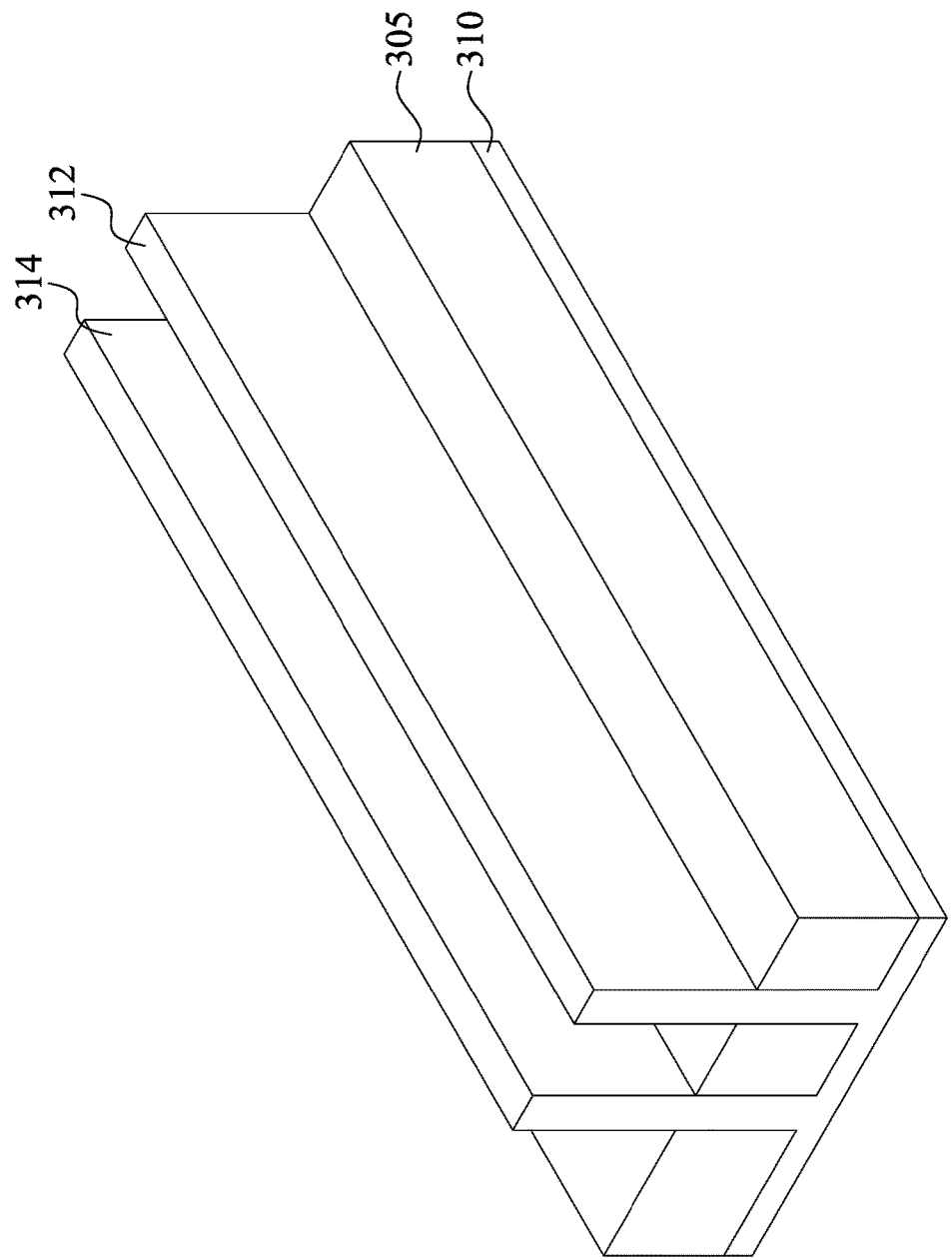

Reference is made to FIG. 5. The isolation layer 36 (see FIG. 4) is partially removed to form an isolation structure 305 as shallow trench isolation (STI) between the semiconductor fins 312 and 314. In some embodiments, a planarization process, such as a chemical mechanism polishing (CMP), is performed to remove the isolation layer 36, the mask layer 24, and the pad layer 22 until the top surfaces of the semiconductor fins 312 and 314 are exposed. Afterward, an etching back process is performed to partially remove the isolation layer 36 until upper portions of the semiconductor fins 312 and 314 protrude from the top surface of the isolation layer 36. The remaining isolation layer 36 is referred to as isolation structure 305.

Figure 6:
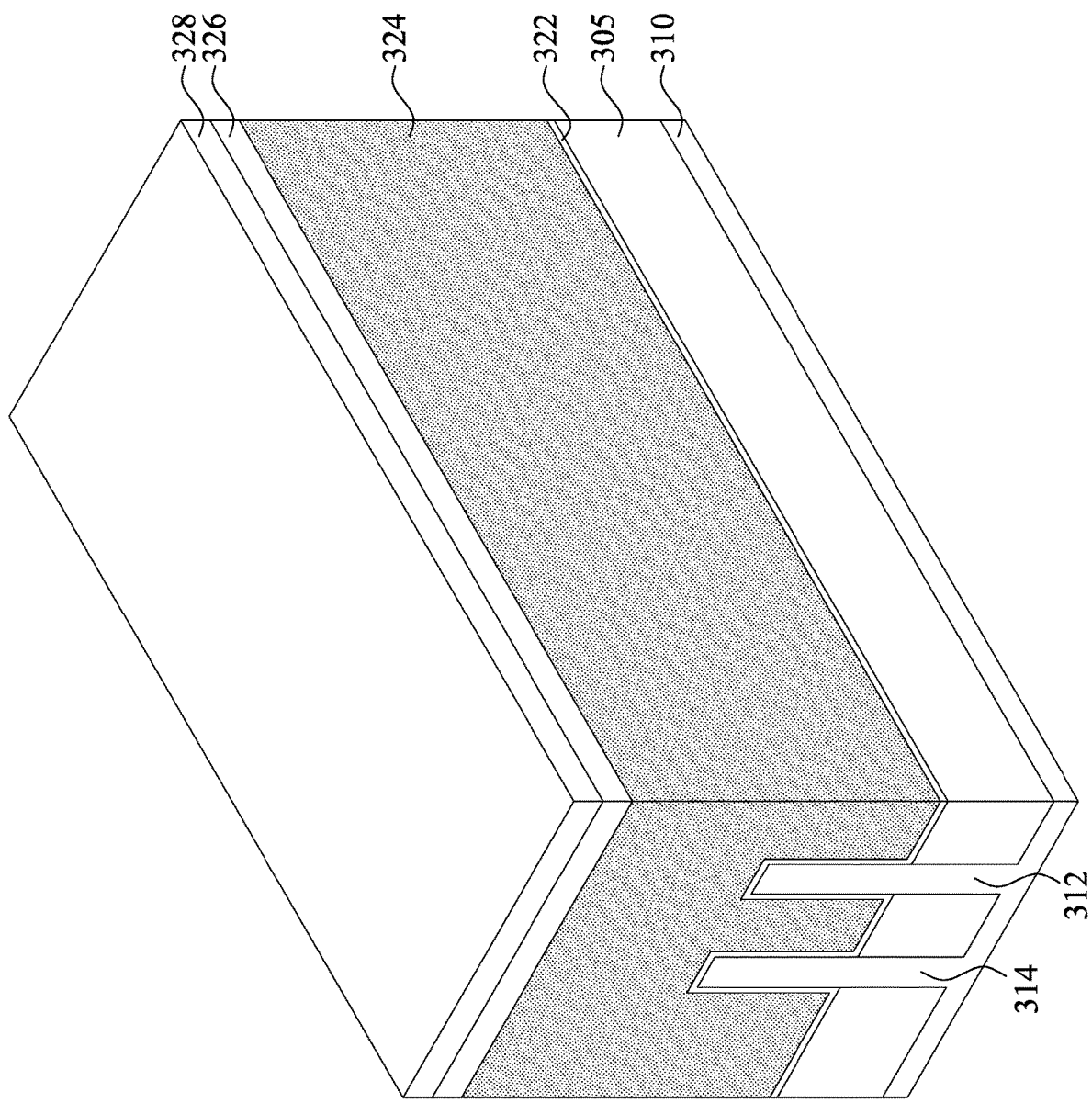

Reference is made to FIG. 6. A dummy dielectric layer 322 is formed over the substrate 310 and covering the semiconductor fins 312 and 314. The dummy dielectric layer 322 may be, for example, silicon oxide, silicon nitride, a combination thereof, or the like, and may be deposited or thermally grown according to acceptable techniques. A dummy gate layer 324 is formed over the dummy dielectric layer 322. The dummy gate layer 324 may be deposited over the dummy dielectric layer 322 and then planarized, such as by a CMP. The dummy gate layer 324 may include polycrystalline-silicon (poly-Si) or poly-crystalline silicon-germanium (poly-SiGe). Further, the dummy gate material layer 324 may be doped poly-silicon with uniform or non-uniform doping.

A first mask 326 and a second mask 328 may be deposited over the dummy gate layer 324. The first mask 326 and the second mask 328, which are used as a hard mask layer during the etching process in the following process(es), may include silicon oxide, silicon nitride and/or silicon oxynitride. The material of the first mask 326 may be different from that of the second mask 328. For example, the first mask 326 made of silicon oxide may be located below the second mask 132 made of silicon nitride.

Figure 7A:
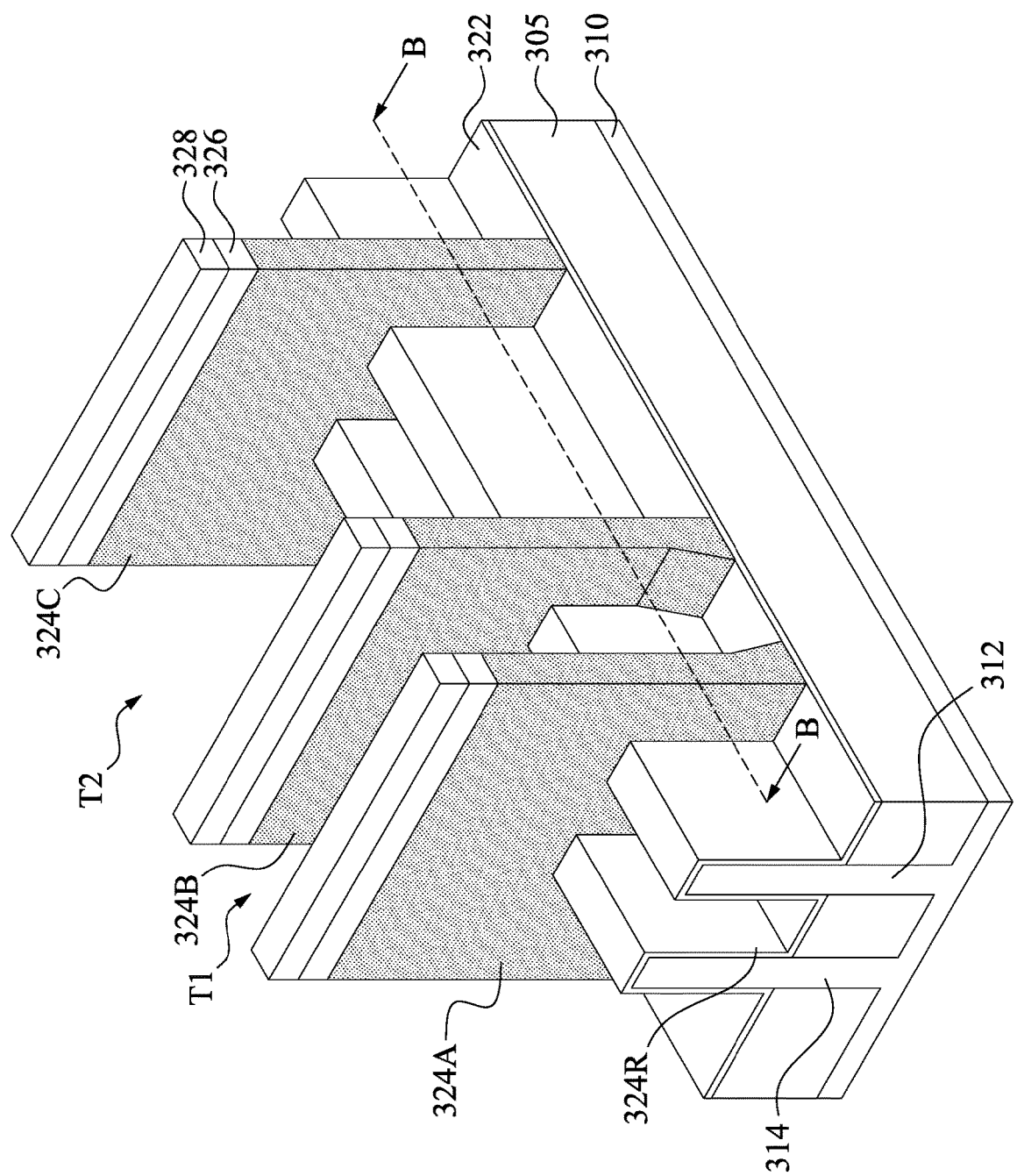
Figure 7B:
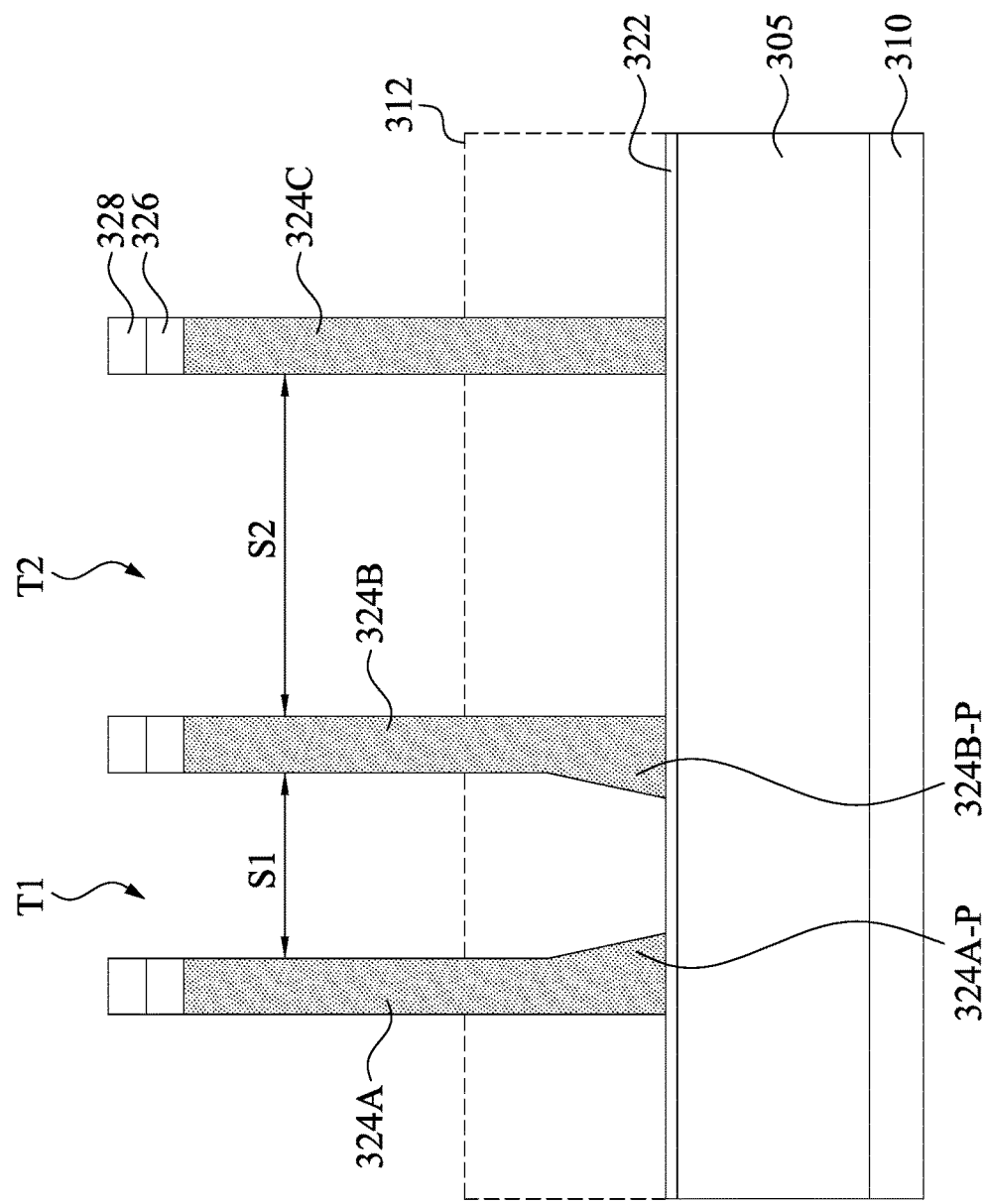

Reference is made to FIGS. 7A and 7B, in which FIG. 7B is a cross-sectional view along line B-B of FIG. 7A. The dummy gate layer 324 (see FIG. 6) is patterned to form dummy gates 324A, 324B, and 324C. For example, the masks 326 and 328 may be patterned using acceptable photolithography and etching techniques. The pattern of the masks 326 and 328 may be transferred to the dummy gate layer 324, for example, by using an acceptable etching process to etch the dummy gate layer 324 uncovered by the masks 326 and 328 to form dummy gates 324A, 324B, and 324C. The dummy gates 324A, 324B, and 324C cover respective channel regions of the semiconductor fins 312 and 314. The dummy gates 324A, 324B, and 324C may also have a lengthwise direction substantially perpendicular to the lengthwise direction of semiconductor fins 312 and 314. The dummy dielectric layer 322 and the dummy gate layer 324 may include sufficient etching selectivity of the etching process, such that the dummy dielectric layer 322 remains after etching the dummy gate layer 324. That is, the dummy dielectric layer 322 may include higher etching resistance to the etchant than the dummy gate layer 324. In some embodiments, the dummy gates 324A, 324B, and 324C are formed by an anisotropic etching, such as a reactive ion etching (RIE) process.

As shown in FIG. 7B, after the formation of the dummy gates 324A to 324C, a trench T1 is formed between the dummy gates 324A and 324B, and a trench T2 is formed between the dummy gates 324B and 324C, respectively. In some embodiments, the trench T2 has a size larger than the trench T1. For example, the spacing S2 between the dummy gates 324B and 324C is wider than the spacing S1 between the dummy gates 324A and 324B. Stated another way, the aspect ratio of the trench T2 is lower than the aspect ratio of the trench T1. Here, the term "aspect ratio" indicates the ratio of a height to a width of a trench. The spacing S1 can be referred to as a dense region of a device as the distance between the dummy gates 324A and 324B is smaller than other regions of the device.

In some embodiments, after the etching process, the dummy gates 324A and 324B respectively include protrusion portion 324A-P and 324B-P exposed to the trench T1. This is because the trench T1 has a relatively higher aspect ratio, the etchant for etching the dummy gate layer 324 is harder to flow into the trench T1 than into other wider regions of the device (e.g., the trench T2), which results in an incomplete patterning of the dummy gates 324A and 324B. Accordingly, the protrusion portions 324A-P and 324B-P are the remaining portions of the dummy gate layer 324 as a result of the incomplete removal. In some embodiments, the heights of the protrusion portion 324A-P and 324B-P are lower than a top surface of the semiconductor fin 312 (drawn in dash-line).

Figure 8A:
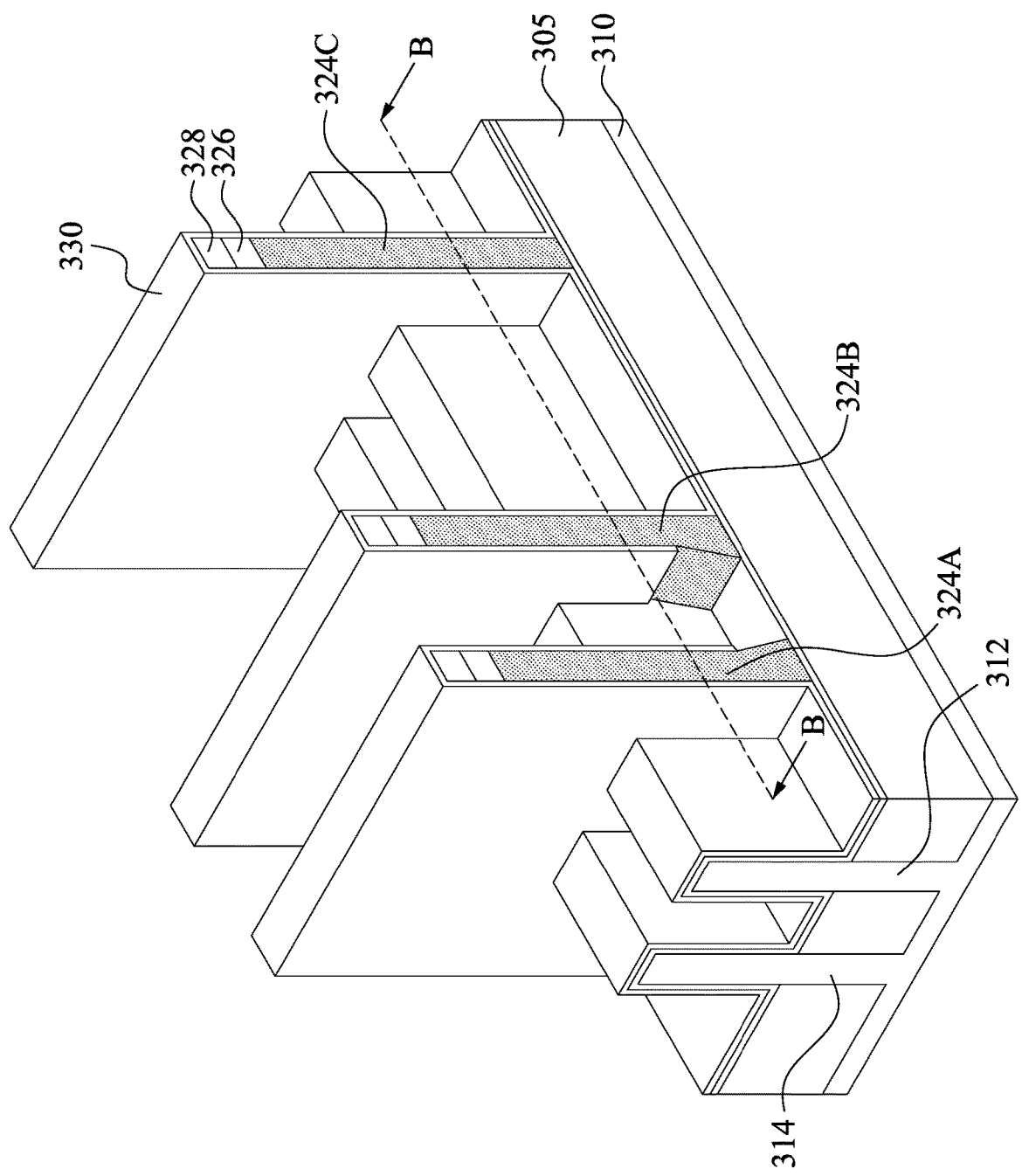
Figure 8B:
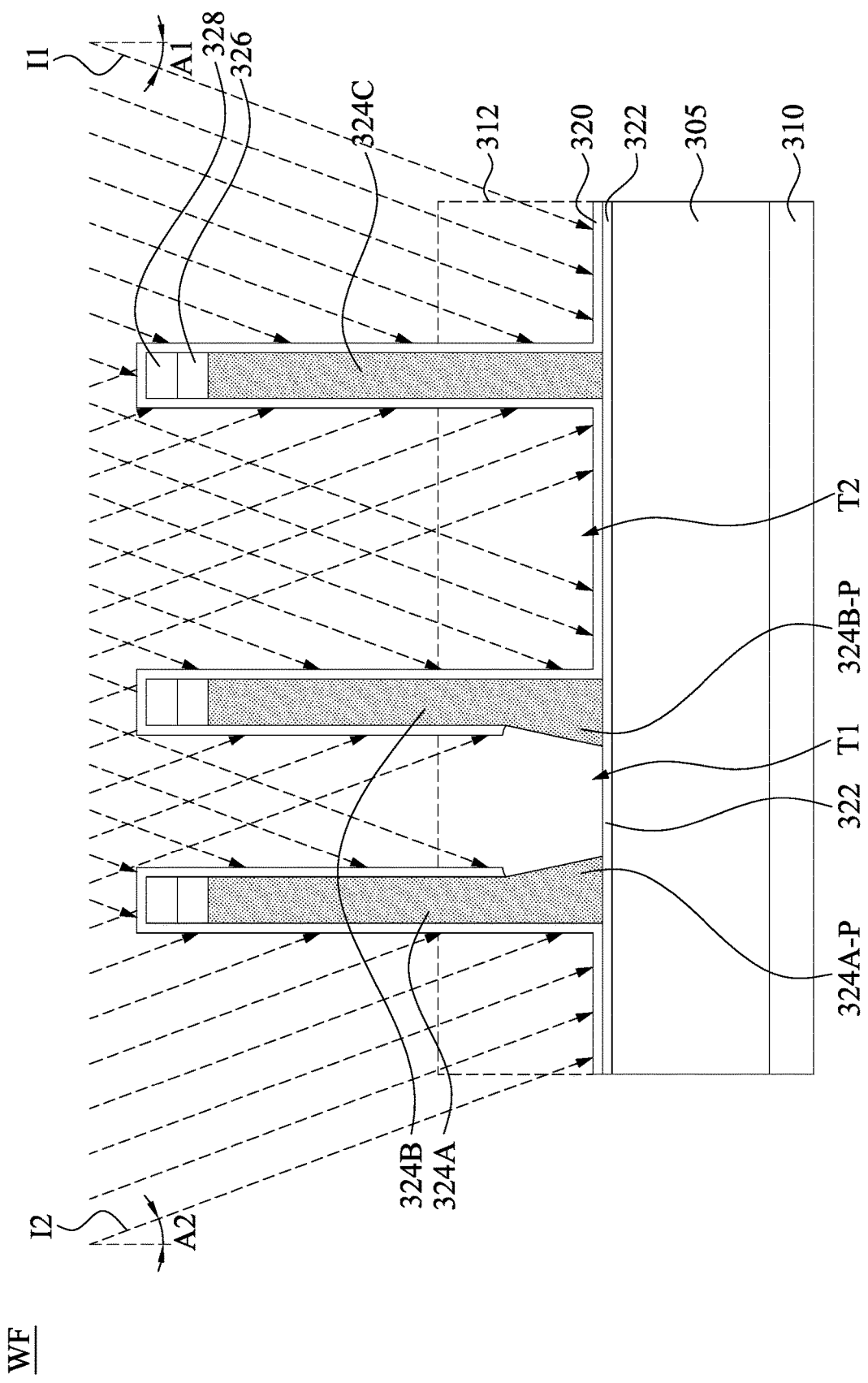

Reference is made to FIGS. 8A and 8B, in which FIG. 8B is a cross-sectional view along line B-B of FIG. 8A. A directional deposition process is performed to form a protection layer 330 over the substrate 310. In some embodiments, the protection layer 330 is formed to cover the dummy gates 324A to 324C and the dummy dielectric layer 322. As shown in FIG. 8B, however, the protection layer 330 does not cover the protrusion portions 324A-P and 324B-P and the portion of the dummy dielectric layer 322 within the trench T1, which will be described in greater detail below. In some embodiments, the protection layer 330 may be polymers including fluorocarbon (e.g., —C—CF$_2$), or suitable materials that provide etching sufficient selectivity with respect to the dummy gates 324A to 324C during the directional etching process discussed below.

The directional deposition process is performed using directional ions extracted from plasma and directed to the wafer WF at oblique angles with respect to a normal direction N (see FIG. 31) of the wafer surface, as described in greater detail below. For example, the arrows drawn in dashed lines in FIG. 8B indicate the direction that the ion beams are incident on the wafer WF to form the protection layer 330.

Figure 31:
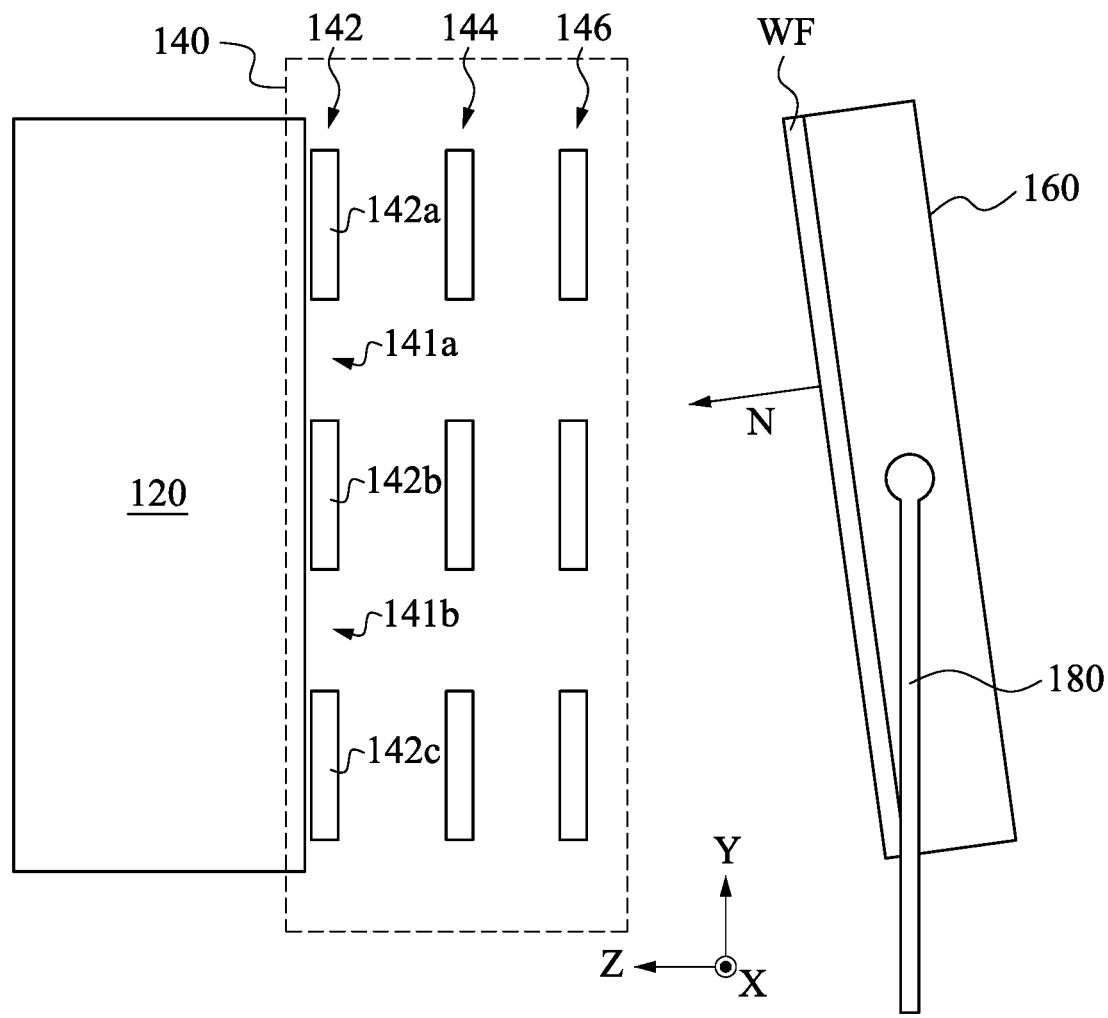
FIG. 31 is a schematic diagram of the fabrication apparatus in accordance with some embodiments of the present disclosure.
Figure 32:
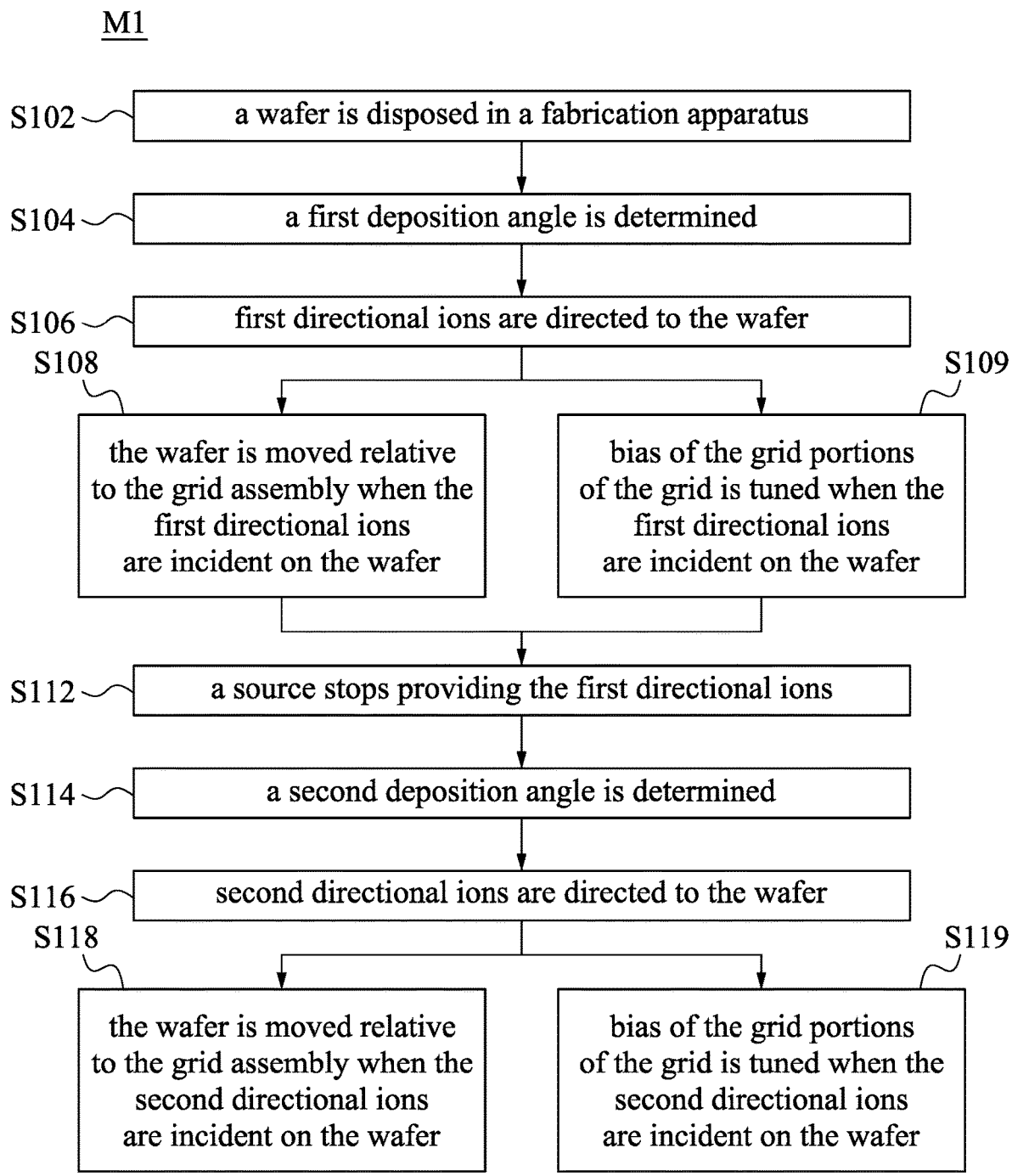
FIG. 32 is a flow chart of a method illustrating the operations of the fabrication apparatus in FIG. 31 in accordance with some embodiments of the present disclosure.

FIG. 31 is a schematic diagram of a fabrication apparatus 100, according to some embodiments of the present disclosure. FIG. 32 is a flow chart of a method M1 of a directional deposition process in accordance with some embodiments of the present disclosure. Reference is made to FIGS. 8B, 31, and 32. In some embodiments, the wafer WF may undergo a deposition process in the fabrication apparatus 100 of FIG. 31 and using the method M1 of FIG. 32.

The method M1 starts from block S102 where a wafer is disposed in the fabrication apparatus. The fabrication apparatus 100 shown in FIG. 31 includes a source 120, a grid assembly 140, a wafer stage 160 disposed with respect to the source 120 and the grid assembly 140, and a mechanism 180. For illustration, the wafer stage 160 is disposed in front of the source 120 and the grid assembly 140, and the grid assembly 140 is disposed between the source 120 and the wafer stage 160.

In some embodiments, the source 120 is configured to provide at least one ion beam including ions to be, for illustration, deposited on the wafer WF positioned on the wafer stage 160. In some embodiments, the source 120 is a plasma source, and the ions are generated from the plasma source. The grid assembly 140 is configured to direct the at least one ion beam provided by the source 120 and transmits the ion beam to the wafer WF positioned on the wafer stage 160. The wafer stage 160 is located at a predetermined distance from the grid assembly 140. For example, the wafer stage 160 is located at a range of about 0.5 cm (centimeters) to about 50 cm from the grid assembly 140. The distance between the wafer stage 160 and the grid assembly 140 in FIG. 31 is given for illustrative purposes. Various distances between the wafer stage 160 and the grid assembly 140 is within the contemplated scope of the present disclosure.

The method M1 proceeds to block S104 where a first deposition angle is determined. As mentioned above, the directional ions are directed to the wafer WF at oblique angles with respect to the normal direction N of the wafer surface. Therefore, the wafer WF is tilted along the X-axis such that the normal direction N and the directional ions form a first angle A1 (which is referred to as the first deposition angle A1, and see FIG. 8B). The deposition angle A1 is greater than 0 and less than about 90°. For example, the wafer stage 160 tilts toward the grid assembly 140 with an angle range of about 0° to about 90°, or the wafer stage 160 tilts away from the grid assembly 140 with an angle range of about 0° to about 90°. The first deposition angle A2 is determined by the aspect ratio of the trench T2. If the first deposition angle A2 is too large, the directional ions may not be able to reach the bottom of the trench T2; if the first deposition angle A2 is too small, the directional ions may be not deposited on the sidewall of the dummy gate 324A-324C.

Figure 33:
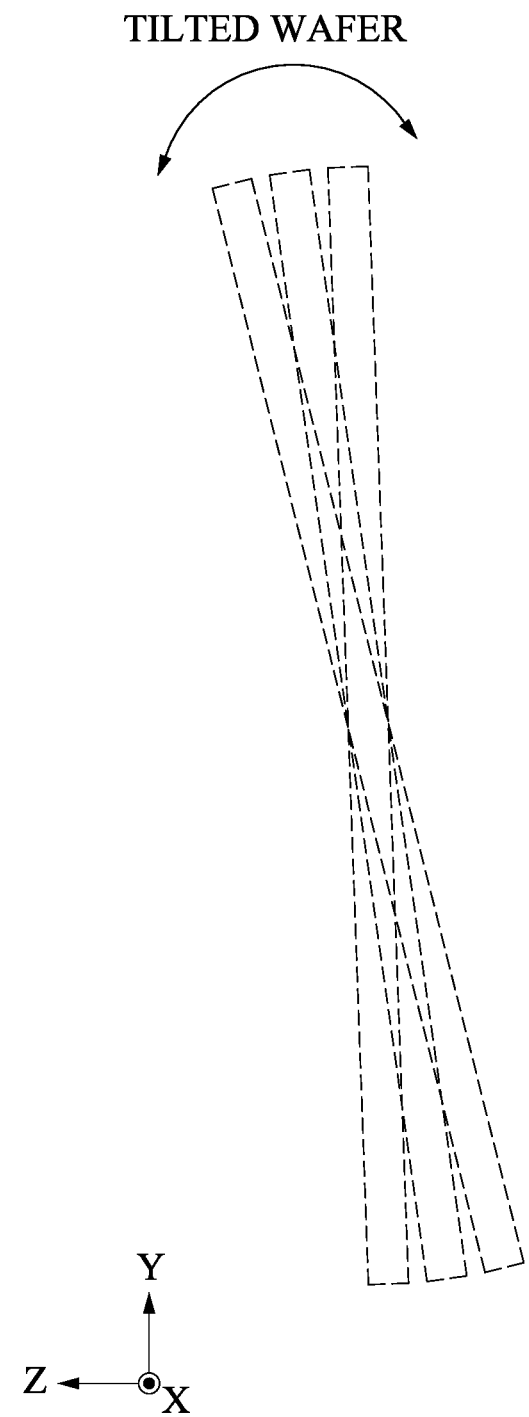
FIG. 33 is a schematic diagram illustrating the operation of fabrication apparatus in FIG. 31 during the method in FIG. 31 in accordance with some embodiments of the present disclosure.

FIG. 33 is a schematic diagram illustrating the operation of fabrication apparatus 100 in FIG. 31 during the method M1 in FIG. 32. For illustration in FIG. 33, each dash rectangles indicates the position of the wafer WF in a view of the X-axial direction. When the wafer stage 160 rotates along the X-axial direction, the trace of dash rectangles rotates in FIG. 33. FIG. 33 further illustrates that the wafer WF has no shift in the X-axial direction. Alternatively stated, the wafer stage 160 is rotatable only on the Y-Z plane. The rotating axis of the wafer stage 160 shown in FIG. 33 is given for the illustrative purposes. Various rotating axes of the wafer stage 160 are within the contemplated scope of the present disclosure.

In FIG. 33, in some other embodiments, the wafer stage 160 does not rotate while the wafer WF is receiving the ion beams. Explained in a different way, the wafer stage 160 tilts with a predetermined angle clockwise before the wafer WF starts to receive the ion beams. In some other embodiments, the wafer stage 160 tilts with a predetermined angle counterclockwise before the wafer WF starts to receive the ion beams. In alternative embodiments, the wafer stage 160 tilts with a predetermined angle counterclockwise before the wafer WF receives the ion beams, and tilts with the same predetermined angle clockwise before the wafer WF receives the ion beams. In some embodiments, the wafer WF does not receive ion beams when the wafer stage 160 is rotating.

Figure 34:
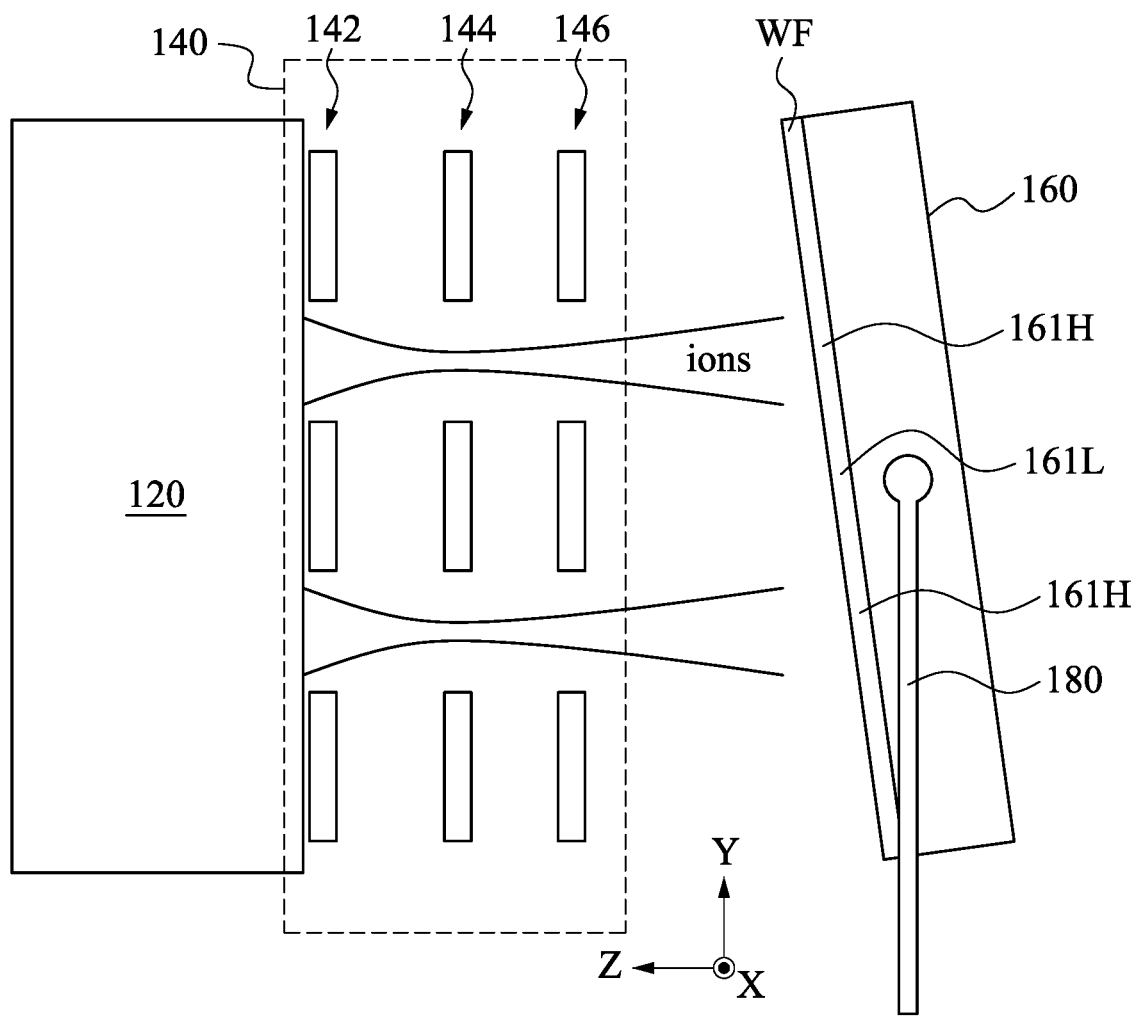
FIG. 34 is a schematic diagram illustrating the operation of fabrication apparatus in FIG. 31 during the method in FIG. 32 in accordance with some embodiments of the present disclosure.

The method M1 proceeds to block S106 where first directional ions are directed to the wafer. The first directional ions I1 are shown in FIG. 9B. FIG. 34 is a schematic diagram of operation of the fabrication apparatus 100 in FIG. 31, according to some embodiments of the present disclosure. With respect to the embodiments of FIG. 31, like elements in FIG. 34 are designated with the same reference numbers for ease of understanding. Reference is made to FIGS. 32 and 34. As mentioned above, the source 120 is configured to provide at least one ion beam including ions to be, for illustration, deposited on the wafer WF positioned on the wafer stage 160. In some embodiments, the source 120 is a plasma source. The ion beams are generated by the source 120. Alternatively stated, the ions beams are extracted from the plasma in the source 120. For example, for the deposition of boron (B), gaseous boron fluoride ($BF_3$) is supplied to the source 120. The source 120 employs electrical excitation to form a plasma that may include a number of ion species resulting from fractionation of the source compound, including the desired species (e.g., $B^+$) that is to be deposited.

The output and function of the source 120, as discussed above, are given for illustrative purposes. Various outputs and functions of the source 120 are within the contemplated scope of the present disclosure. For example, in various embodiments, the source 120 provides the ion beam to perform an etching process to the wafer WF, in order to form a semiconductor structure with a desired profile on the wafer stage 160.

The grid assembly 140 directs the ion beam substantially in a Z-axial direction, which indicates a horizontal direction as shown in FIG. 31. In some embodiments, the grid assembly 140 includes several grids, which includes, for illustration in FIG. 31, grid 142, grid 144, and grid 146. The grid 142, grid 144, and grid 146 are disposed with respect to the source 120. For illustration in FIG. 31, the grid 142 is disposed adjacent to the source 120, the grid 146 is disposed adjacent to the wafer stage 160, and the grid 144 is disposed between the grid 142 and the grid 146. The amount of the grids illustrated in FIG. 31 is given for illustrative purposes. Various amounts of the grids in the grid assembly 140 are within the contemplated scope of the present disclosure.

In some embodiments, each grid in the grid assembly 140 includes several grid portions and apertures. For illustration in FIG. 31, the grid 142 includes grid portions 142a, 142b, and 142c that are separate from each other, an aperture 141a that is arranged between the grid portions 142a and 142b, and an aperture 141b that is arranged between the grid portions 142b and 142c. For illustration in FIG. 31, the grid 144 and the grid 146 have a same configuration as the grid 142, and accordingly, the configurations of the grid 144 and the grid 146 are not further detailed herein.

For convenience of discussion, FIG. 31 illustrates three grid portions and two apertures of each one of the grid 142, the grid 144, and the grid 146. The amounts of grid portions and apertures in FIG. 31 are given for illustrative purposes. Various amounts of the grid portions and apertures are within the contemplated scope of the present disclosure.

In some embodiments, the grid 142 is configured to be coupled to a positive supply voltage (not shown), and thus the grid 142 is configured to control the potential of the ion beams. In some embodiments, the grid 142 is disposed in contact with the plasma as discussed above. Accordingly, in some embodiments, the grid 142 is referred to as a "screen." In some embodiments, the grid 142 is configured as the electrode which controls the plasma as discussed above. Accordingly, in some embodiments, the grid 142 is also referred to as an "anode."

In some embodiments, the grid 144 is configured to be coupled to a negative supply voltage (not shown), and the grid 144 is configured to direct the ion beams. The ion beams are directed from the grid 142 toward the grid 144. In some embodiments, the grid 144 is configured to accelerate the ion beams according to the negative supply voltage. In some embodiments, the grid 144 is referred to as an "accelerator".

Figure 36A:
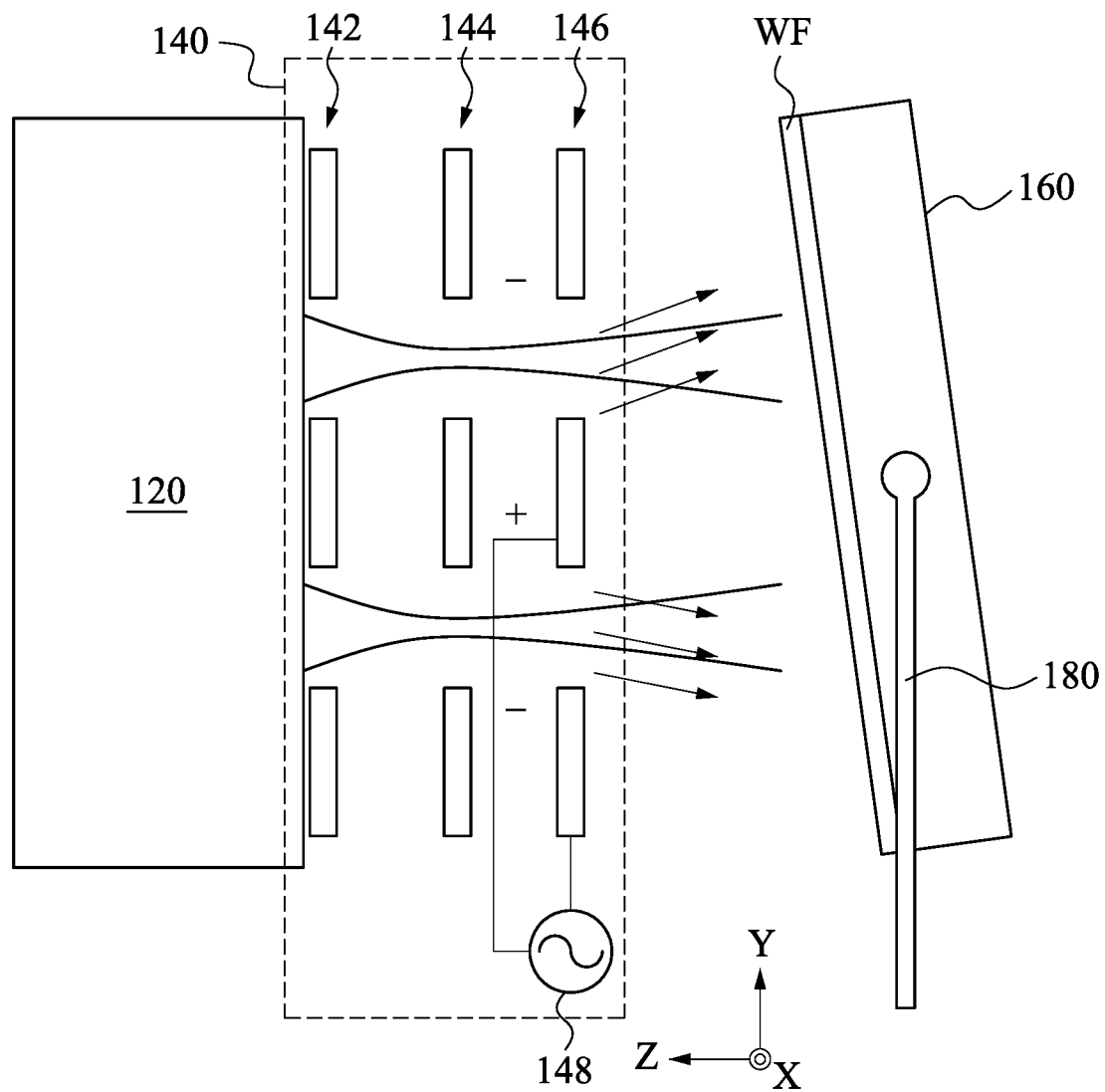
FIGS. 36A and 36B are schematic diagrams illustrating the operations of fabrication apparatus in FIG. 31 during the method in FIG. 32 in accordance with some embodiments of the present disclosure.
Figure 36B:
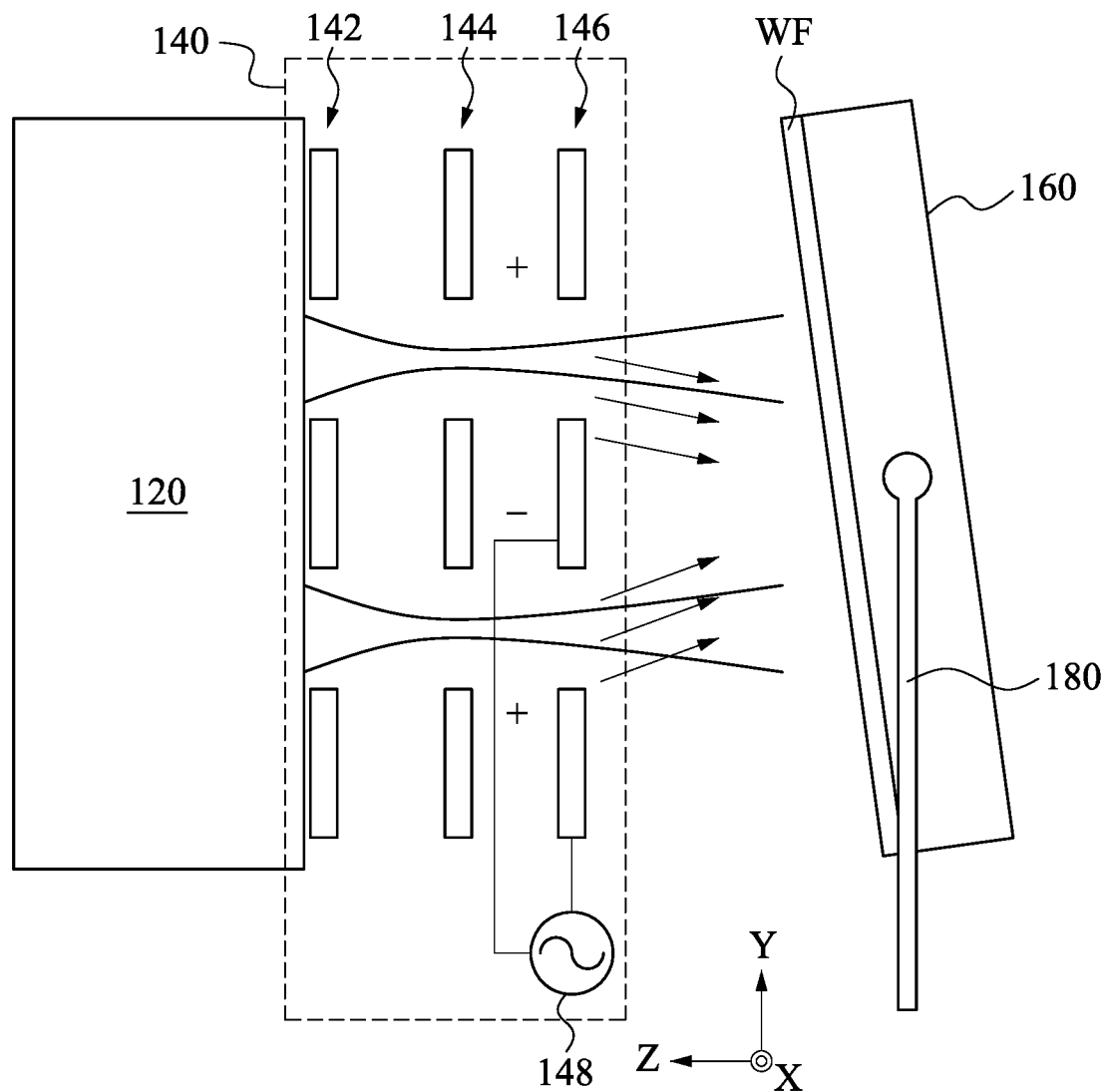

In some embodiments, the grid 146 is configured to couple to the ground (not shown), and the grid 146 is configured to decelerate the ion beams directed from the grid 144. In some embodiments, the grid 146 is referred to as a "decelerator". In some other embodiments, the grid 146 is configured to be coupled to an adjustable voltage as shown in FIGS. 36A and 36B and will be discussed below.

For illustration in FIGS. 31 and 34, the ion beams travel through the grid 142 via the apertures 141a and 141b arranged between the grid portions 142a-142c of the grid 142. Next, the ion beams are accelerated due to the negative voltage applied on the grid 144 and travel through the grid 144 via the apertures arranged between the grid portion of the grid 144. Then, the ion beams are decelerated due to the ground potential applied on the grid 146 and travel through the grid 146 via the apertures arranged between the grid portions of the grid 146. Therefore, the ion beams are directed by the grid assembly 140 substantially along the Z-axial direction. In some embodiments, the wafer stage 160 is configured to receive the wafer WF for performing the process by the directed ion beams.

In some embodiments, the apertures of the grid 142, the grid 144, and the grid 146 are configured to optimize the confinement of the ion beams while directing the extracted ions from the source 120. The size of the apertures of the grid 142, the grid 144, and the grid 146 ranges between about 0.1 mm (millimeters) to about 10 mm. The size of apertures in FIG. 31 is given for illustrative purposes. Various sizes of the apertures are within the contemplated scope of the present disclosure.

In some embodiments, as discussed above, the ion beams are directed by the grid assembly 140 substantially along the Z-axial direction toward the wafer WF held by the wafer stage 160, thus, the ion beams travel to the wafer WF through the apertures of the grid assembly 140. Therefore, the pattern of the ion beams arrived at the wafer WF is associated with the pattern of the apertures of the grid assembly 140. Accordingly, the wafer WF includes high density regions 161H and low density regions 161L associated with the pattern of the apertures of the gird assembly 140. Compared to the low density regions 161L, there are relatively more ions traveling to the high density regions 161H. Alternatively stated, the low density regions 161L have fewer ions arrived than the high density regions 161H.

In some embodiments, the distribution of the high density regions 161H and the low density regions 161L on the wafer 161 corresponds to the apertures of the grid assembly 140 associated with the size of the apertures and the distance between the grid assembly 140 and the wafer stage 160. The distribution of the high density regions 161H and the low density regions 161L on the wafer 161 shown in FIG. 34 is given for illustrative purposes. Various distributions of the high density regions 161H and the low density regions 161L on the wafer 161 are within the contemplated scope of the present disclosure.

For illustration in FIG. 34, the ion beams are directed by the grid assembly 140 and have a small angle deviated from the Z-axial direction. The deviation from the Z-axial direction of the directed ion beams corresponds to the spacing of the grid 142, the grid 144, and the gird 146 and the distance between the grid assembly 140 and the wafer stage 160. The deviation from the Z-axial direction of the directed ion beams shown in FIG. 34 is given for illustrative purposes. Various deviations from the Z-axial direction of the directed ion beams are within the contemplated scope of the present disclosure.

In some approaches, when ion distribution is performed to a wafer, a wafer stage carrying the wafer is maintained still and is not movable and rotatable. Accordingly, the wafer has non-uniformly processed regions thereon, including the high density regions 161H and the low density regions 161L as discussed above for illustration in FIG. 34. The embodiments of present disclosure solves issues in existing approaches by controlling (shifting) the positions of the high density regions 161H and the low density regions 161L with time, as described in greater detail below.

In some embodiments, the method M1 proceeds to block S108 where the wafer is moved relative to the grid assembly when the first directional ions incident the wafer. FIGS. 35A-35C are schematic diagrams illustrating the operations of fabrication apparatus in FIG. 31 during the method M1 in FIG. 32 in accordance with some embodiments of the present disclosure. Reference is made to FIGS. 34 and 35A-35C. In some embodiments, the wafer stage 160 is movable in a first direction (e.g., X direction), a second direction (e.g., Y direction), or a combination thereof. With the movement of the wafer stage 160, the wafer WF positioned on the wafer stage 160 is also movable in the X-axial direction (see. FIG. 35B), the Y-axial direction (see FIG. 35A), or the combination thereof. In some embodiments, the wafer stage 160 is movable in the X-axial and Y-axial directions simultaneously (such as circularly moved as shown in FIG. 35C).

In some embodiments, the wafer stage 160 is coupled to the mechanism 180 which assists the wafer stage 160 to move. For illustration in FIG. 34, the wafer WF is moved and/or rotated in according with the assistance of the mechanism 180. In some embodiments, the mechanism 180 is configured to assist the wafer stage 160 to move by a linear motion system. For example, the mechanism 180 includes a two-dimension linear motor system which assists the wafer stage 160 to move in the X-axial direction and the Y-axial direction. In some other embodiments, the mechanism 180 is configured to assist the wafer stage 160 to move by a ballscrews system. In some further embodiments, the mechanism 180 is configured to assist the wafer stage to move by a circular or linear gear system. The mechanism 180 discussed above is for explanation purposes, various mechanisms 180 are within the contemplated scope of the present disclosure. For example, the mechanism includes the combination of linear motor systems, ballscrews, and circular gears to assist the wafer stage 160 to move and rotate.

In some other embodiments, the grid assembly 140 is movable in the first direction (X-axial direction), the second direction (Y-axial direction), the third direction (Z-axial direction), or the combination thereof. While the grid assembly 140 is moving, the wafer stage 160 may be moved accordingly or be still. Embodiments fall within the present disclosure as long as the wafer WF is moved relative to the grid assembly 140.

Compared to the aforementioned approaches, the wafer stage 160 carrying the wafer WF in the present disclosure is movable while keeps the notch of the wafer WF at the same orientation (see FIGS. 35A-35C), and accordingly, the wafer WF has more even ion distribution thereon. For example, with the movable and/or rotatable wafer stage 160, the positions of the low density regions 161L as discussed above are spatially moved to the positions of the high density regions 161H. Therefore, the low density regions 161L can be moved to the positions where more ions are received and be further processed, such that the wafer WF is able to be uniformly processed.

For illustration in FIG. 35A, each dash circle indicates a corresponding position of the wafer WF in a view of the Z-axial direction in FIG. 34. When the wafer stage 160 moves along the Y-axial direction, the trace of the dash circles moves up and down in FIG. 35A. FIG. 35A further illustrates that the wafer WF has no shift in the X-axial direction or the Z-axial direction. Alternatively stated, the wafer stage 160 is movable only in the Y-axial direction in FIG. 34. In some embodiments, the wafer stage 160 carrying the wafer WF moves back and forth in the Y-axial direction continuously and linearly, for the wafer WF to be processed by the ion beams, and accordingly, the movement of the wafer stage 160 is referred to as "Y-axis linear scan" in some embodiments. In some embodiments, the moving distance of the wafer stage 160 is shorter, equal, or longer than the inter-aperture distance arranged in the grid portions of the grid assembly 140 as discussed above.

For illustration in FIG. 35B, each dash circle indicates a corresponding position of the wafer WF in a view of the Z-axial direction in FIG. 34. When the wafer stage 160 moves along the X-axial direction, the trace of the dash circles moves left and right in FIG. 35B. FIG. 35B further illustrates that the wafer WF has no shift in the Y-axial direction or the Z-axial direction. Alternatively stated, the wafer stage 160 is movable only in the X-axial direction in FIG. 34. In some embodiments, the wafer stage 160 carrying the wafer WF moves back and forth in the X-axial direction continuously and linearly, for the wafer WF to be processed by the ion beams, and accordingly, the movement of the wafer stage 160 is referred to as "X-axis linear scan" in some embodiments. In some embodiments, the moving distance of the wafer stage 160 is shorter, equal, or longer than the inter-aperture distance arranged in the grid portions of the grid assembly 140 as discussed above.

For illustration in FIG. 35C, each dash circle indicates the position of the wafer WF in a view of the Z-axial direction in FIG. 34. The trace of the dash circles in FIG. 35C further illustrates that the wafer WF has no shift in the Z-axial direction. Alternatively stated, the wafer stage 160 is movable only in the X-axial direction, the Y-axial direction, or the combination thereof. In some embodiments, the wafer stage 160 carrying the wafer WF moves circularly on the XY plane, for illustration, off the Z axis, for the wafer WF to be processed by the ion beams, and accordingly, the movement of the wafer stage 160 is referred to as "off axial wafer rotation" in some embodiments. In some embodiments, the wafer stage 160 moves circularly in a circle having a radius which is shorter, equal, or longer than the inter-aperture distance arranged in the grid portions of the grid assembly 140 as discussed above.

In some embodiments, in a semiconductor device, a lengthwise direction of a gate structure is perpendicular to a lengthwise direction of a semiconductor fin. As a result, the term "X-axis" discussed in FIGS. 35A-35C may be considered as aligning with a lengthwise direction of a gate structure, such as the lengthwise direction of dummy gates 324A, 324B, and 324C. On the other hand, the term "Y-axis" may be considered as aligning with a lengthwise direction of a semiconductor fin, such as the lengthwise direction of semiconductor fin 312 and 314. Accordingly, in FIG. 35A, the wafer stage 160 carrying the wafer WF can be regarded as moving along a lengthwise direction of a semiconductor fin, but not moving along a lengthwise direction of a gate structure. Similarly, in FIG. 35B, the wafer stage 160 carrying the wafer WF can be regarded as moving along a lengthwise direction of a gate structure, but not moving along a lengthwise direction of a semiconductor fin.

The above movements including, for illustration, linear, circular, and/or rotating movements are illustrated in respective embodiments. The above movements are given for illustrative purposes, and are able to be performed individually or in combination. Also, the above configuration of the fabrication apparatus 100 is given for illustrative purposes. Various configurations of the fabrication apparatus 100 are within the contemplated scope of the present disclosure. For example, in various embodiments, the fabrication apparatus 100, or the grid assembly 140, further includes a bias controller 148 which is configured to bias the grid portions of the grid 146, as will be discussed below with reference to FIGS. 36A-36B.

In some other embodiments, the method M1 proceeds to block S109 where bias of the grid portions of the grid is tuned when the first directional ions are incident on the wafer. FIGS. 36A and 36B are schematic diagrams of a fabrication apparatus 200 according to various embodiments of the present disclosure. With respect to the embodiments of FIG. 31, like elements in FIGS. 36A and 36B are designated with the same reference for ease of understanding.

In some embodiments, the grid assembly 140 further includes a bias controller 148. The bias controller 148 is configured to bias the grid assembly 140. In some embodiments, the bias controller 148 is configured to provide a bias voltage on every adjacent two of the grid portions. In some embodiments, the bias controller 148 is configured to provide an alternating-current (AC) bias voltage on every adjacent two of the grid portions. For ease of illustration, only one bias controller 148 is shown in FIGS. 36A and 36B. In some embodiments, the bias controller 148 is configured to provide an adjustable voltage on every adjacent two of the grid portions. For illustration in FIGS. 36A and 36B, the bias controller 148 is configured to control the bias on the grid 146.

The configuration discussed above in FIGS. 36A and 36B is given for illustrative purposes. Various configurations of the grid assembly 140 or the fabrication apparatus 200 are within the contemplated scope of the present disclosure. Alternatively stated, for ease of illustration, only one bias controller 148 is shown and configured as that in FIGS. 36A and 36B. However, one of ordinary skill in the art would understand that various amounts and configurations of the bias controller 148 are within the contemplated scope of the present disclosure. For example, there are two bias controllers 148 each providing a bias for adjacent two of the grid portions of the grid 146 as shown in FIGS. 36A and 36B.

For illustration of FIGS. 36A and 36B, the bias controller 148 is coupled to the grid 146. The bias controller 148 provides alternating-current bias voltage on every adjacent two grid portions of the grid 146. As illustrated in FIG. 36A, the ion beams in the upper side of the grid 146 are deviated because the potential difference on the grid portions of the grid 146. The ion beams tend to be directed toward the grid portion which has lower potential. Correspondingly, the ion beams in the lower side of the grid 146 are also deviated because the potential difference on the grid portions of the grid 146.

As illustrated in FIG. 36B, the ion beams in the upper side of the grid 146 are deviated because the potential difference on grid portions of the grid 146. The ion beams tend to be directed toward the grid portion which has lower potential. Correspondingly, the ion beams in the lower side of the grid 146 are also deviated because the potential difference on the grid portions of the grid 146.

The potential distributions on the grid assembly 140 discussed above are given for illustrative purposes. Various distributions of the potential on the grid assembly 140 are within the contemplated scope of the present disclosure.

Similarly, the bias controller 148 controls/tunes the potentials of the grid portions (see FIGS. 36A and 36B), and accordingly, the wafer WF has more even ion distribution thereon. For example, as the potentials of the grid portions changes periodically, the positions of the low density regions 161L as discussed above are spatially moved to the positions of the high density regions 161H. Therefore, the low density regions 161L can be moved to the positions where more ions are received and be further processed, such that the wafer WF is able to be uniformly processed.

The method M2 proceeds to block S112 where the source stops providing the first directional ions. In some embodiments, when the first directional ions I1 are deposited on one side of the sidewalls of the dummy gates 324A-324C to form a portion of the protection layer 320, the source 120 stops the deposition process, and there is no ions generated from the source 120.

The method M2 proceeds to block S114 where a second deposition angle A2 is determined. In some embodiments, the first deposition angle A1 and the second deposition angle A2 has the same value but with opposite directions. That is, A2 is substantially equals to −A1. In some embodiments, as shown in FIG. 33, the wafer WF can be tilted again, such that the normal line N and the following formed second directional ions I2 form the second deposition angle A2. In some other embodiments, as shown in FIG. 34, the wafer WF can be rotate along the Z-axial direction about 180 degrees, such that the normal line N and the following formed second directional ions I2 form the second deposition angle A2.

The method M2 proceeds to block S116 where second directional ions are directed to the wafer. The second directional ions I2 are shown in FIG. 8B. In some embodiments, the method M1 proceeds to block S118 where the wafer is moved relative to the grid assembly when the second directional ions are incident on the wafer. In some other embodiments, the method M1 proceeds to block S119 where bias of the grid portions of the grid is tuned when the second directional ions are incident on the wafer. Since the details of blocks S118 and S119 are similar to those described in blocks 108 and 109 of method M1, the detailed descriptions thereof are not repeated herein.

As mentioned above, the trench T1 is relatively narrower than other regions of the wafer WF (e.g., trench T2). Accordingly, the dummy gates 324A and 324B may block the incident ion beams such that the first and second directional ions I1 and I2 cannot reach the bottom portion of the trench T1. Stated another way, the bottom portion of the trench T1 is shadowed by the dummy gates 324A and 324B. As an example illustrated in FIG. 9B, the first and second directional ions I1 and I2 cannot reach the protrusion portions 324A-P and 324B-P and the portion of dummy dielectric layer 322 within the trench T1. As a result, the protrusion portions 324A-P and 324B-P and the portion of dummy dielectric layer 322 within the trench T1 are free from coverage of the protection layer 330, because the incident ion beams does not reach this region to cause a deposition. In other words, the directional deposition process can also be referred to as a selective deposition process.

In some embodiments of the present disclosure, a directional deposition process is performed by applying first and second directional ions I1 and I2 that are directed to the wafer at oblique angles with respect to a perpendicular to the wafer surface. The first and second directional ions I1 and I2 can be blocked by the structures on the wafer, such that the deposition would not occur at certain regions on the wafer. Thus, a selective deposition can be achieved.

Figure 9A:
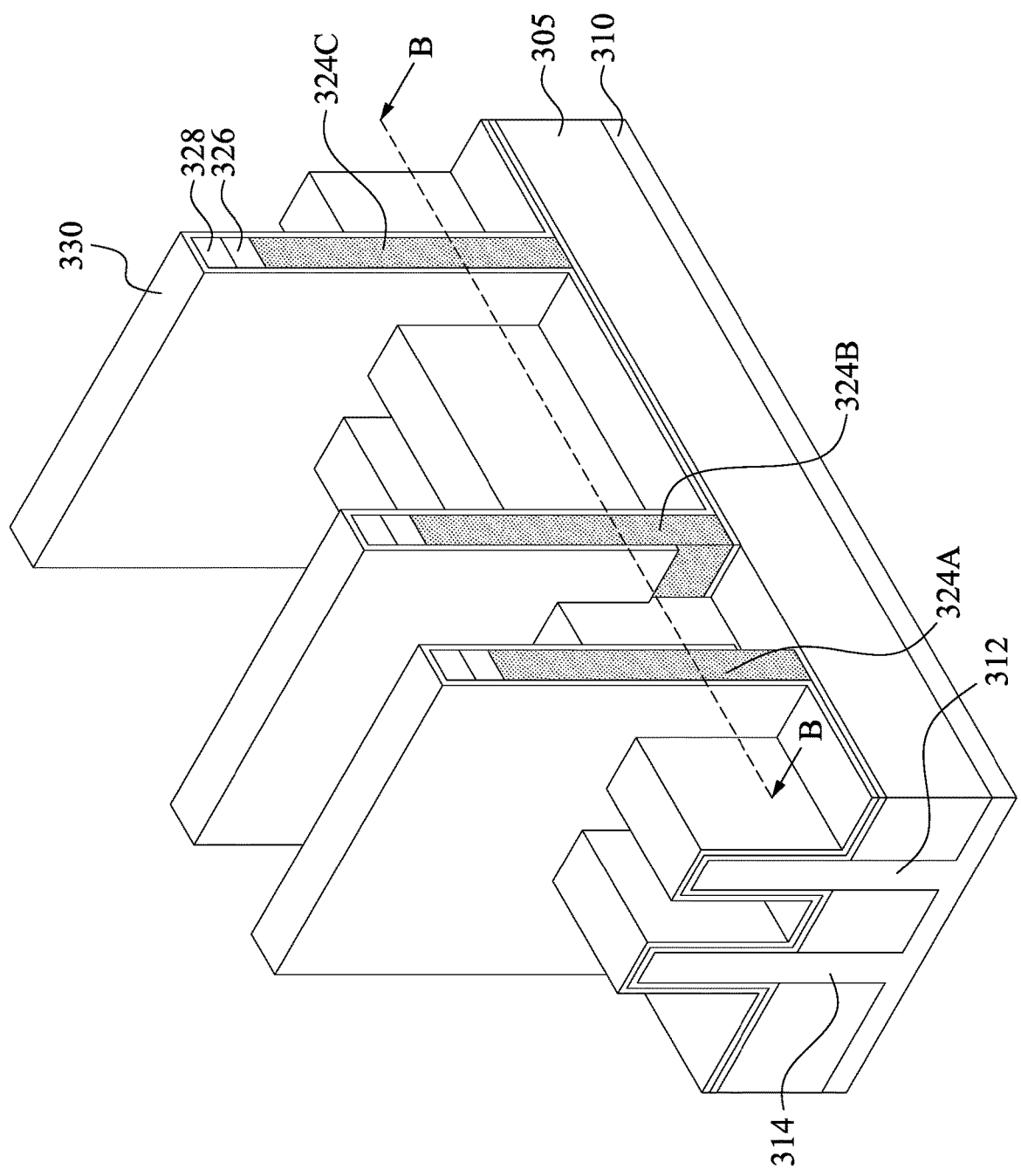
Figure 9B:
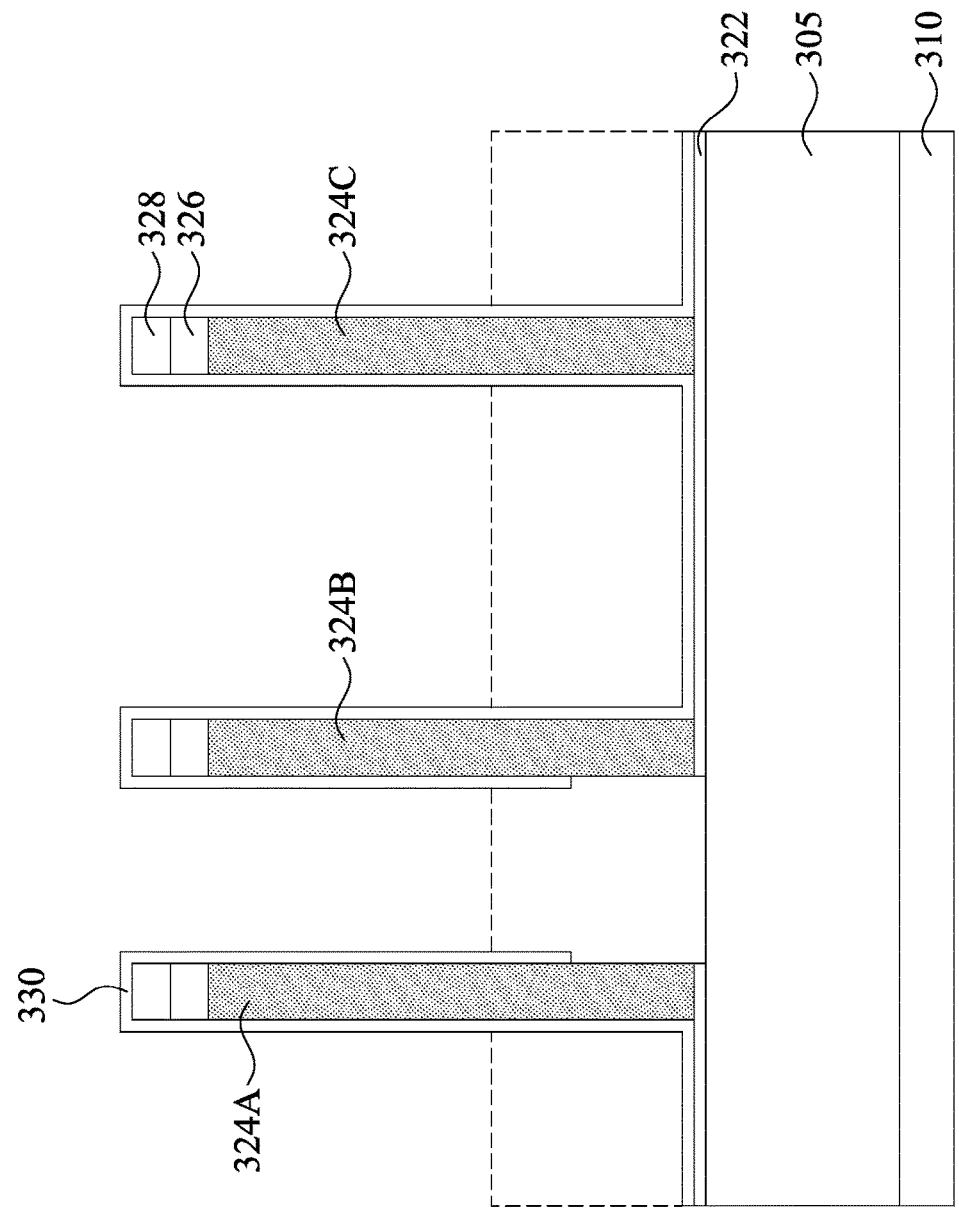

Reference is made to FIGS. 9A and 9B, in which FIG. 9B is a cross-sectional view along line B-B of FIG. 9A. An etching process is performed to remove the protrusion portions 324A-P and 324B-P of the dummy gates 324A and 324B (see FIGS. 8A and 8B). In some embodiments, the protection layer 330 has a higher resistance to the etchant of the etching process, so as to protect the underlying layer that is covered by the protection layer 330. As mentioned above, the protrusion portions 324A-P and 324B-P and the portion of dummy dielectric layer 322 within the trench T1 are free from coverage of the protection layer 330, such that the etchant of the etching process can remove the exposed protrusion portions 324A-P and 324B-P and the portion of dummy dielectric layer 322 within the trench T1. After the etching process, a portion of the isolation structure 305 is exposed by the trench T1, while other portions of the isolation structure 305 remain covered by the dummy dielectric layer 322. In some embodiments, the etching process described in FIGS. 9A and 9B is an isotropic etching process, such as wet etching.

Figure 9C:
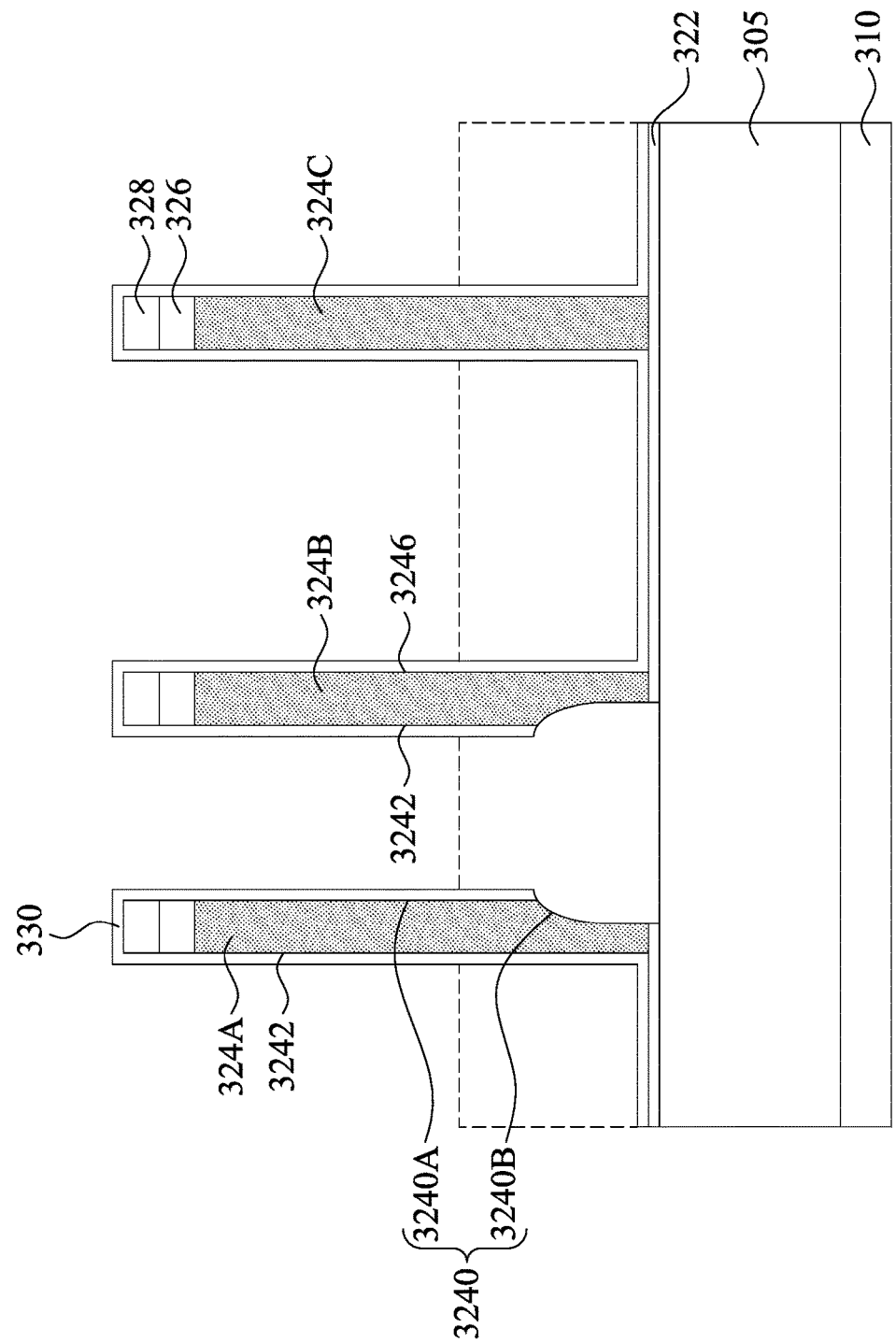

Reference is made to FIG. 9C, in which FIG. 9C has the cross-section as FIG. 9B. In some other embodiments, during etching the protrusion portions 324A-P and 324B-P (see FIGS. 8A and 8B), the dummy gates 324A and 324B may be over-etched, and the resulting structure is shown in FIG. 9C. The sidewall 3240 of the dummy gate 324A facing the dummy gate 324B has an upper portion 3240A and a lower portion 3240B. The upper portion 3240A of the sidewall 3240 is substantially straight and vertical to the substrate 310 after the etching process, because it is protected by the protection layer 330 during the etching process. However, the lower portion 3240B of the sidewall 3240 has concave surface as a result of the etching process. On the other hand, the sidewall 3242 of the dummy gate 324A facing away the dummy gate 324B is entirely straight and vertical to the substrate 310 after the etching process, because the sidewall 3242 is protected by the protection layer 330 during the etching process. Stated another way, the dummy gate 324A includes an upper portion and a lower portion below the upper portion, in which the minimum width of the upper portion is greater than the width of the lower portion. Accordingly, the sidewalls 3240 and 3242 of the dummy gate 324A have asymmetric profiles. Similarly, the dummy gate 324B has a sidewall 3244 facing the dummy gate 324A and a sidewall 3246 facing away the dummy gate 324A. The sidewall 3244 and the sidewall 3246 of the dummy gate 324B have similar characteristics to the sidewall 3240 and the sidewall 3242 of the dummy gate 324A, and thus relevant structural details will not repeated hereinafter. The opposite sidewalls of the dummy gate 324C have substantially symmetric profiles.

In some embodiments, because the protrusion portions 324A-P and 324B-P are formed in a dense region of the wafer WF, the distance between the protrusion portions 324A-P and 324B-P may be too close to cause short issue in the following process(es). Thus, a directional deposition process is performed to form a protection layer selectively covering some regions of the wafer WF while exposing the protrusion portions 324A-P and 324B-P, and thus an etching process can be performed to selectively remove the unwanted protrusion portions 324A-P and 324B-P while keeps other regions of the wafer WF substantially intact.

Figure 10:
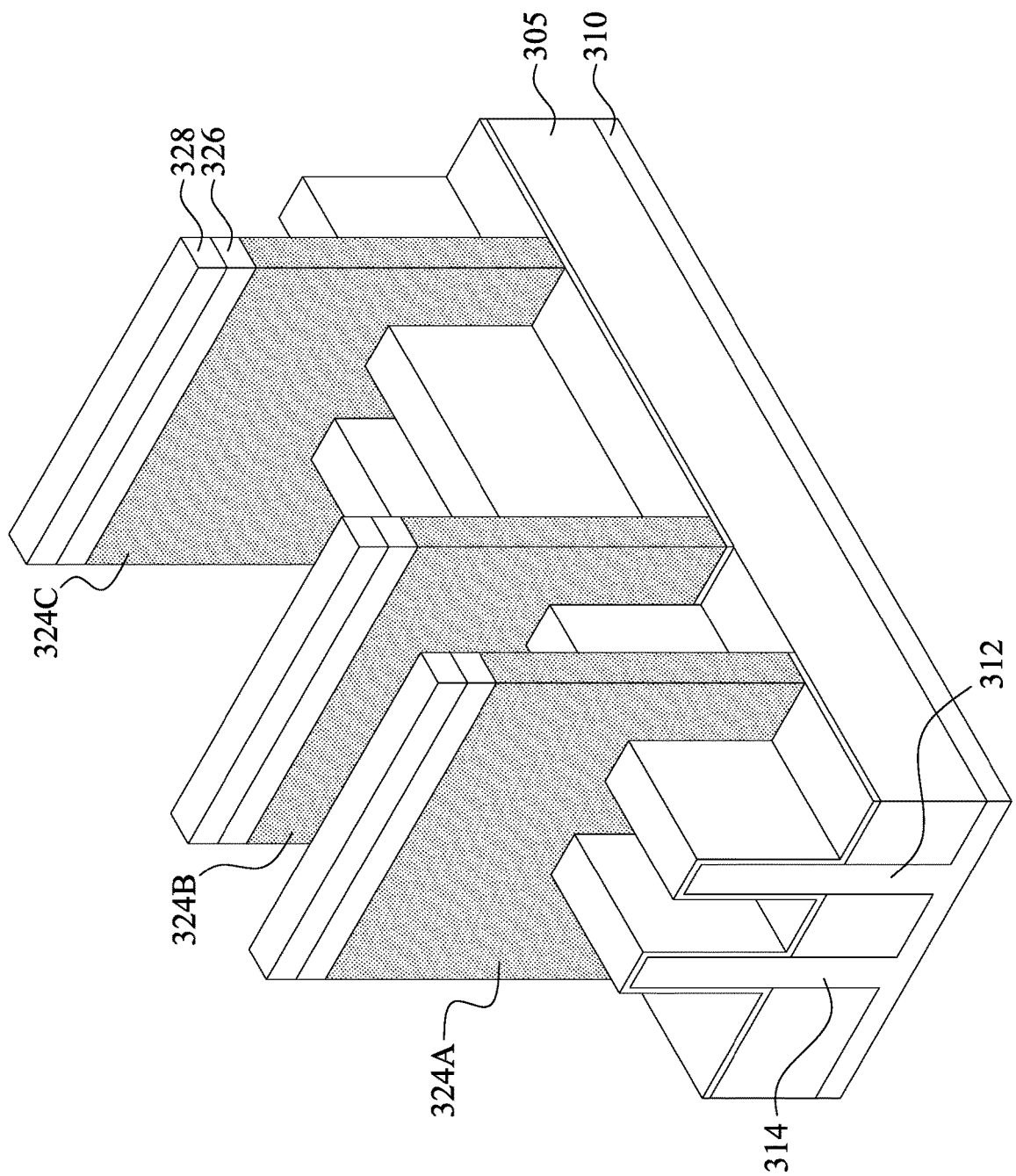

Reference is made to FIG. 10. The protection layer 330 is removed to expose the dummy gates 324A to 324C and the dummy dielectric layer 322. In some embodiments, the protection layer 330 can be removed by suitable process(es), such as dry etching, wet etching, or combinations thereof. In some embodiments, a hydrofluoric acid (dilute HF) solution is used during the process of removing the protection layer 330. The above etchant used to remove the protection layer 330 is given for illustrative purposes. Various etchants used to remove the protection layer 170 are within the contemplated scope of the present disclosure.

Figure 11:
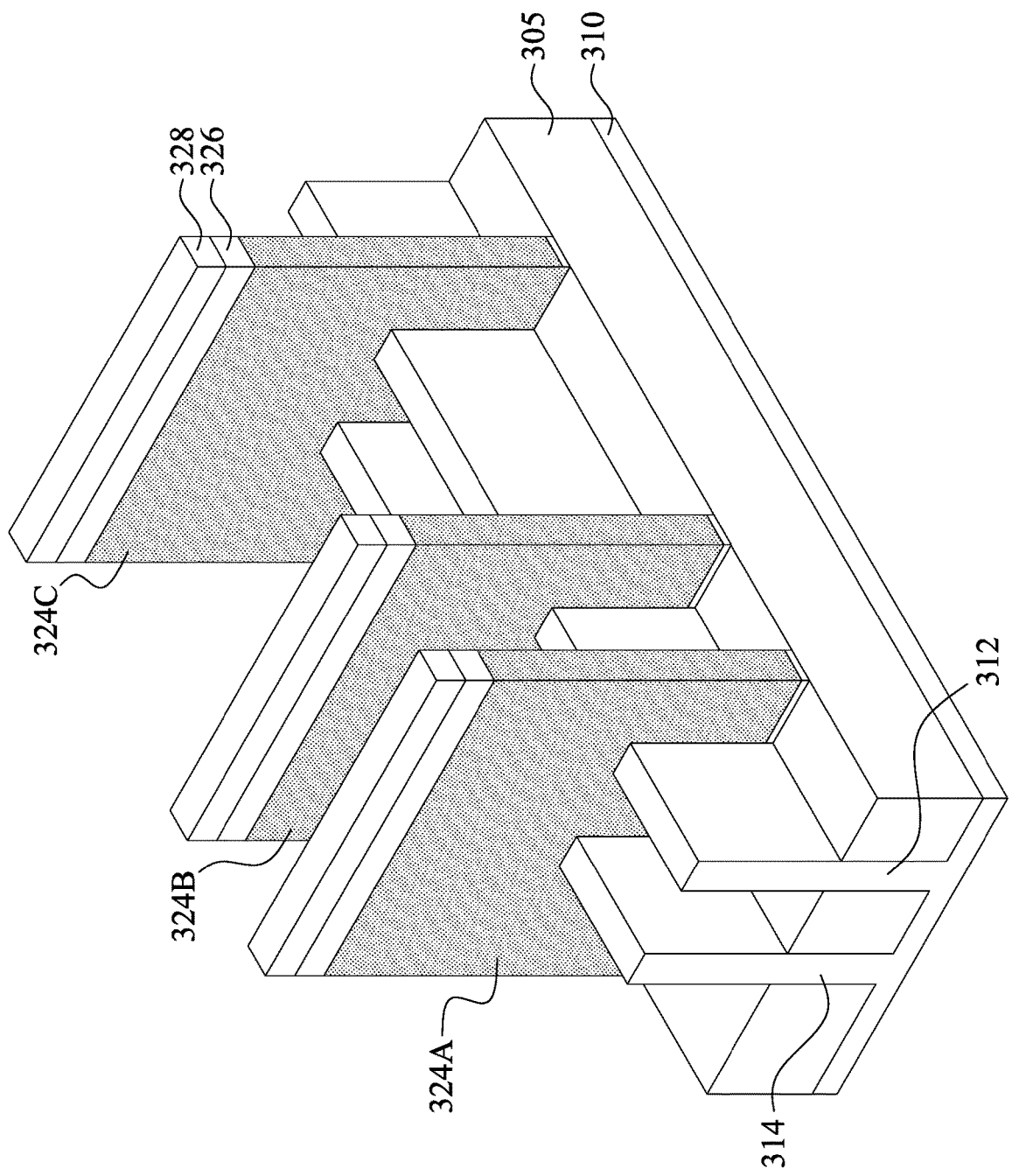

Reference is made to FIG. 11. Portions of the dummy dielectric layer 322 uncovered by the dummy gates 324A to 324C are removed to expose the semiconductor fins 312 and 314. The dummy dielectric layer 322 can be removed by suitable process(es), such as a dry etching process, a wet etching process, a multiple-step etch process, or combinations thereof.

Figure 12:
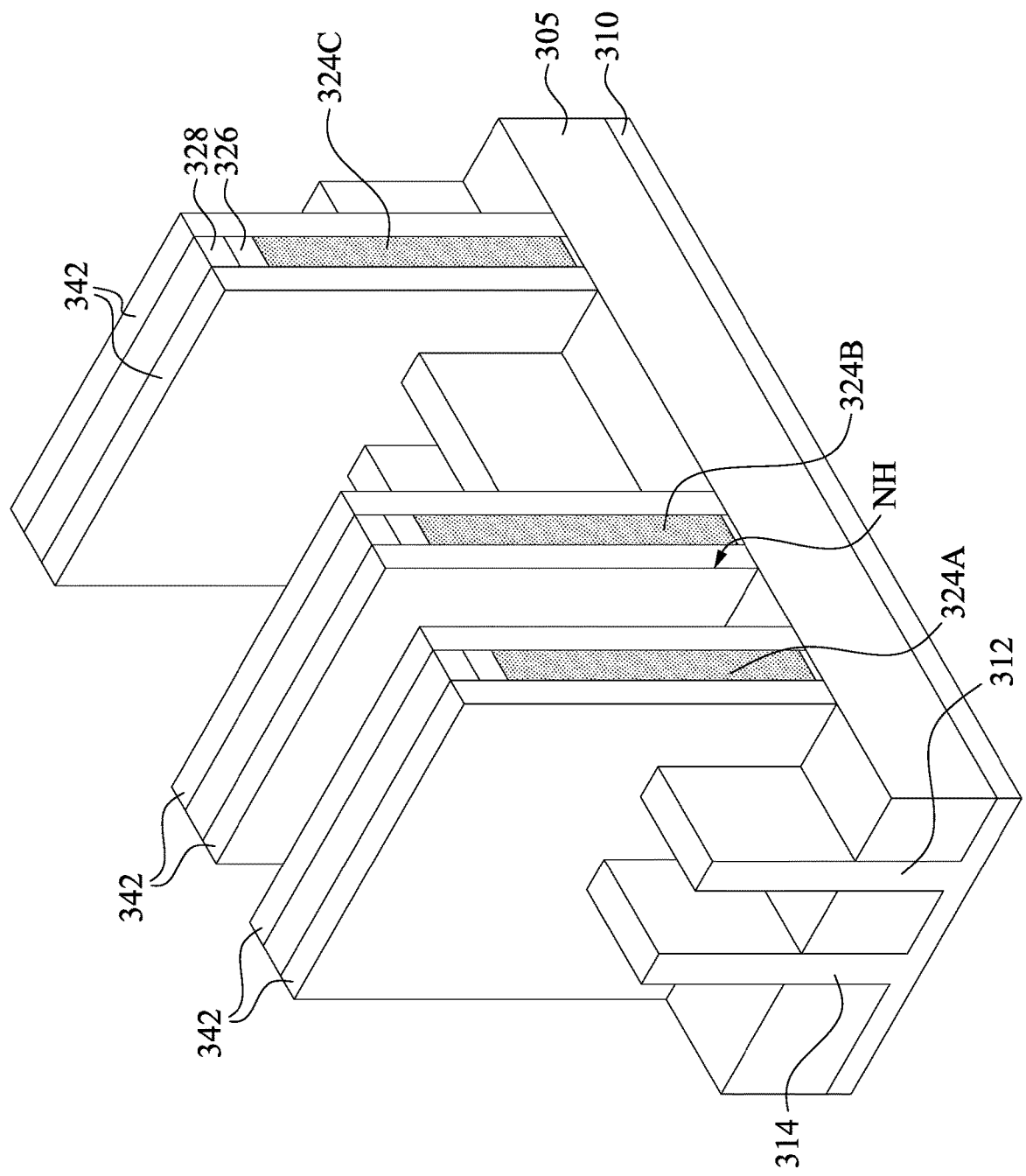

Reference is made to FIG. 12. A plurality of gate spacers 342 are formed on opposite sidewalls of the dummy gates 324A-324C. The gate spacers 342 may include a dielectric material such as $SiO_2$, $Si_3N_4$, $SiO_xN_y$, SiC, SiCN films, SiOC, SiOCN films, and/or combinations thereof. In some embodiments, the gate spacers 342 include multiple layers, such as main spacer walls, liner layers, and the like. In some embodiments, the gate spacers 342 may be formed by, for example, depositing a spacer layer blanket over the substrate 310, and followed by an etching process to remove horizontal portions of the spacer layer, and portions of the spacer layer remaining on the sidewalls of the dummy gates 324A-324C are referred to as gate spacers 342. In some embodiments, the gate spacers 342 may be formed by CVD process, a SACVD process, a flowable CVD process, an ALD process, a PVD process, or other suitable process.

Figure 13:
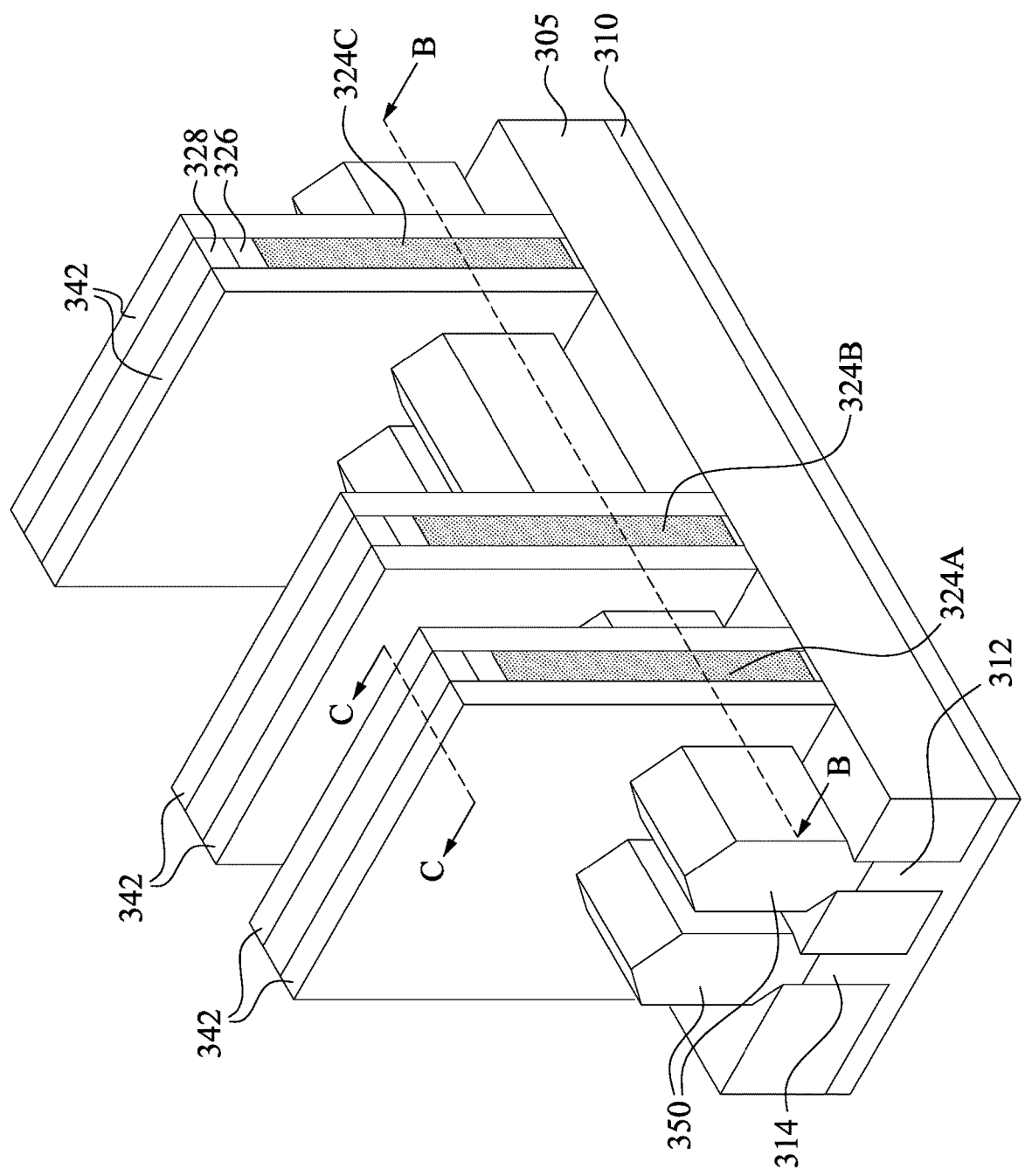

Reference is made to FIG. 13. A plurality of source/drain structures 350 are formed over the substrate 310. For example, the semiconductor fins 312 and 314 are partially removed by suitable process, such as etching. Afterwards, a plurality of source/drain structures 350 are formed respectively over the remaining semiconductor fins 312 and 314. The source/drain structures 350 may be formed by performing an epitaxial growth process that provides an epitaxy material over the semiconductor fins 312 and 314. In various embodiments, the source/drain structures 350 may include Ge, Si, GaAs, AlGaAs, SiGe, GaAsP, SiP, or other suitable material.

Figure 14A:
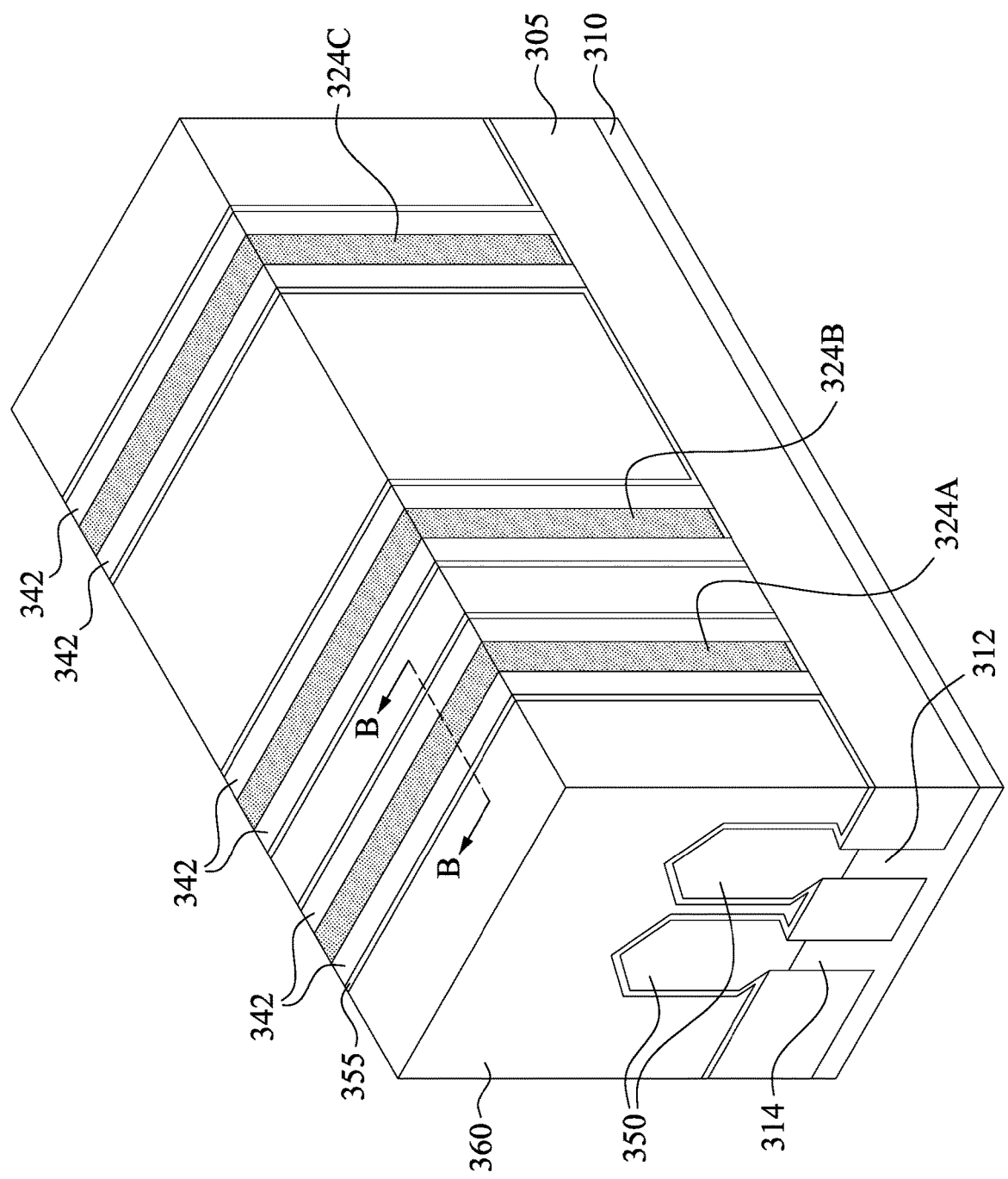
Figure 14B:
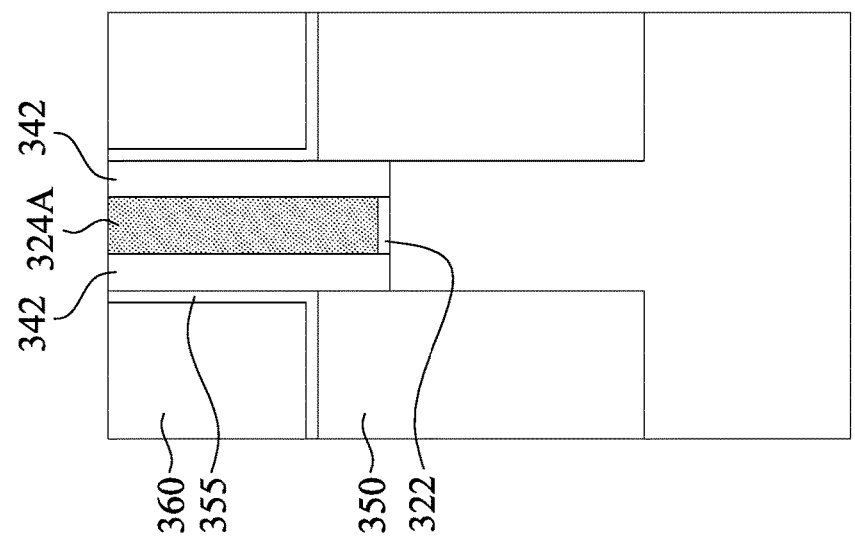

Reference is made to FIGS. 14A and 14B, in which FIG. 14B is a cross-sectional view along line B-B of FIG. 14A. A contact etch stop layer (CESL) 355 and an interlayer dielectric (ILD) layer 360 are formed. For example, the contact etch stop layer (CESL) 355 is blanket formed on the structure shown in FIG. 13, and then, the interlayer dielectric (ILD) layer 360 is formed on the CESL 355. Afterwards, a CMP process may be optionally performed to remove excessive materials of the ILD layer 360 and the CESL 355 to expose the dummy gates 324A to 324C. The CMP process may planarize a top surface of the ILD layer 360 with top surfaces of the dummy gate 324A to 324C, gate spacers 342, and the CESL 355 in some embodiments. The CESL 355 may be a dielectric layer including silicon nitride, silicon oxynitride or other suitable materials. The CESL 355 can be formed using, for example, plasma enhanced CVD, low pressure CVD, ALD or other suitable techniques. The ILD layer 360 may include a material different from the CESL 355. In some embodiments, the ILD layer 360 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 360 may be formed using, for example, CVD, ALD, spin-on-glass (SOG) or other suitable techniques.

Figure 15:
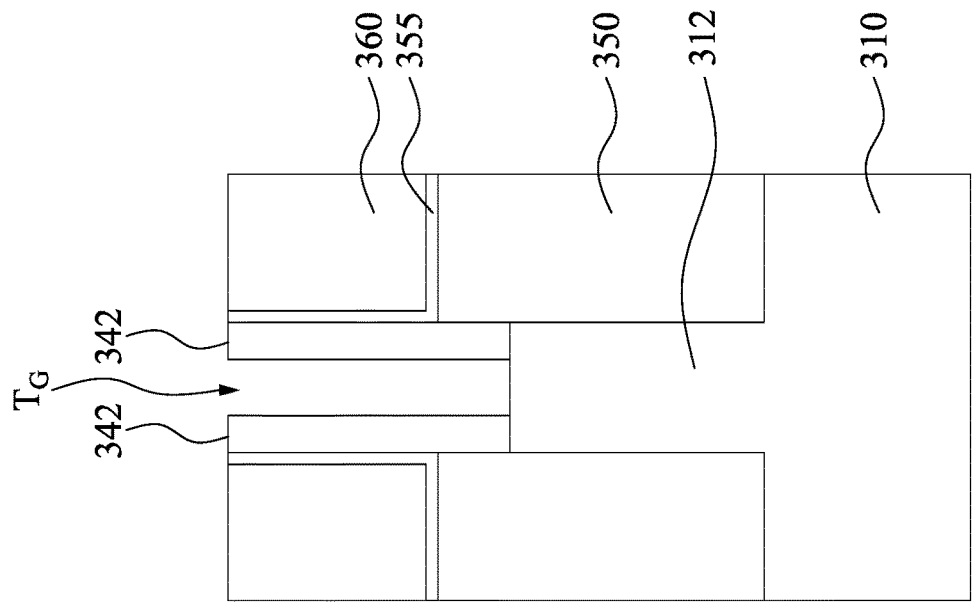

Reference is made to FIG. 15, in which FIG. 15 has the same cross-sectional position as FIG. 14B. The dummy dielectric layer 322 and the dummy gates 324A, 324B, and 324C are removed, such that a gate trench $T_G$ is formed between a pair of the gate spacers 342. In some embodiments, the dummy dielectric layer 322 and the dummy gates 324A, 324B, and 324C may be removed by suitable process, such as dry etch, wet etch, or combination thereof.

Figure 16:
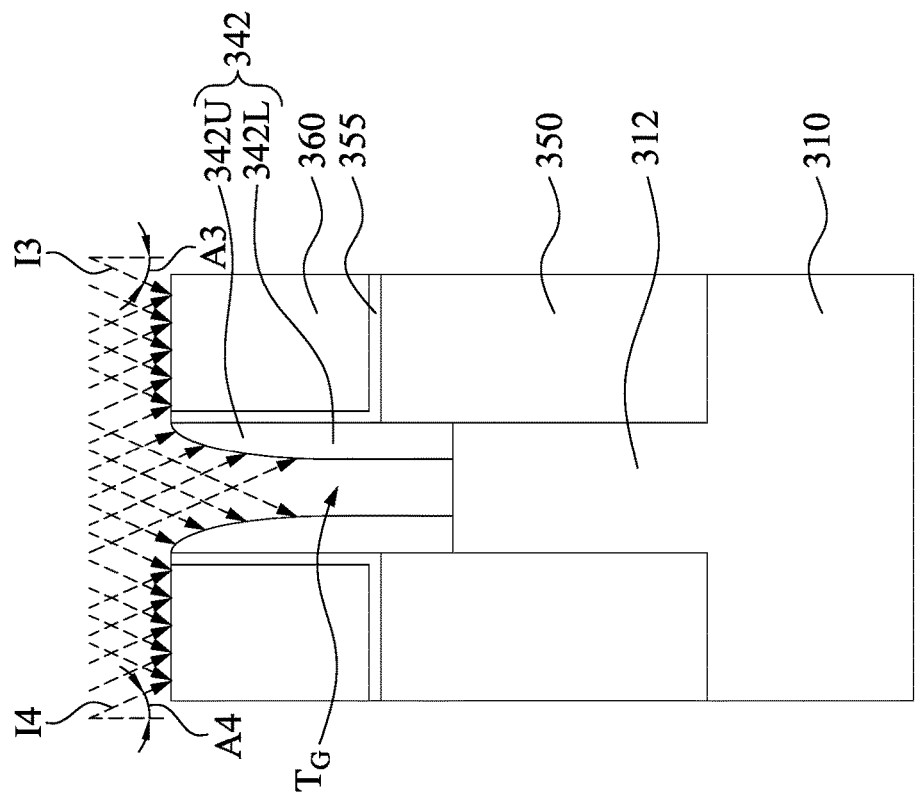

Reference is made to FIG. 16. A directional etching process is performed to round the corners of the gate spacers 342. The directional etching process can be performed using, for example, the fabrication apparatuses 100 and 200 as discussed in FIGS. 31 and 33-36B. The arrows with dashed lines in FIG. 16 indicate the direction that the ion beams are incident on the wafer WF. In greater detail, the directional ions are directed to the wafer WF at oblique angles with respect to a perpendicular to the wafer surface. In some embodiments, the ion beams can be directed to the upper portions 342U of the gate spacers 342, so as to partially remove the material of the upper portions 342U of the gate spacers 342, which in turn will round the corners of the upper portions 342U of the gate spacer 342. On the other hand, as illustrated in FIG. 16, the upper portions 342U of the gate spacers 342 also block the ion beams such that the ion beams cannot reach the lower portions 342L of the gate spacers 342, so the etching process would not remove the material of the lower portions 342L of the gate spacers 342. Stated another way, the lower portions 342L of the gate spacers 342 are shadowed by the upper portions 342U of the gate spacers 342 to prevent from being etched.

After the etching process, the gate spacers 342 have rounded top corners. Also, the gate trench $T_G$ is enlarged as a result of the etching process. However, because the etching process is performed to partially remove the upper portions 342U of the gate spacers 342 while keeps the lower portion 342L of the gate spacers 342 substantially intact, the top of the gate trench $T_G$ has a width greater than a width of the bottom of the gate trench $T_G$. The upper portion 342U is thinner than the lower portion 342L. Stated another way, the gate trench $T_G$ tapers toward the semiconductor fin 312. Moreover, a sidewall of the gate spacer 342 facing the trench $T_G$ is convex. In some embodiments, the top portion 342U has a curved sidewall in contact with the gate structure formed in later step (e.g., gate structure 370 in FIG. 19), and has a straight sidewall opposite to the curved sidewall.

In some embodiments of the present disclosure, a directional etching process may be used to partially remove the gate spacers, so as to enlarge a width of the gate trench between the gate spacers, which will improve the gap filling in the following operations.

Figure 37:
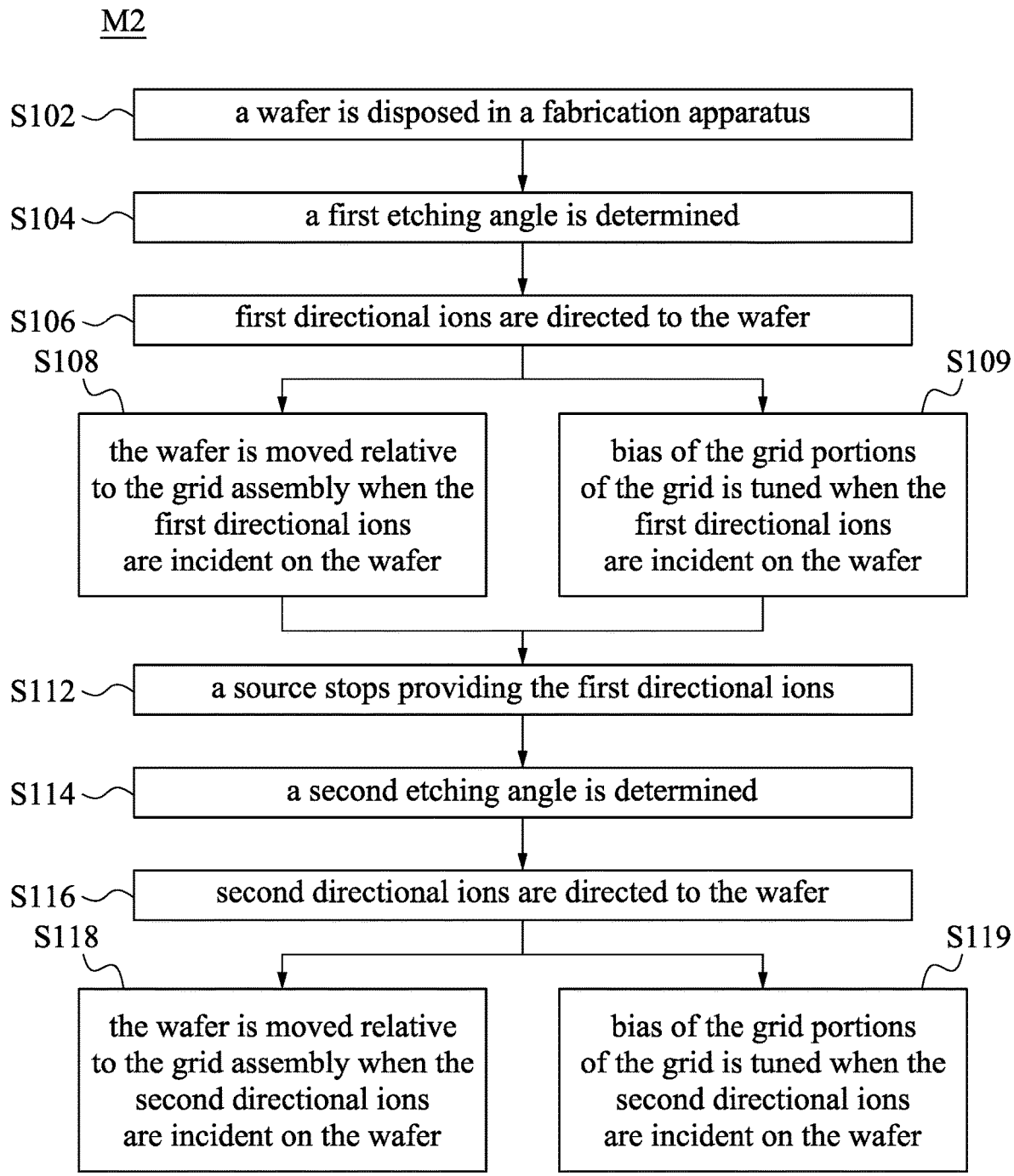
FIG. 37 is a flow chart of a method illustrating the operations of the fabrication apparatus in FIG. 31 in accordance with some embodiments of the present disclosure.

FIG. 37 is a flow chart of a method M2 of a directional etching process in accordance with some embodiments of the present disclosure. Reference is made to FIGS. 16, 31, and 37. The method M2 proceeds to block S102 where a wafer is disposed in the fabrication apparatus. The method M2 proceeds to block S104 where a first etching angle is determined. The first etching angle A3 is shown in FIG. 16. Further, the first etching angle A3 is determined by the aspect ratio of the gate trench $T_G$. If the first etching angle A3 is too large, the directional ions may not etch the gate spacers 342 to a desired profile; if the first etching angle A3 is too small, the directional ions may cause the bottom portion of the gate trench $T_G$ being etched. The method M2 proceeds to block S106 where first directional ions are directed to the wafer WF. The first directional ions 13 are shown in FIG. 16. In some embodiments, the method M2 proceeds to block S108 where the wafer is moved relative to the grid assembly when the first directional ions are incident on the wafer. In some other embodiments, the method M2 proceeds to block S109 where bias of the grid portions of the grid is tuned when the first directional ions are incident on the wafer. Since the details of blocks S102, S104, S106, S108, and S109 are described in the method M1, the detailed descriptions thereof are not repeated herein.

The method M2 proceeds to block S112 where the source stops providing the first directional ions. In some embodiments, when the first directional ions 13 etch the gate spacer 342 on the left side in FIG. 16, the source 120 stops the deposition process, and there is no ions generated from the source 120.

The method M2 proceeds to block S114 where a second etching angle A4 is determined. In some embodiments, the first etching angle A3 and the second etching angle A4 has the same value but with opposite directions. That is, A4 is substantially equals to −A3. In some embodiments, as shown in FIG. 33, the wafer WF can be tilted again, such that the normal line N and the following formed second etching ions 14 form the second deposition angle A4. In some other embodiments, as shown in FIG. 34, the wafer WF can be rotate along the Z-axial direction about 180 degrees, such that the normal line N and the following formed second directional ions 14 form the second deposition angle A4.

The method M2 proceeds to block S116 where second directional ions are directed to the wafer. The second directional ions 14 are shown in FIG. 16. In some embodiments, the method M2 proceeds to block S118 where the wafer is moved relative to the grid assembly when the second directional ions are incident on the wafer. In some other embodiments, the method M3 proceeds to block S119 where bias of the grid portions of the grid is tuned when the second directional ions are incident on the wafer. Since the details of blocks S118 and S119 are similar to those described in blocks S108 and 109 of method M1, the detailed descriptions thereof are not repeated herein.

Figure 17:
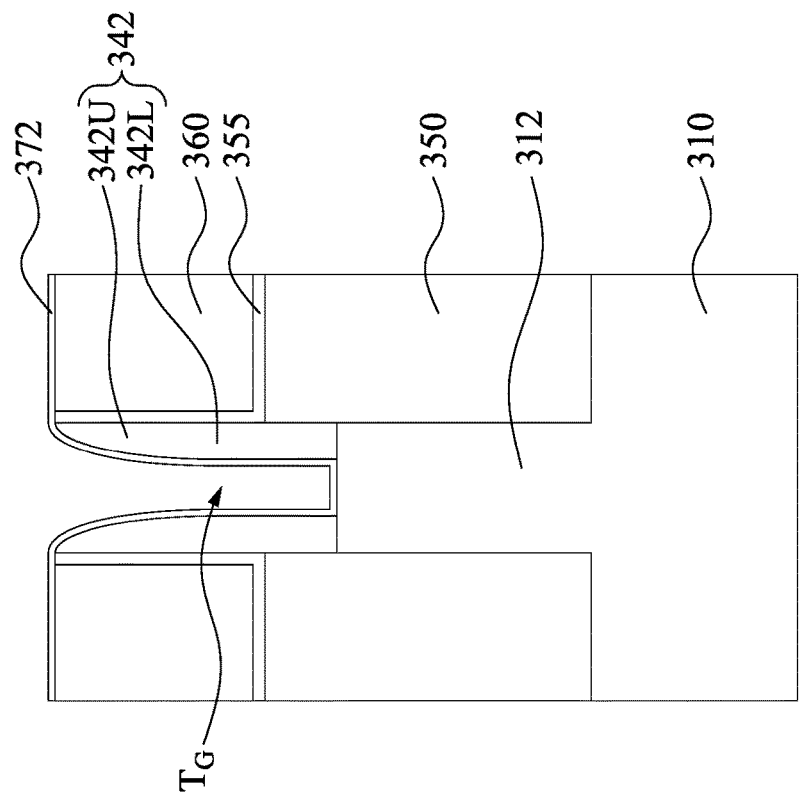

Reference is made to FIG. 17. A gate dielectric layer 372 is formed in the gate trench TG and over the ILD layer 360. The gate dielectric layer 372 may include high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

Figure 18:
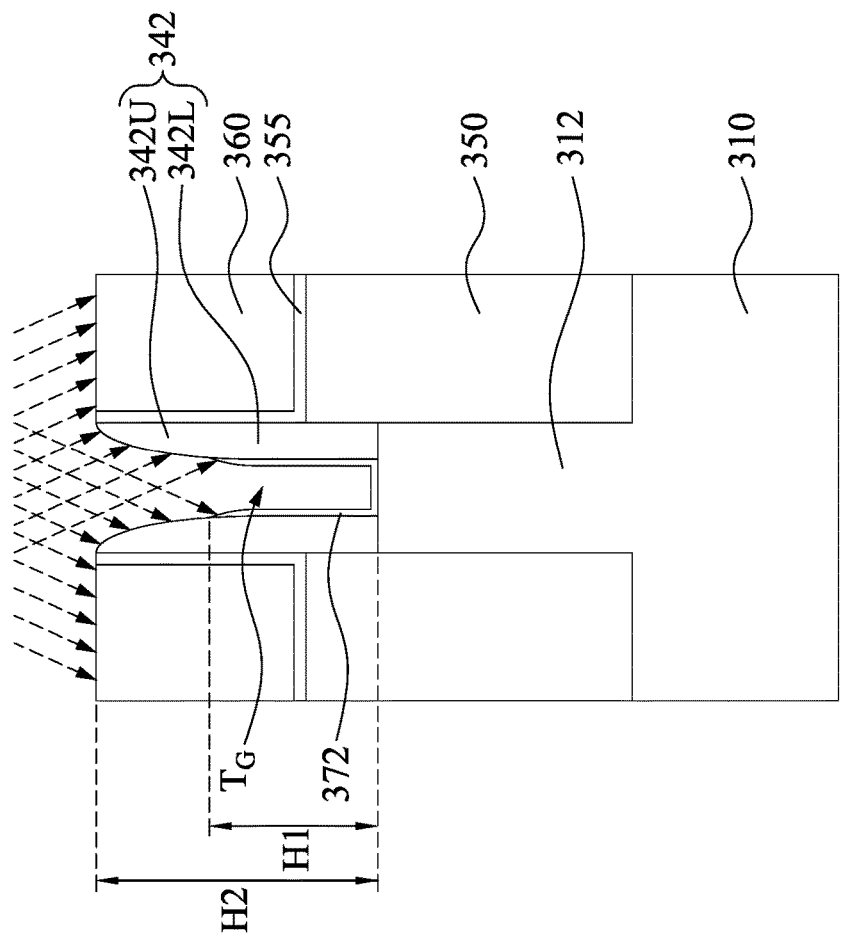

Reference is made to FIG. 18. A directional etching process is performed to etch back the gate dielectric layer 372. The directional etching process may be performed using, for example, the fabrication apparatuses 100 and 200 as discussed in FIGS. 31 and 33-36B with the method M2 in FIG. 37. The arrows with dashed lines in FIG. 18 indicate the direction that the ion beams are incident on the wafer WF. In greater detail, the directional ions are directed to the wafer WF at oblique angles with respect to a perpendicular to the wafer surface. In some embodiments, the ion beams can be directed to the upper portion of the dielectric layer 372 (see FIG. 17), so as to remove the upper portion of the dielectric layer 372 to expose the upper portions 342U of the gate spacers 342 and the ILD layer 360. On the other hand, as illustrated in FIG. 18, the upper portions 342U of the gate spacers 342 also block the ion beams such that the ion beams cannot reach the lower portion of the gate dielectric layer 372, so the etching process would not remove the material of the lower portion of the gate dielectric layer 372. Stated another way, the lower portion of the gate dielectric layer 372 are shadowed by the upper portions 342U of the gate spacers 342 to prevent from being etched. In FIG. 18, the gate dielectric layer 372 has a height lower than that of the gate spacers 342. Further, a top portion of the gate dielectric layer 372 tapers away from the substrate. In some embodiments, the gate dielectric layer 372 has a height H1, and a portion of the gate spacer 342 above the semiconductor fin 312 has a height H2, where H1/H2 is greater than about 0.5 and less than 1. If H1/H2 is less than about 0.5, then the source/drain structures 350 and the following formed gate may have a short problem.

In some embodiments of the present disclosure, a directional etching process may be used to etch back the gate dielectric layer without additional mask, which will reduce the process time and further reduce costs.

Figure 19:
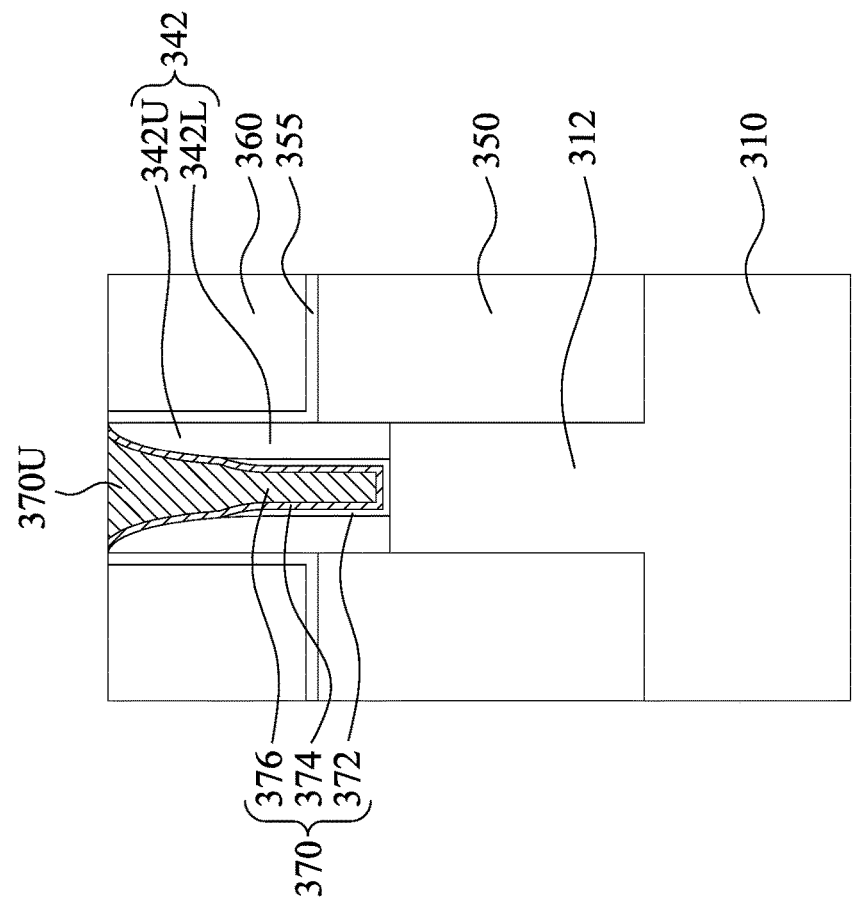

Reference is made to FIG. 19. A work function metal layer 374 and a filling metal 376 are formed in the gate trench TG (see FIG. 18). The work function metal layer 374 and the filling metal 376 may be formed by depositing a work function material and a gate electrode layer in the gate trench TG and over the ILD layer 360, and followed by a CMP process to remove excessive work function material and gate electrode layer until the ILD layer 360 is exposed. The gate dielectric layer 372, the work function metal layer 374, and the filling metal 376 can be collectively referred as gate structure 370. Since the gate dielectric layer 372 is partially removed, the following formed work function metal layer 374 is in contact with the gate dielectric layer 372 and the upper portion 342U of the gate spacers 342. Further, the work function metal layer 374 covers a top portion of the gate dielectric layer 372.

As discussed above with respect to FIG. 16. Because the gate trench TG is enlarged by the directional etching process, the gate structure 370 has a tapered profile as a result of the enlargement of the gate trench TG. On the other hand, the widest width of the filling metal 376 (e.g., portion 370U in FIG. 19) is wider than a widest width of the gate dielectric 372 along the lengthwise direction of the semiconductor fin 312. The gate structure 370 is in contact with the curved sidewalls of the upper portion 342U of the gate spacer 342. The work function metal layer 374 is closer to the straight sidewall of the gate spacer 342 than the gate dielectric 372.

The work function metal layer 374 may be an n-type or p-type work function layers. Exemplary p-type work function metals include TiN, TaN, Ru, Mo, Al, WN, $ZrSi_2$, $MoSi_2$, $TaSi_2$, $NiSi_2$, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. In some embodiments, the filling metal 376 may include tungsten (W). In some other embodiments, the filling metal 376 includes aluminum (Al), copper (Cu) or other suitable conductive material.

Figure 20:
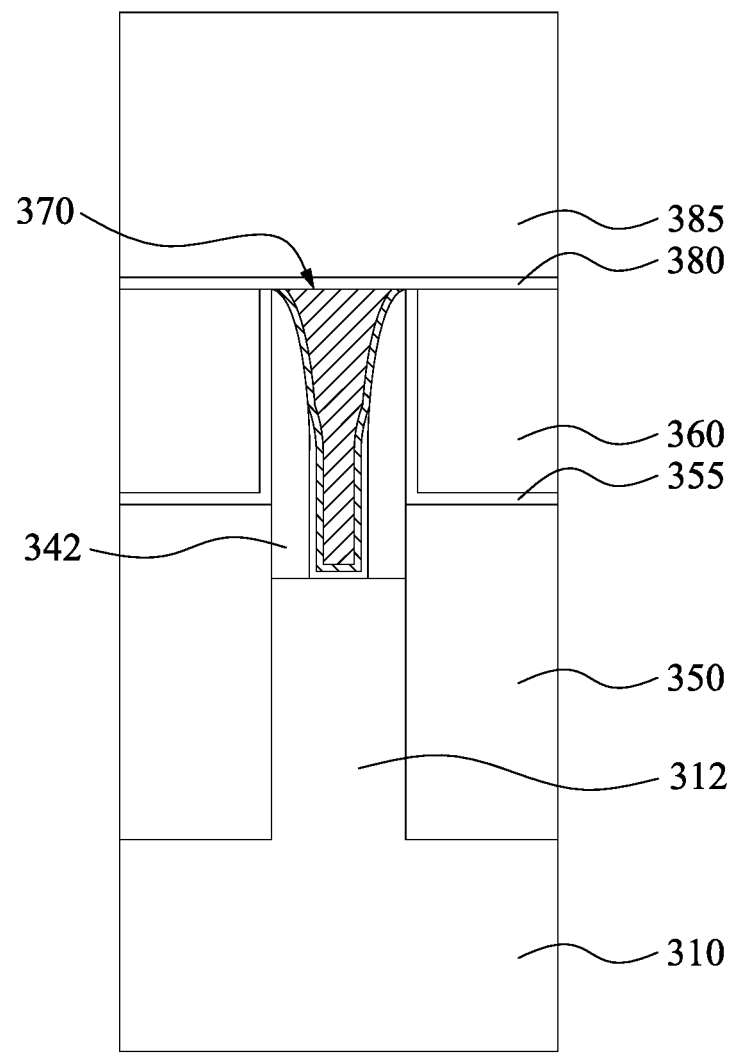

Reference is made to FIG. 20. An etching stop layer (ESL) 380 and an interlayer dielectric layer (ILD) layer 385 are deposited over the ILD layer 360. The ESL 380 can be formed using, for example, plasma enhanced CVD, low pressure CVD, ALD or other suitable techniques. The ILD layer 385 may include a material different from the CESL 380. The ILD layer 385 may be formed using, for example, CVD, ALD, spin-on-glass (SOG) or other suitable techniques. In some embodiments, the ESL 380 and the ILD layer 385 are similar to the CESL 355 and ILD layer 360, respectively. Thus, relevant structural details will not be repeated hereinafter. The ESL 380 is in contact with the filling metal 376, the work function metal layer 374, and the gate spacers 342 but separated from the gate dielectric layer 372.

Figure 21:
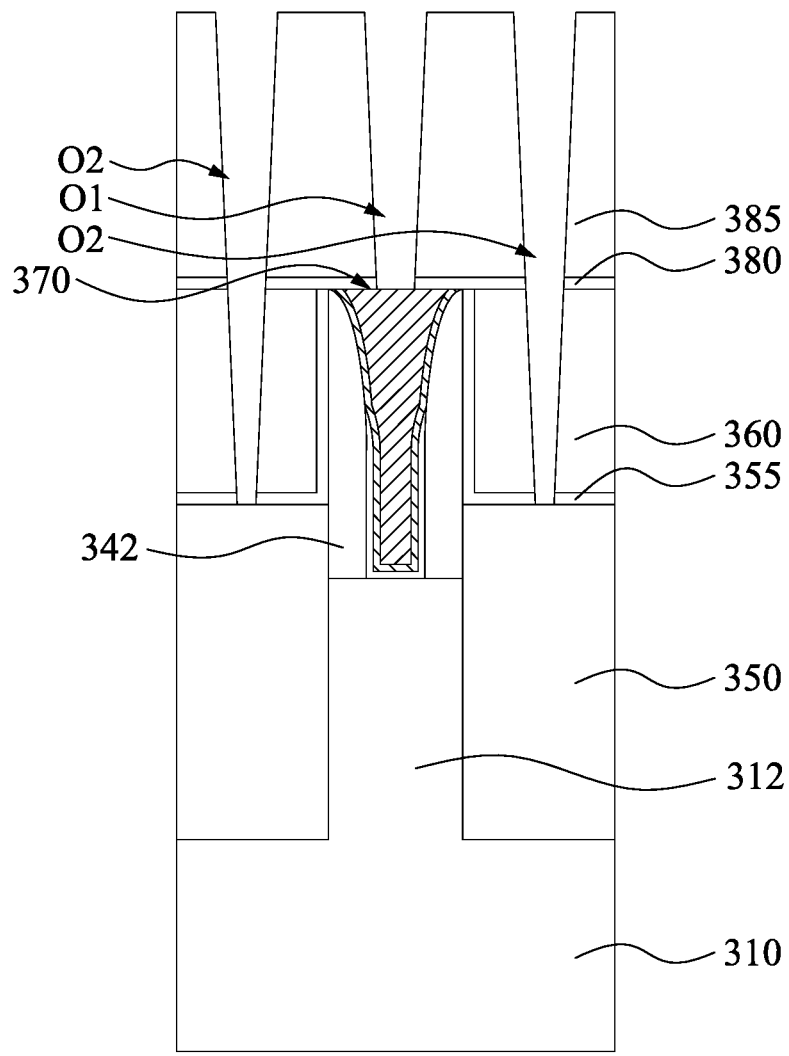

Reference is made to FIG. 21. The ILD layer 385, the ESL 380, the ILD layer 360, and the CESL 355 are etched to form openings O1 and O2. The opening O1 exposes the gate structure 370, and the openings O2 expose the source/drain structures 350, respectively. The openings O1 and O2 may be formed simultaneously in a same process, or in separate processes. The openings may be formed using acceptable photolithography and etching techniques.

Figure 22:
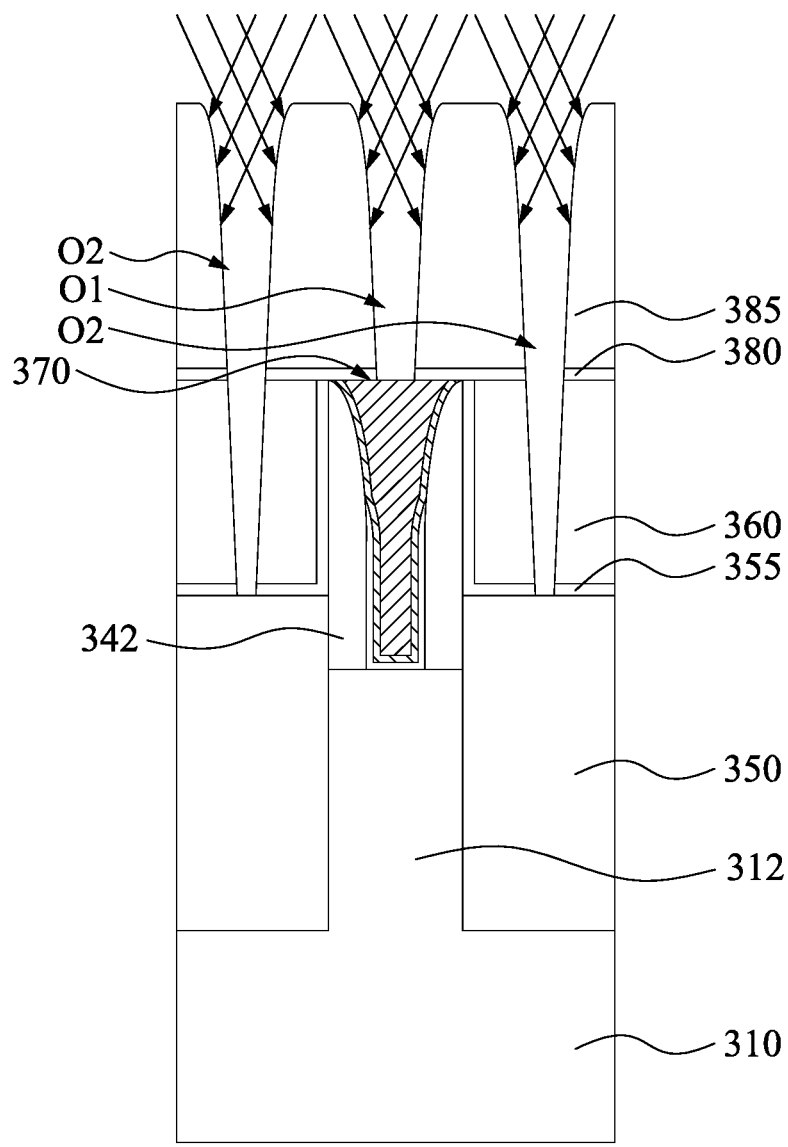

Reference is made to FIG. 22. A directional etching process is performed to round the corners of the ILD layer 385 to enlarge the openings O1 and O2. The directional etching process can be performed using, for example, the fabrication apparatuses 100 and 200 as discussed in FIGS. 31 and 33-37. The arrows with dashed lines in FIG. 22 indicate the direction that the ion beams are incident on the wafer WF. In greater detail, the directional ions are directed to the wafer WF at oblique angles with respect to a perpendicular to the wafer surface. In some embodiments, the ion beams can be directed to the upper portions of the ILD layer 385, so as to partially remove the material of the upper portions ILD layer 385, which in turn will round the corners of the upper portions ILD layer 385. On the other hand, as illustrated in FIG. 22, the upper portions ILD layer 385 also block the ion beams such that the ion beams cannot reach the lower portions ILD layer 385, so the etching process would not remove the material of the lower portions ILD layer 385. Stated another way, the lower portions of the ILD layer 385 are shadowed by the upper portions ILD layer 385 to prevent from being etched. After the etching process, the ILD layer 385 has rounded top corners. Accordingly, the openings O1 and O2 are enlarged as a result of the etching process, which will improve the gap filling in the following steps.

Figure 23:
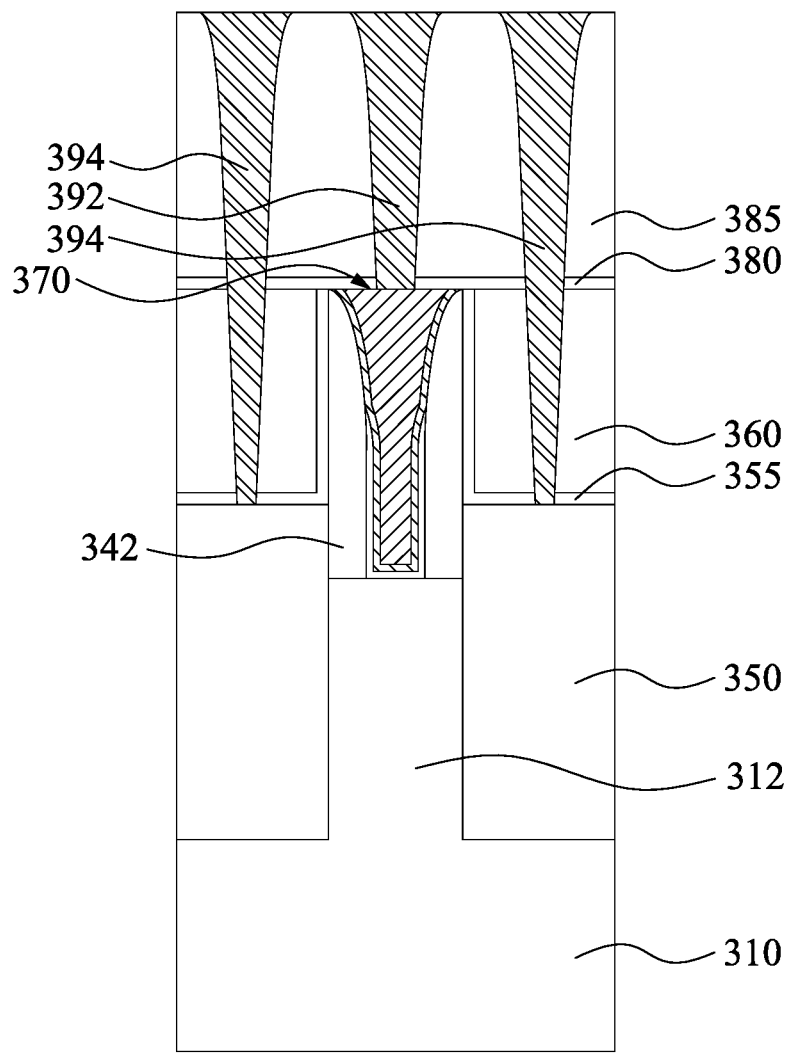

Reference is made to FIG. 23. Contacts 392 and 394 are formed respectively in the openings O1 and O2 (see FIG.

22). In some embodiments, each of the contacts 392 and 394 may include a liner and a conductive material. For example, the liner (such as a diffusion barrier layer, an adhesion layer, or the like) and the conductive material are formed in the openings O1 and O2. In some embodiments, the liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of ILD layer 385. The remaining liner and conductive material form contacts 392 and 394 in the openings O1 and O2, respectively. An anneal process may be performed to form a silicide at the interface between the source/drain structures 350 and the contacts 394, respectively. Contacts 394 are physically and electrically coupled to the source/drain structures 350, and contact 392 is physically and electrically coupled to gate structure 370. In FIG. 23, each of the contacts 392 and 394 includes a top portion that having a curved (concave) sidewall.

Figure 24:
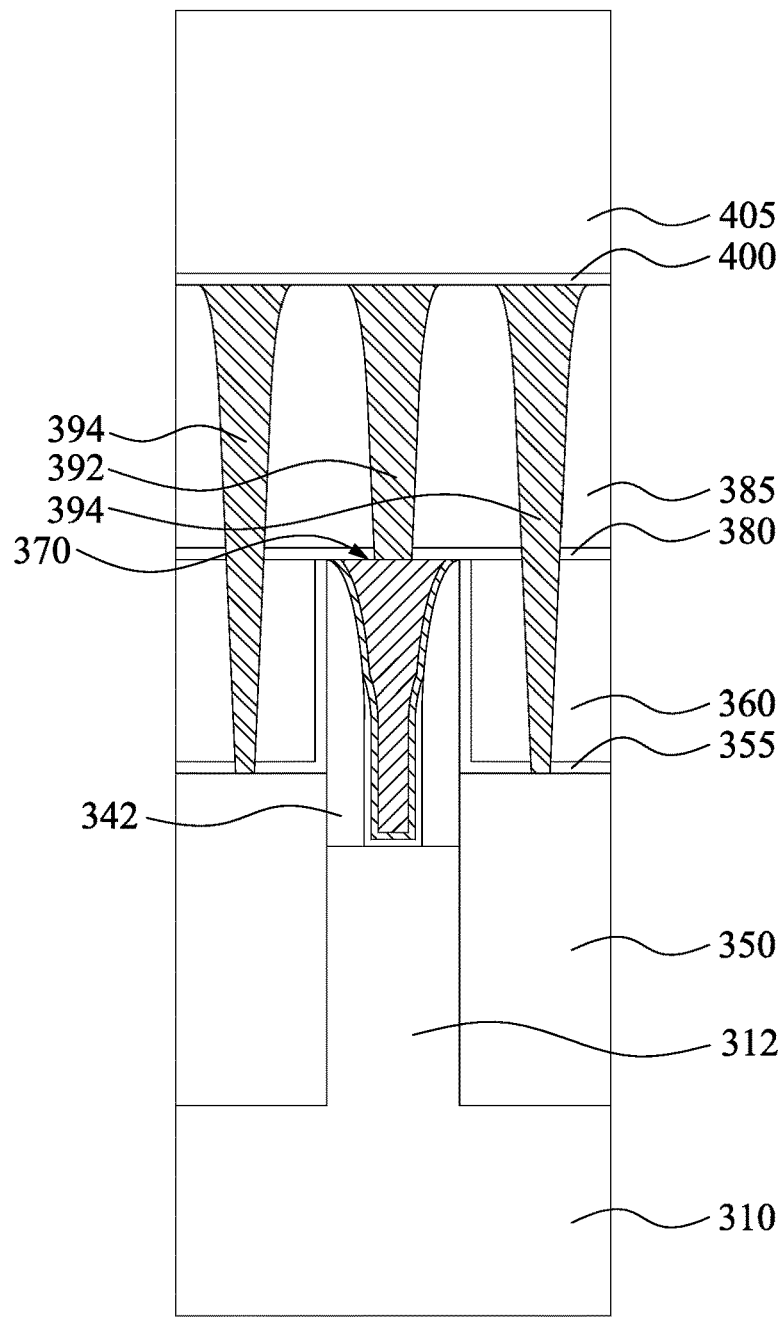

Reference is made to FIG. 24. An etching stop layer (ESL) 400 and an interlayer dielectric layer (ILD) layer 405 are deposited over the ILD layer 385. In some embodiments, the ESL 400 and the ILD layer 405 are similar to the CESL 355 and ILD layer 360, respectively. Thus, relevant structural details will not be repeated hereinafter.

Figure 25:
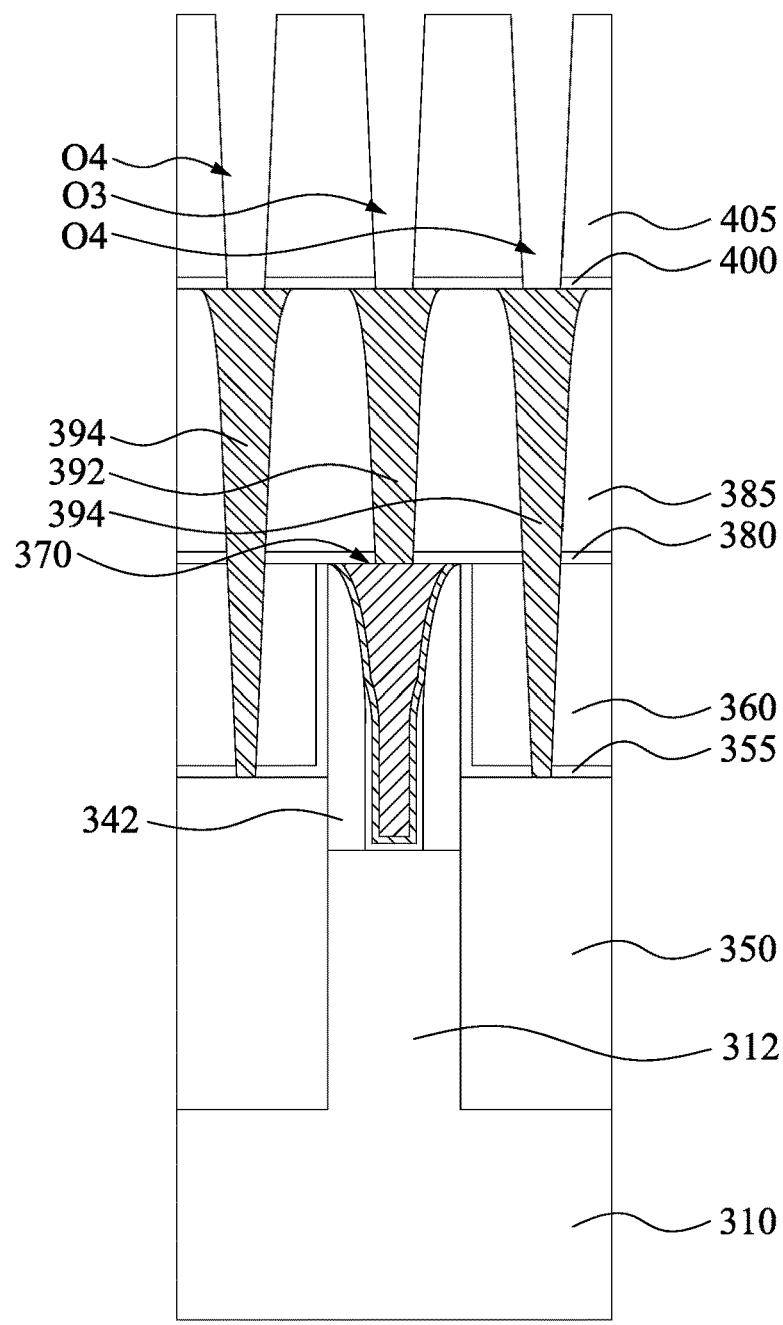

Reference is made to FIG. 25. The ILD layer 405 and the ESL 400 are etched to form openings O3 and O4. The opening O3 exposes the contact 392, and the openings O4 expose the contacts 394, respectively. The openings O3 and O4 may be formed using acceptable photolithography and etching techniques.

Figure 26:
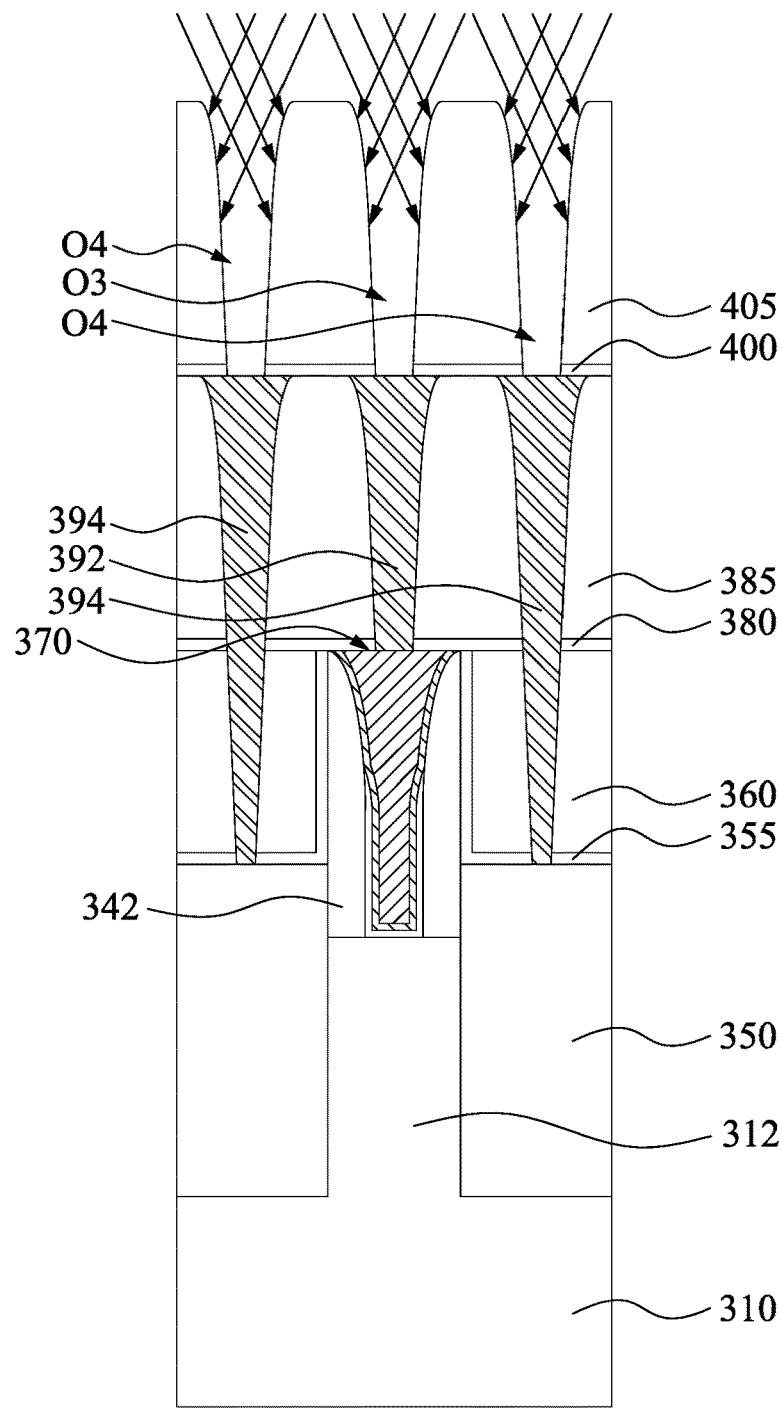

Reference is made to FIG. 26. A directional etching process is performed to round the corners of the ILD layer 405 to enlarge the openings O3 and O4. The directional etching process is similar to those described in FIG. 22, and thus relevant details will not be repeated hereinafter.

Figure 27:
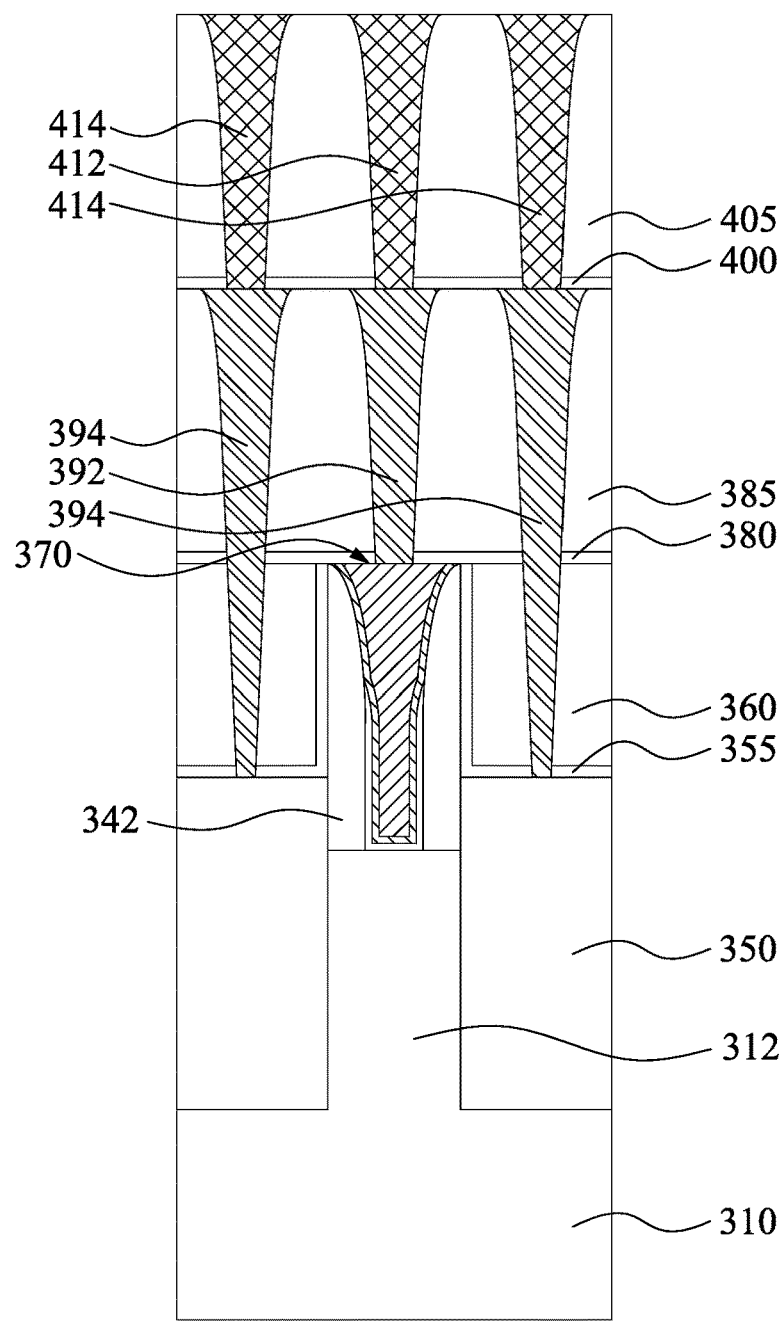

Reference is made to FIG. 27. Contacts 412 and 414 are formed respectively in the openings O3 and O4 (see FIG. 26). Contacts 414 are physically and electrically coupled to the contacts 394, and contact 412 is physically and electrically coupled to the contact 392, respectively. In some embodiments, contacts 412 and 414 are similar to the contacts 392 and 394, and thus relevant structural details will not be repeated hereinafter.

FIGS. 28A to 30B illustrate a method in various stages of fabricating a semiconductor device in accordance with some embodiments of the present disclosure.

Figure 28A:
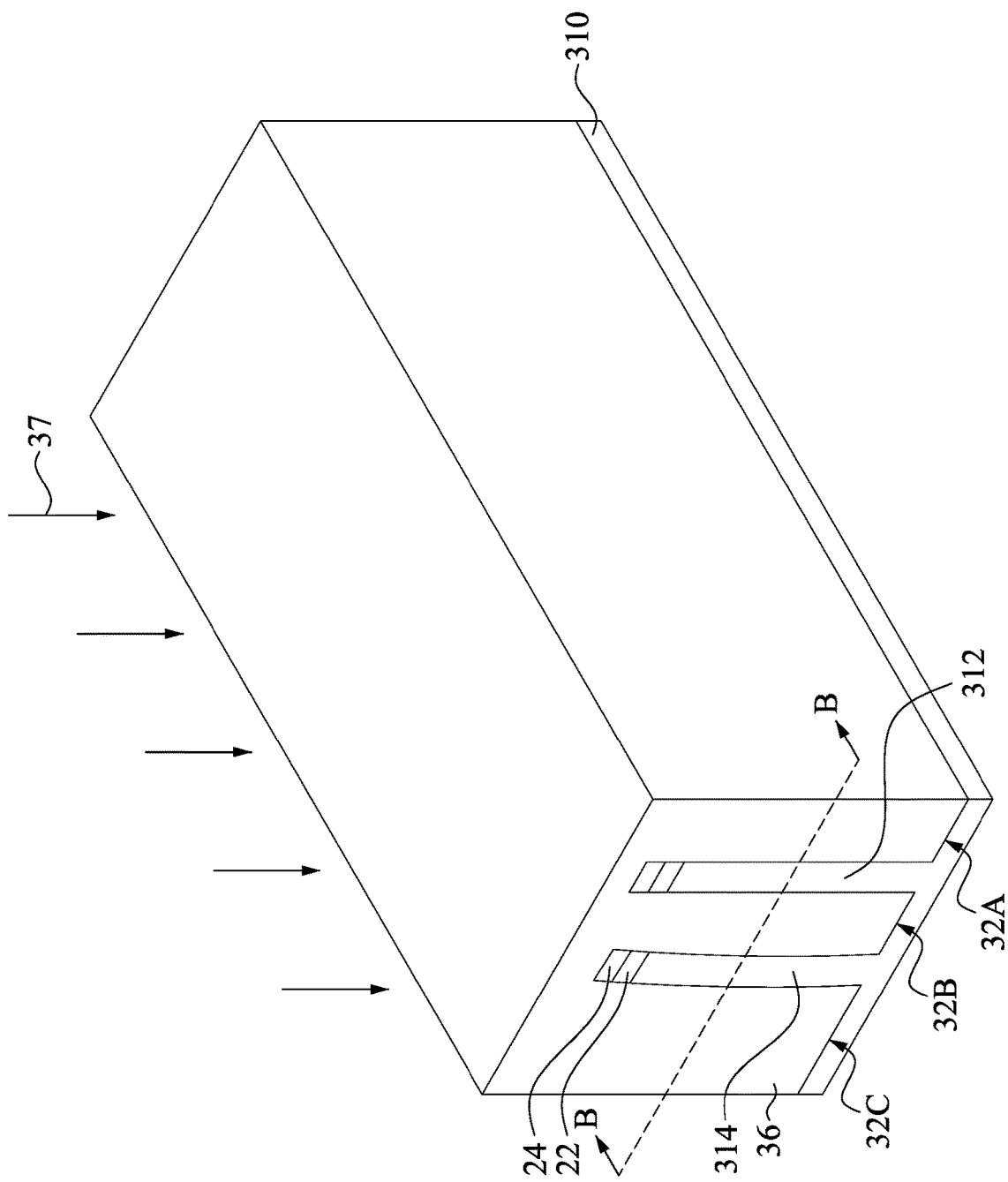
FIGS. 28A to 30B illustrate a method in various stages of fabricating a semiconductor device in accordance with some embodiments of the present disclosure.
Figure 28B:
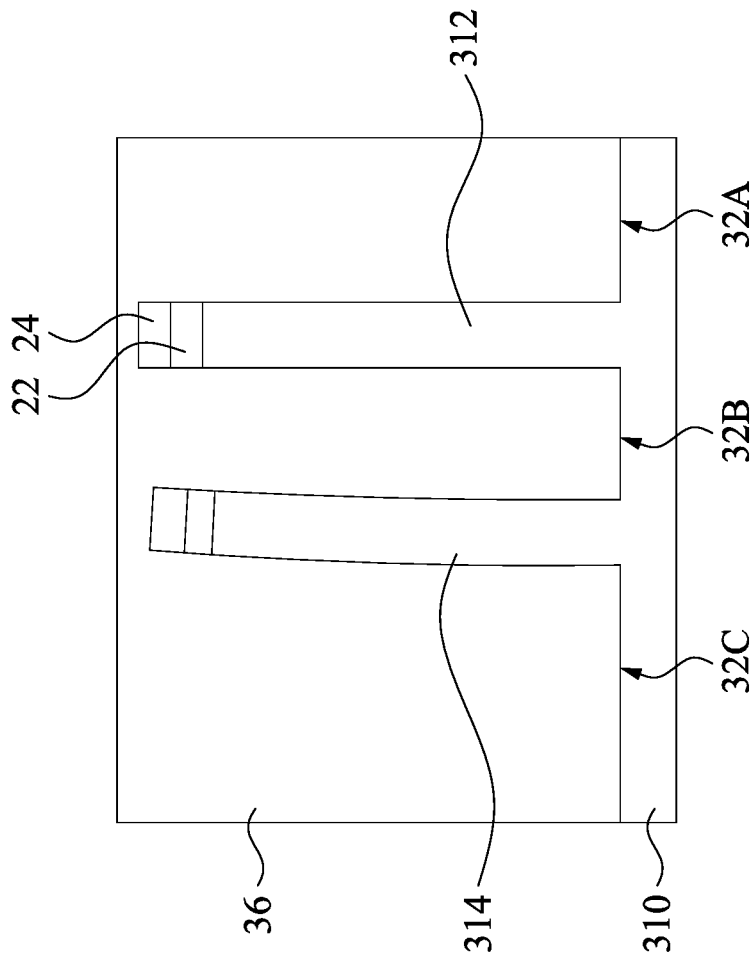

Reference is made to FIGS. 28A and 28B, in which FIG. 28A is a cross-sectional view along line B-B of FIG. 28A. FIG. 28A is similar to FIG. 4, while the difference between FIGS. 28 and 4 is that the semiconductor fin 314 in FIG. 28A is bent as a result of the annealing process. As discussed above with respect to FIG. 4, when the isolation layer 36 is made of flowable material, the isolation layer 36 may shrink as a result of the annealing process 37. However, because the trench 32C is wider than the trench 32B, the amount of the isolation layer 36 within the trench 32C is greater than the amount of the isolation layer 36 within the trench 32B, which results in a larger shrinkage rate of the isolation layer 36 within the trench 32C than within the trench 32B. Accordingly, this unbalanced shrinkage rates of the isolation layer 36 on opposite sides of the semiconductor fin 314 may cause bending (or bowing) of the semiconductor fin 314, as the pulling force of isolation layer 36 within the trench 32C is greater than the pulling force of isolation layer 36 within the trench 32B. On the other hand, because the trenches 32A and 32B have substantially the same size, the amounts of the isolation layer 36 on opposite sides of the semiconductor fin 314 are substantially the same, which results in substantially the same shrinkage rate of the isolation layer 36 within the trenches 32A and 32B. Accordingly, the bending of the semiconductor fin 312 may be less severe than the bending of the semiconductor fin 314.

Figure 29A:
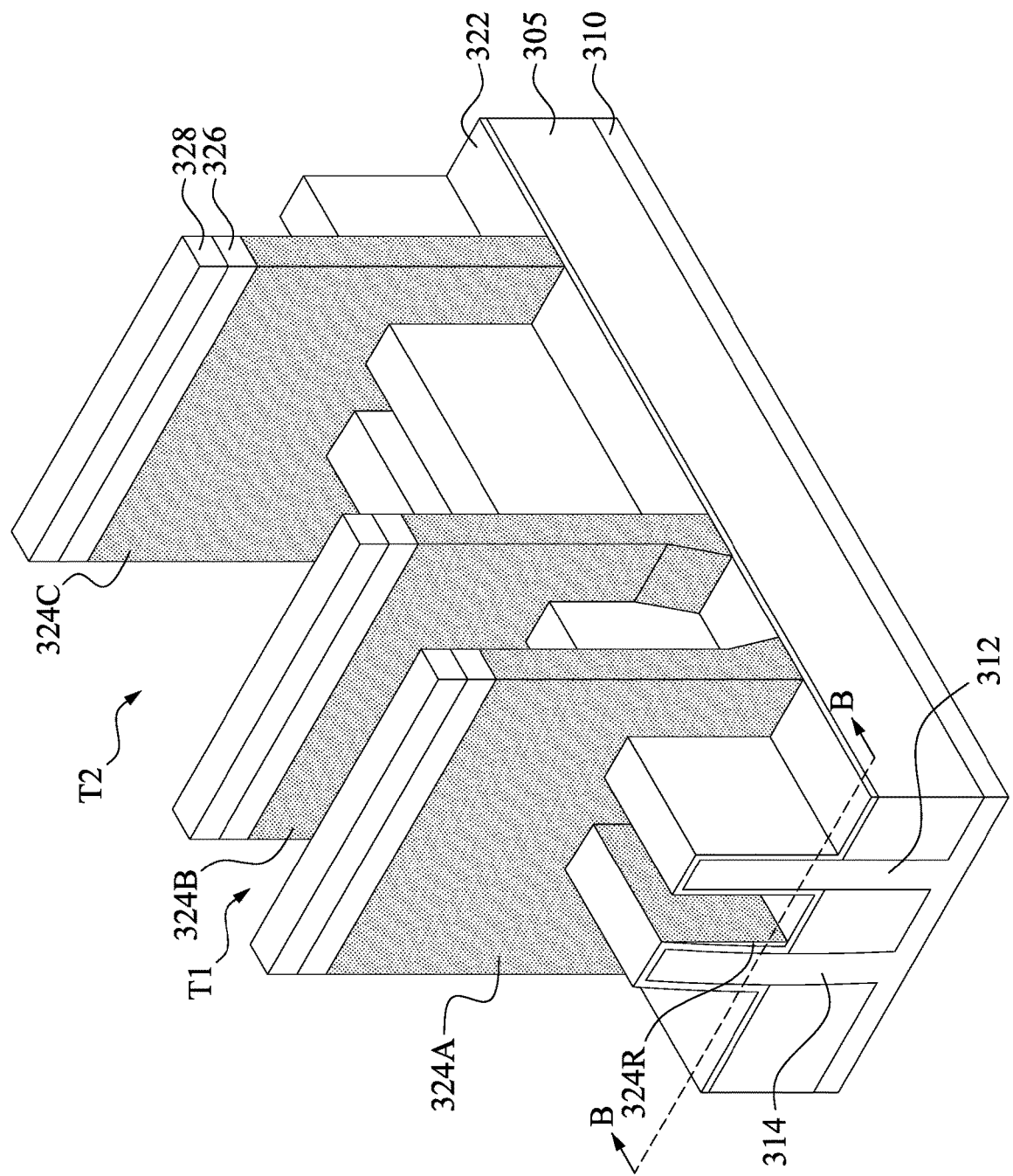
Figure 29B:
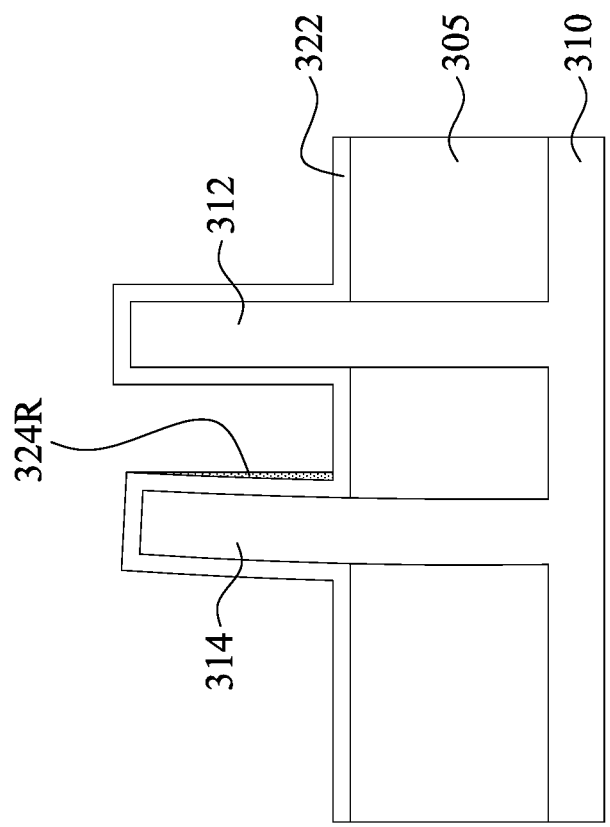

Reference is made to FIGS. 29A and 29B, in which FIG. 29A is a cross-sectional view along line B-B of FIG. 29A. FIG. 29A is similar to FIG. 7A, while the difference between FIGS. 29A and 27A is that, after the formation of the dummy gates 324A to 324C, a residue 324R of the dummy gate layer 324 (see FIG. 3) remains on one side of the bent semiconductor fin 314. As mentioned above, because the dummy dielectric layer 322 has an etching resistance to the etchant for etching the dummy gate layer 324, the dummy dielectric layer 322 can act as a mask to protect the portion of the dummy gate layer 324 vertically under the bent semiconductor fin 314 from being etched. The portion of the dummy gate layer 324 remains under the bent semiconductor fin 314 is referred to as the residue 324R of the dummy gate layer 324.

Figure 30A:
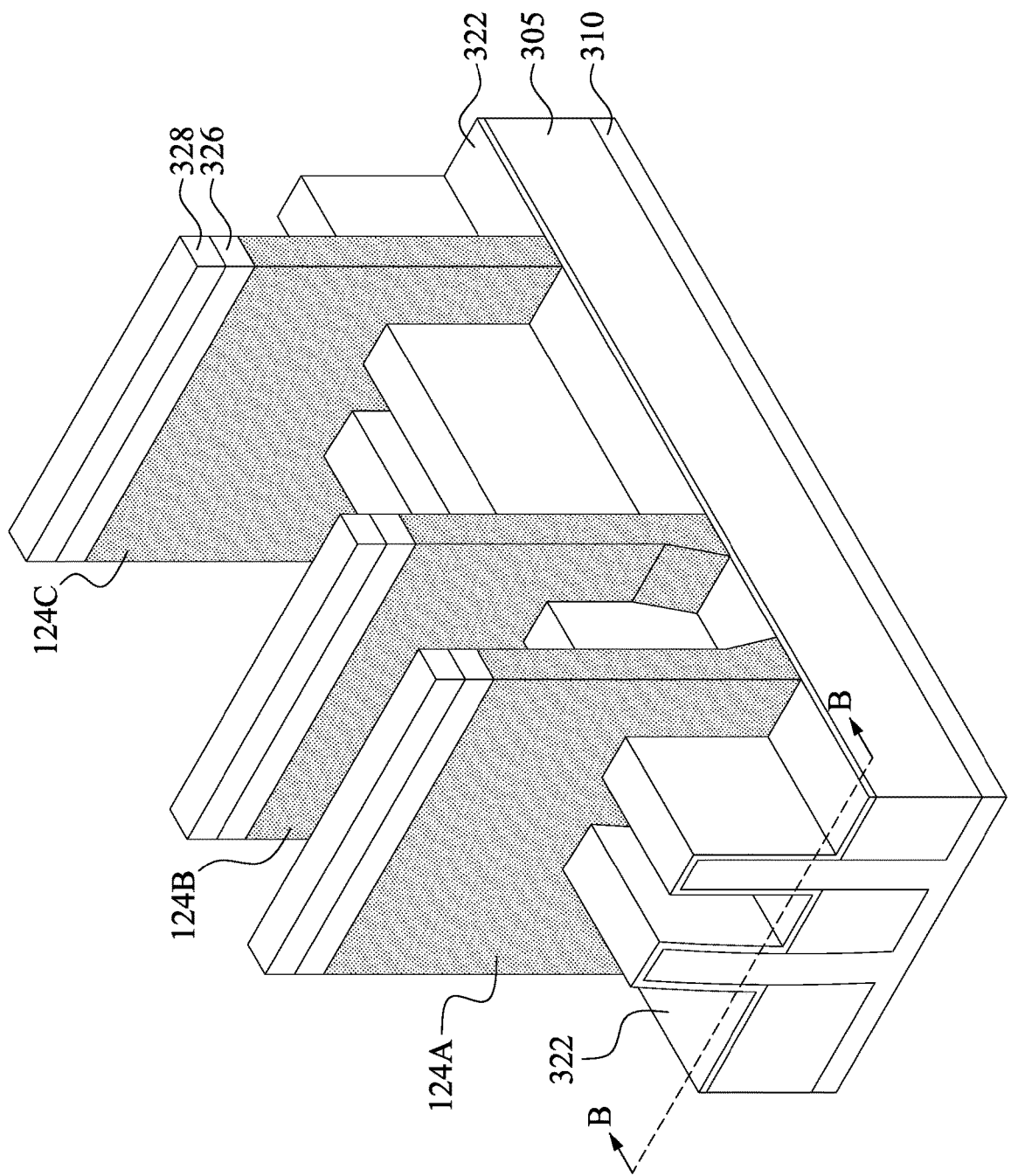
Figure 30B:
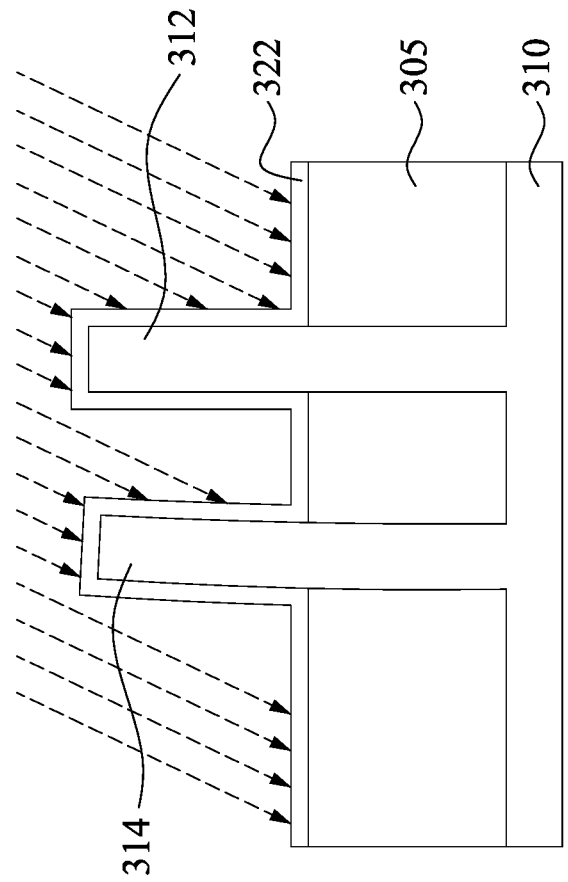

Reference is made to FIGS. 30A and 30B, in which FIG. 30A is a cross-sectional view along line B-B of FIG. 30A. A directional etching process is performed to remove the residue 324R (see FIGS. 29A and 29B) on the sidewall of the bent semiconductor fin 314. The directional etching process can be performed using, for example, the fabrication apparatuses 100 and 200 as discussed in FIGS. 31 and 33-37. The arrows with dashed lines in FIG. 30B indicate the direction that the ion beams are incident on the wafer WF. In greater detail, the directional ions are directed to the wafer WF at oblique angles with respect to a perpendicular to the wafer surface.

Figure 38A:
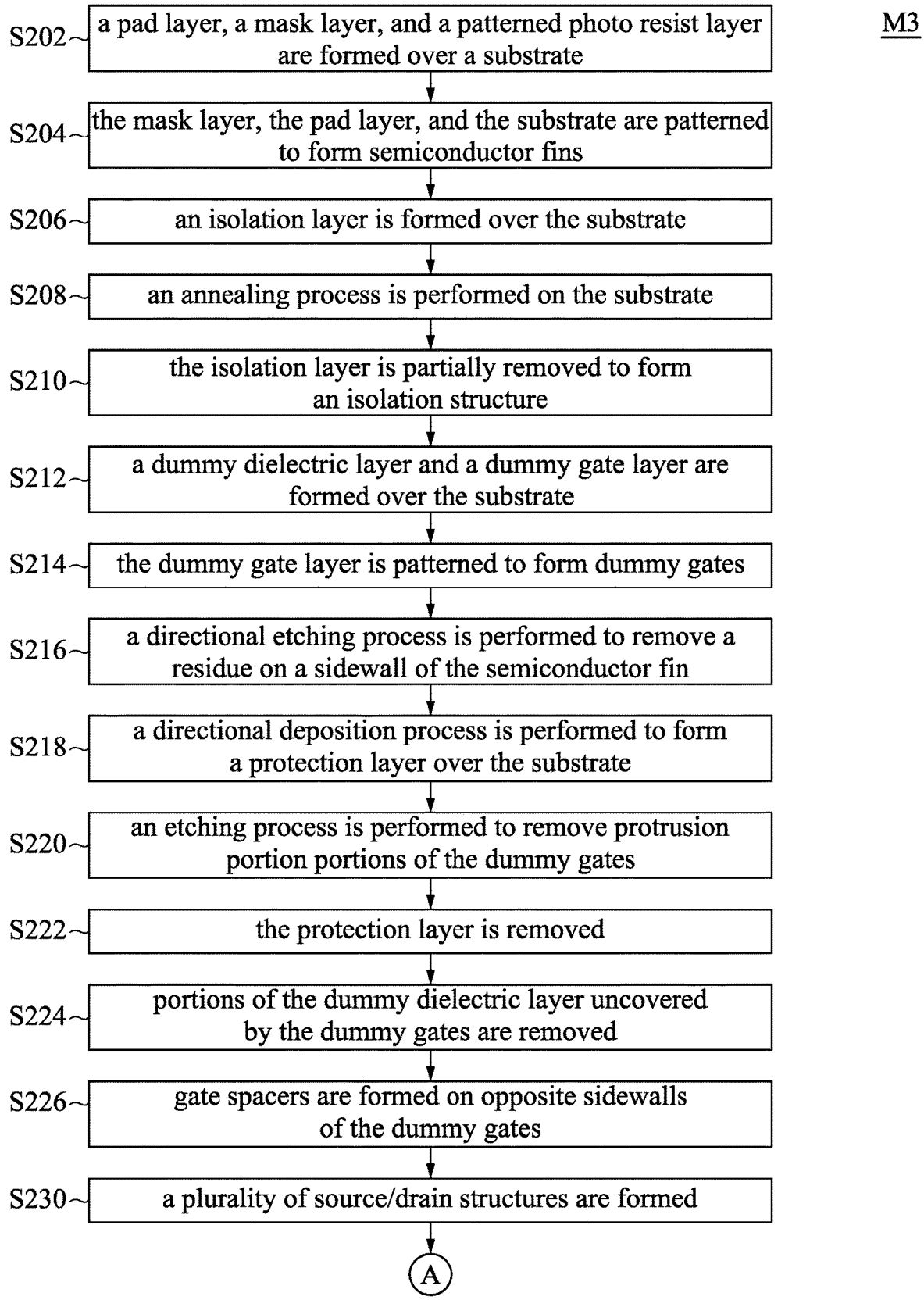
FIGS. 38A and 38B are flow charts of a method for forming a semiconductor device in accordance with some embodiments of the present disclosure.
Figure 38B:
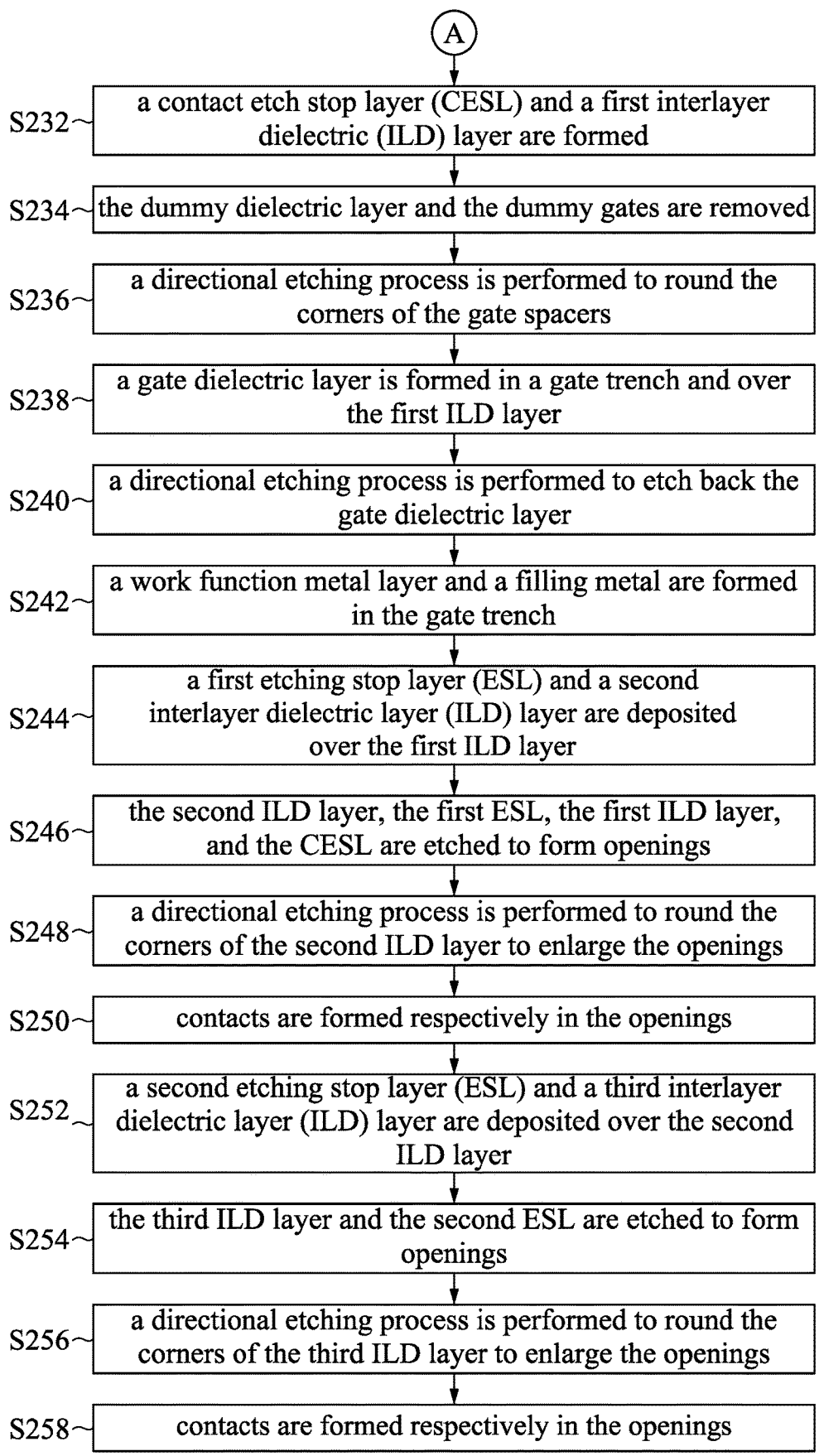

FIGS. 38A and 38B illustrate a method M3 of forming a memory device in accordance with some embodiments. Although the method M3 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S202, a pad layer, a mask layer, and a patterned photo resist layer are formed over a substrate. FIG. 1 illustrates a cross-sectional view of some embodiments corresponding to act in block S202.

At block S204, the mask layer, the pad layer, and the substrate are patterned to form semiconductor fins. FIG. 2 illustrates a cross-sectional view of some embodiments corresponding to act in block S204.

At block S206, an isolation layer is formed over the substrate. FIG. 3 illustrates cross-sectional views of some embodiments corresponding to act in block S206.

At block S208, an annealing process is performed on the substrate. FIGS. 4, 28A, and 28B illustrate cross-sectional views of some embodiments corresponding to act in block S208.

At block S210, the isolation layer is partially removed to form an isolation structure. FIG. 5 illustrates a cross-sectional view of some embodiments corresponding to act in block S210.

At block S212, a dummy dielectric layer and a dummy gate layer are formed over the substrate. FIG. 6 illustrates a cross-sectional view of some embodiments corresponding to act in block S212.

At block S214, the dummy gate layer is patterned to form dummy gates. FIGS. 7A, 7B, 29A, and 29B illustrate cross-sectional views of some embodiments corresponding to act in block S214.

At block S216, a directional etching process is performed to remove a residue on a sidewall of the semiconductor fin. FIGS. 30A and 30B illustrate cross-sectional views of some embodiments corresponding to act in block S216.

At block S218, a directional deposition process is performed to form a protection layer over the substrate. FIGS. 8A and 8B illustrate cross-sectional views of some embodiments corresponding to act in block S218.

At block S220, an etching process is performed to remove protrusion portions of the dummy gates. FIGS. 9A-9C illustrate cross-sectional views of some embodiments corresponding to act in block S220.

At block S222, the protection layer is removed. FIG. 10 illustrates cross-sectional views of some embodiments corresponding to act in block S222.

At block S224, portions of the dummy dielectric layer uncovered by the dummy gates are removed. FIG. 11 illustrates cross-sectional views of some embodiments corresponding to act in block S224.

At block S226, gate spacers are formed on opposite sidewalls of the dummy gates. FIG. 12 illustrates cross-sectional views of some embodiments corresponding to act in block S226.

At block S230, a plurality of source/drain structures are formed over the substrate. FIG. 13 illustrates cross-sectional views of some embodiments corresponding to act in block S230.

At block S232, a contact etch stop layer (CESL) and a first interlayer dielectric (ILD) layer are formed. FIGS. 14A and 14B illustrate cross-sectional views of some embodiments corresponding to act in block S232.

At block S234, the dummy dielectric layer and the dummy gates are removed. FIG. 15 illustrates cross-sectional views of some embodiments corresponding to act in block S234.

At block S236, a directional etching process is performed to round the corners of the gate spacers. FIG. 16 illustrates cross-sectional views of some embodiments corresponding to act in block S236.

At block S238, a gate dielectric layer is formed in a gate trench and over the first ILD layer. FIG. 17 illustrates cross-sectional views of some embodiments corresponding to act in block S238.

At block S240, a directional etching process is performed to etch back the gate dielectric layer. FIG. 18 illustrate cross-sectional views of some embodiments corresponding to act in block S240.

At block S242, a work function metal layer and a filling metal are formed in the gate trench. FIG. 19 illustrate cross-sectional views of some embodiments corresponding to act in block S242.

At block S244, a first etching stop layer (ESL) and a second interlayer dielectric layer (ILD) layer are deposited over the first ILD layer. FIG. 20 illustrates a cross-sectional view of some embodiments corresponding to act in block S244.

At block S246, the second ILD layer, the first ESL, the first ILD layer, and the CESL are etched to form openings. FIG. 21 illustrates a cross-sectional view of some embodiments corresponding to act in block S246.

At block S248, a directional etching process is performed to round the corners of the second ILD layer to enlarge the openings. FIG. 22 illustrates a cross-sectional view of some embodiments corresponding to act in block S248.

At block S250, contacts are formed respectively in the openings. FIG. 23 illustrates a cross-sectional view of some embodiments corresponding to act in block S250.

At block S252, a second etching stop layer (ESL) and a third interlayer dielectric layer (ILD) layer are deposited over the second ILD layer. FIG. 24 illustrates a cross-sectional view of some embodiments corresponding to act in block S252.

At block S254, the third ILD layer and the second ESL are etched to form openings. FIG. 25 illustrates a cross-sectional view of some embodiments corresponding to act in block S254.

At block S256, a directional etching process is performed to round the corners of the third ILD layer to enlarge the openings. FIG. 26 illustrates a cross-sectional view of some embodiments corresponding to act in block S256.

At block S258, contacts are formed respectively in the openings. FIG. 27 illustrates a cross-sectional view of some embodiments corresponding to act in block S258.

In some embodiments of the present disclosure, a method includes forming a dummy gate over a substrate; forming a pair of gate spacers on opposite sidewalls of the dummy gate; removing the dummy gate to form a trench between the gate spacers; directing a first ion beam to an upper portion of the trench, while leaving a lower portion of the trench substantially free from incidence of the first ion beam; moving the substrate relative to the first ion beam during directing the first ion beam to the trench; and forming a gate structure in the trench.

In some embodiments of the present disclosure, a method includes forming a semiconductor fin over a substrate; forming an isolation layer over the substrate and covering the semiconductor fin; performing an annealing process to the isolation layer, such that the semiconductor fin is bent after performing the annealing process; partially remove the isolation layer such that the bent semiconductor fin protrudes from a top surface of the remaining isolation layer; forming a dummy gate material over the semiconductor fin; patterning the dummy gate material to form a dummy gate, wherein a residue of the dummy gate material remains on a first sidewall of the bent semiconductor fin after patterning the dummy gate material; and performing an directional etching process to remove the residue of the dummy gate material.

In some embodiments of the present disclosure, a semiconductor device includes a substrate having a semiconductor fin, a gate structure, a gate spacer, and an epitaxy structure. The gate structure is over the semiconductor fin, in which the gate structure has a tapered profile and comprises a gate dielectric, a work function metal layer over the gate dielectric, and a filling metal over the work function metal layer. The gate spacer is along a sidewall of the gate structure, in which the work function metal layer is in contact with the gate dielectric and a top portion of the gate spacer. The epitaxy structure is over the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dummy gate over a semiconductor fin of a substrate;
   forming a pair of gate spacers on opposite sidewalls of the dummy gate;
   removing the dummy gate to form a trench between the gate spacers;
   directing a first ion beam to an upper portion of the trench, while leaving a lower portion of the trench substantially free from incidence of the first ion beam;
   moving the substrate relative to the first ion beam during directing the first ion beam to the trench; and
   forming a gate structure in the trench.

2. The method of claim 1, wherein forming the gate structure in the trench comprises:
   forming a gate dielectric in the trench and over sidewalls of the gate spacers after directing the first ion beam; and
   directing a second ion beam to an upper portion of the gate dielectric to remove the upper portion of the gate dielectric, while leaving a lower portion of the gate dielectric substantially free from incidence of the second ion beam.

3. The method of claim 2, further comprising forming a work function metal layer over the gate dielectric after directing the second ion beam, such that the work function metal layer is in contact with the sidewalls of the gate spacers.

4. The method of claim 1, further comprising:
   forming an interlayer dielectric (ILD) layer over the gate spacers;
   forming an opening in the ILD layer; and
   directing a second ion beam to an upper portion of the opening, while leaving a lower portion of the opening substantially free from incidence of the second ion beam.

5. The method of claim 1, wherein moving the substrate relative to the first ion beam comprises moving the substrate in a linear direction during directing the first ion beam.

6. The method of claim 5, wherein the linear direction aligns with a lengthwise direction of the semiconductor fin.

7. The method of claim 1, wherein moving the substrate relative to the first ion beam comprises moving the substrate in a circling direction during directing the first ion beam.

8. A method, comprising:
   forming a dummy gate layer over a substrate;
   patterning the dummy gate layers to form a dummy gate structure, such that the dummy gate structure comprises a protrusion portion at a bottom of the dummy gate structure;
   forming a protective layer over the dummy gate structure, while leaving the protrusion portion of the dummy gate structure free of coverage by the protective layer;
   removing the protrusion portion of the dummy gate structure; and
   replacing the dummy gate structure with a metal gate structure.

9. The method of claim 8, wherein the protective layer is formed using a directional deposition process by directing an ion beam to a sidewall of the dummy gate structure, while leaving the protrusion portion of the dummy gate structure substantially free from incidence of the first ion beam.

10. The method of claim 8, wherein removing the protrusion portion is performed such that a concave sidewall is formed at a lower portion of the dummy gate structure.

11. The method of claim 10, wherein an upper portion of the dummy gate structure has a straight sidewall.

12. The method of claim 8, further comprising removing the protective layer after removing the protrusion portion of the dummy gate structure.

13. The method of claim 8, wherein removing the protrusion portion is performed such that a portion of a gate dielectric layer under the dummy gate structure is removed.

14. A method, comprising:
    forming gate spacers on opposite sidewalls of a dummy gate structure;
    removing the dummy gate structure to form a trench between the gate spacers;
    directing a first ion beam to an upper portion of the trench, while leaving a lower portion of the trench substantially free from incidence of the first ion beam;
    forming a gate dielectric layer in the trench after directing the first ion beam; and
    directing a second ion beam to the upper portion of the trench, while leaving the lower portion of the trench substantially free from incidence of the second ion beam.

15. The method of claim 14, wherein directing the second ion beam is performed such that portions of the gate dielectric layer are removed from upper portions of the gate spacers, while remaining portions of the gate dielectric layer cover lower portions of the gate spacers.

16. The method of claim 15, further comprising forming a work function metal layer in the trench after directing the second ion beam, wherein the work function metal layer is in contact with upper portions of the gate spacers and is separated from the lower portions of the gate spacers by the remaining portions of the gate dielectric layer.

17. The method of claim 14, wherein forming the gate dielectric layer is performed such that the gate dielectric layer extends to a top surface of an interlayer dielectric layer adjacent to one of the gate spacers, and directing the second ion beam is performed such that a portion of the gate dielectric layer are removed from the top surface of an interlayer dielectric layer.

18. The method of claim 14, further comprising:
    forming a metal layer in the trench after directing the second ion beam to form a gate structure in the trench;
    forming an interlayer dielectric layer (ILD) over the gate structure;
    etching the ILD layer to form a first recess exposing the gate structure; and
    directing a third ion beam to the upper portion of the first recess, while leaving the lower portion of the first recess substantially free from incidence of the third ion beam.

19. The method of claim 18, wherein etching the ILD layer further comprises forming a second recess exposing a source/drain structure, wherein the third ion beam is directed to the upper portion of the second recess, while leaving the lower portion of the second recess substantially free from incidence of the third ion beam.

20. The method of claim 14, wherein directing the first ion beam is performed such that a width the upper portion of the trench is enlarged.

* * * * *